(12) United States Patent
Iwane et al.

(10) Patent No.: US 6,391,743 B1
(45) Date of Patent: May 21, 2002

(54) METHOD AND APPARATUS FOR PRODUCING PHOTOELECTRIC CONVERSION DEVICE

(75) Inventors: Masaaki Iwane; Takao Yonehara, both of Atsugi; Kazuaki Ohmi, Yokohama; Shoji Nishida, Hiratsuka; Kiyofumi Sakaguchi; Kazutaka Yanagita, both of Yokohama, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/401,775

(22) Filed: Sep. 22, 1999

(30) Foreign Application Priority Data

Sep. 22, 1998 (JP) .......................... 10-267141
Sep. 22, 1999 (JP) .......................... 11-268257

(51) Int. Cl.$^7$ .......................... H01L 21/30; H01L 21/46
(52) U.S. Cl. .......................... 438/458; 438/455; 136/243
(58) Field of Search .................... 438/455, 458

(56) References Cited

U.S. PATENT DOCUMENTS

| | | | |
|---|---|---|---|
| 5,665,631 A | 9/1997 | Lee et al. | 438/459 |
| 5,668,045 A | 9/1997 | Golland et al. | 438/459 |
| 5,695,557 A | 12/1997 | Yamagata et al. | 117/97 |
| 5,811,348 A | * 9/1998 | Matsushita et al. | 438/455 |
| 5,854,123 A | 12/1998 | Sato et al. | 438/507 |
| 5,856,229 A | 1/1999 | Sakaguchi et al. | 438/406 |
| 5,863,829 A | 1/1999 | Nakayoshi et al. | 438/459 |
| 5,966,620 A | * 10/1999 | Sakaguchi et al. | 438/455 |
| 5,994,207 A | * 11/1999 | Henley et al. | 438/515 |
| 6,090,688 A | 7/2000 | Ogawa et al. | 438/459 |
| 6,107,213 A | 8/2000 | Tayanaka | 438/762 |

FOREIGN PATENT DOCUMENTS

| | | |
|---|---|---|
| EP | 0 536 790 | 4/1993 |
| EP | 0 628 995 | 12/1994 |
| EP | 0 793 263 | 9/1997 |
| JP | 5-283722 | 10/1993 |
| JP | 7-211876 | 8/1995 |
| JP | 8-213645 | 8/1996 |
| JP | 9-331077 | 12/1997 |

OTHER PUBLICATIONS

D. Trivich et al., "Cuprous Oxide Photovoltaic Cells", 13$^{th}$ IEEE Photovoltaic Spec. Conf., Washington D.C., pp. 174–179 (1978).

* cited by examiner

Primary Examiner—Keith Christianson
Assistant Examiner—Asok Kumar Sarkar
(74) Attorney, Agent, or Firm—Fitzpatrick, Cella, Harper & Scinto

(57) ABSTRACT

There is disclosed a method of producing a photoelectric conversion device comprising the steps of forming a semiconductor substrate comprising a first and a second semiconductor layers with a separation layer therebetween; bonding a support substrate to a surface of the second semiconductor layer opposite to the separation-layer-side surface to form a bonded substrate; separating the first and the second semiconductor layers by the separation layer; and producing a photoelectric conversion device in the second semiconductor layer, wherein when bonding the semiconductor substrate and the support substrate to each other, at least a portion is formed in the bonded substrate in which at least a part of end portions of the semiconductor substrate and the support substrate is not bonded to the other substrate and a fluid is jetted against a side surface of the bonded substrate, thereby separating the first and the second semiconductor layers. The method makes it possible to separate a bonded substrate with a high yield, thereby supplying photoelectric conversion devices with a high quality at a low production cost.

7 Claims, 40 Drawing Sheets

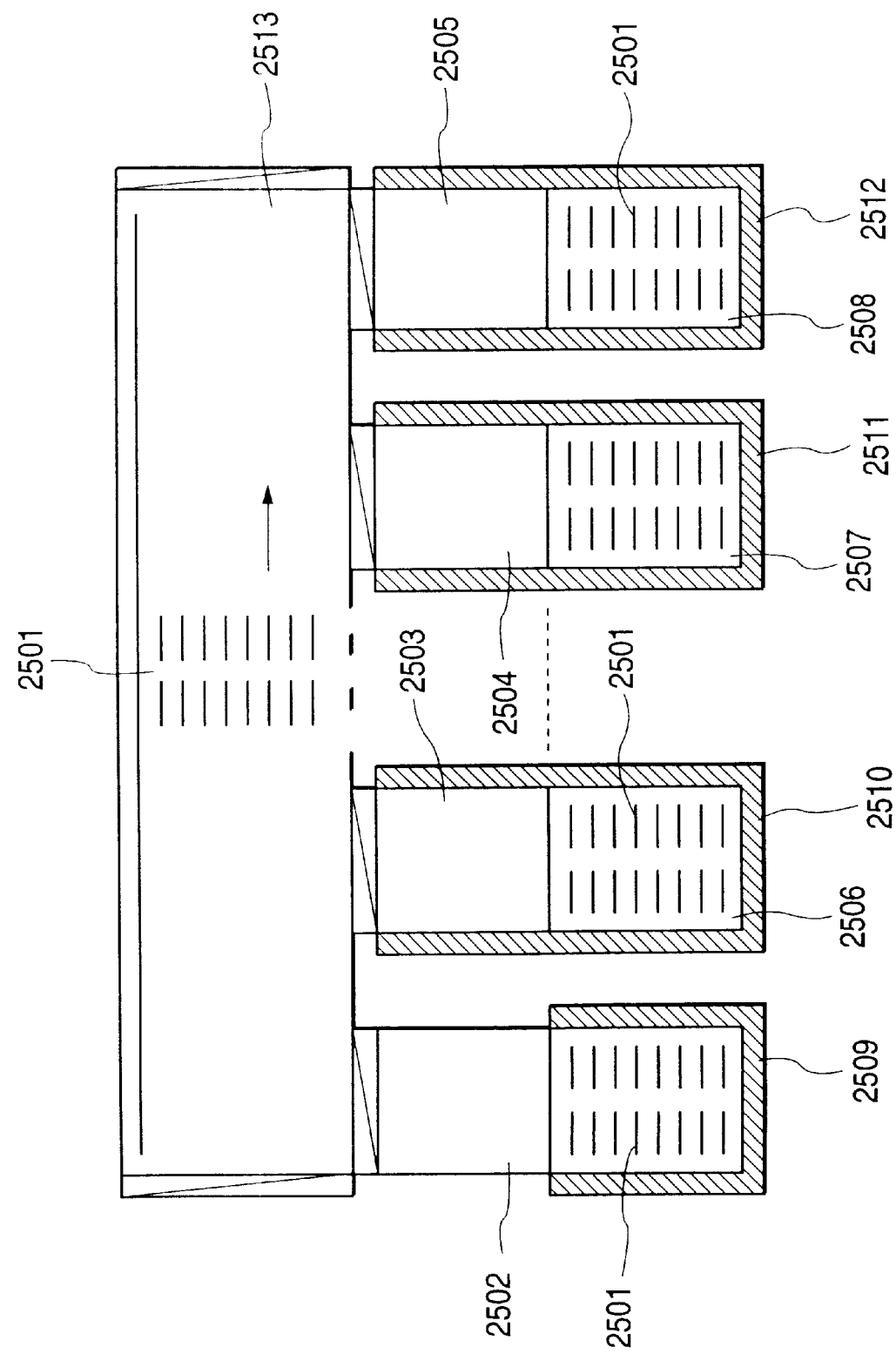

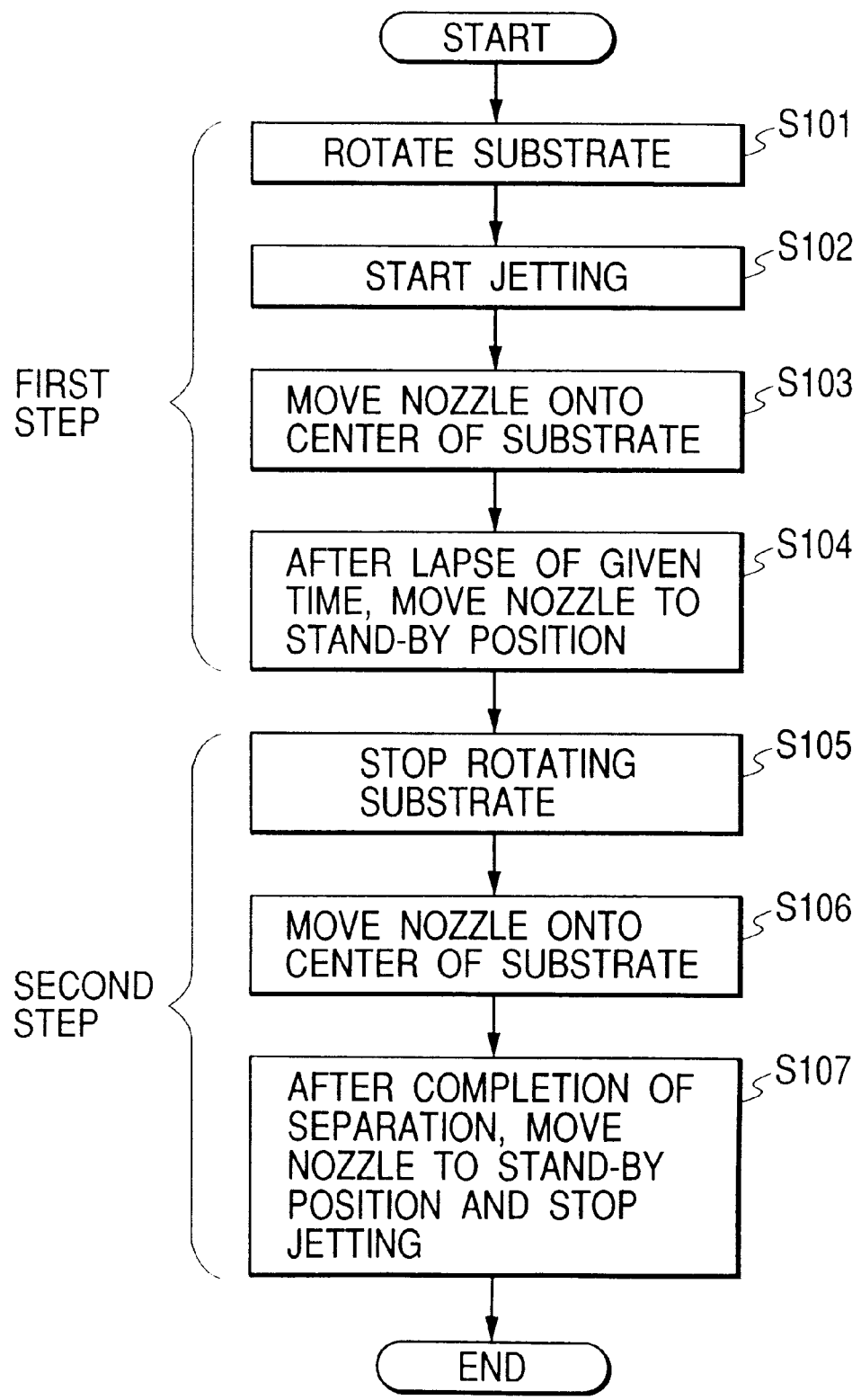

METHOD AND APPARATUS FOR PRODUCING PHOTOELECTRIC CONVERSION DEVICE

BACKGROUND OF THE INVENTION

1. Field of the Invention

The present invention relates to a method and apparatus for producing a photoelectric conversion device, and more particularly to a solar cell for converting light energy to electric energy and a method of producing the same.

2. Related Background Art

The emission of globe warming gases such as carbon dioxide, nitrogen oxides, or the like as generated by combustion of petroleum in thermal power generation or combustion of gasoline in automotive engines is responsible for worsening of the global environment. Further, there is a concern for future exhaustion of the crude oil. Thus, power generation by solar cells receives interest and attention as a clean energy source. The thin film crystalline silicon (Si) solar cell can be produced with a thin power generation layer using less Si starting material, so that the production cost can be reduced. Moreover, the thin film crystalline Si solar cell uses crystalline Si for a power generation layer and can therefore be expected to demonstrate a higher photoelectric conversion efficiency and less deterioration as compared with solar cells using amorphous Si or the like. In addition, the thin film crystalline Si solar cell can be bent to a certain degree and can therefore be applied to a curved surface of an automotive body, appliance, roofing tile, or the like.

In order to realize a thin film crystalline Si solar cell, Japanese Patent Application Laid-Open No. 8-213645 discloses utilizing an epitaxial layer on a porous Si layer to separate a thin film monocrystalline Si. FIG. 33 is a schematic sectional view illustrating a method of forming a thin film Si solar cell disclosed in Japanese Patent Application Laid-Open No. 8-213645. In the figure, reference numeral 2601 denotes a Si wafer; 2602 a porous Si layer; 2603 a $p^+$-type Si layer; 2604 a $p^-$-type Si layer; 2605 an $n^+$-type Si layer; 2606 a protective layer; 2607 an adhesive; and 2608, 2609 a jig.

In the method of producing a solar cell illustrated in FIG. 33, firstly the porous Si layer 2602 is formed by anodization in a surface of the Si wafer 2601. Then, the $p^+$-type Si layer 2603 is epitaxially grown on the porous Si layer 2602, and the $p^-$-type Si layer 2604 and the $n^+$-type Si layer 2605 are further epitaxially grown thereon, respectively. Subsequently, the protective layer 2606 is formed. Then, the adhesive is applied to the protective layer 2606 and the Si wafer 2601, and the jig 2608, 2609 is adhered thereto. After that, a pulling force is exerted to the jig 2608, 2609 to separate the Si wafer 2601 and the epitaxial layers 2603, 2604, 2605 at the porous layer 2602. Then, the epitaxial layers 2603, 2604, 2605 are used to form a solar cell, while the Si wafer 2601 is again put into the same production steps as mentioned above, thus attaining cost reduction.

However, in the method of Japanese Patent Application Laid-Open No. 8-213645, a pulling force is merely exerted to the jig 2608, 2609 to separate the Si wafer 2601 and the epitaxial layers 2603, 2604, 2605 at the porous layer 2602. With this method, it is not necessarily possible to make sure that the separation is effected at the porous Si layer 2602. When separated by the pulling force, the epitaxial layers 2603, 2604, 2605 may sometimes be broken or impaired. Thus, photoelectric conversion devices provided by this method may have a low yield or low product quality.

SUMMARY OF THE INVENTION

One of the objects of the present invention is to provide a method of separating a bonded substrate with a high yield, thereby providing a method and apparatus that can supply photoelectric conversion devices with a high quality at a low production cost.

In order to solve the above mentioned issue, the inventors have conducted extensive theoretical and laboratory studies and accomplished the present invention.

According to a first aspect of the present invention, there is provided a method of producing a photoelectric conversion device comprising the steps of: forming a semiconductor substrate comprising a first and a second semiconductor layers with a separation layer therebetween; bonding a support substrate to a surface of the second semiconductor layer opposite to the separation-layer-side surface to form a bonded substrate; separating the first and the second semiconductor layers by the separation layer; and producing a photoelectric conversion device in the second semiconductor layer, wherein when bonding the semiconductor substrate and the support substrate to each other, at least a portion is formed in the bonded substrate in which at least a part of end portions of the semiconductor substrate and the support substrate is not bonded to the other substrate and a fluid is jetted against a side surface of the bonded substrate, thereby separating the first and the second semiconductor layers.

In the method of producing a photoelectric conversion device of the first aspect of the present invention, it is preferred that the portion of the bonded substrate in which the semiconductor substrate and the support substrate are not bonded to each other is present in the vicinity of the separation layer and forms a recess such that the flow of the fluid is received by the recess to generate a force in such a direction as to expand the separation layer, and it is also preferred that the recess is formed by beveling the semiconductor substrate.

According to a second aspect of the present invention, there is provided a method of producing a photoelectric conversion device comprising the steps of: forming a semiconductor substrate comprising a first and a second semiconductor layers with a separation layer therebetween; bonding a support substrate to a surface of the second semiconductor layer opposite to the separation-layer-side surface to form a bonded substrate; separating the first and the second semiconductor layers by the separation layer; and producing a photoelectric conversion device in the second semiconductor layer, wherein when bonding the semiconductor substrate and the support substrate to each other, the bonding is carried out with the end portions of the semiconductor substrate and the support substrate being flush with each other and the fluid is jetted against a side surface of the bonded substrate, thereby separating the first and the second semiconductor layers.

In the methods of producing a photoelectric conversion device of the first and the second aspects of the present invention, it is preferred that the separation layer has a microvoid inside thereof, and it is also preferred that the separation layer is smaller in mechanical strength than the bonded portion of the support substrate and the semiconductor substrate.

Further, the semiconductor substrate may be formed by making partially porous a monocrystalline silicon substrate to form a separation layer as a porous monocrystalline silicon layer and epitaxially growing a monocrystalline silicon layer on the separation layer, wherein the separation layer may be formed by the anodization. Alternatively, the semiconductor substrate may be formed by providing a separation layer as a microbubble containing layer at a given depth in a monocrystalline silicon substrate, wherein the separation layer may be formed by the ion implantation.

Further, as a method for the jetting of a fluid, it is preferable to use the water jet method in which a flow of high-pressure water is ejected through a nozzle.

Moreover, the support substrate is preferably a light transmissive substrate.

In addition, the present invention encompasses an apparatus for producing a photoelectric conversion device. The apparatus for producing a photoelectric conversion device of the present invention comprises a holding member for holding a bonded substrate comprising a semiconductor substrate comprising a first semiconductor layer, a second semiconductor layer for producing a photoelectric conversion device therein, and a separation layer provided between the first and the second semiconductor layers, and a support substrate bonded to a surface of the second semiconductor layer opposite to the separation-layerside surface; and a nozzle for jetting a fluid against a side surface of the bonded substrate to separate the first and the second semiconductor layers by the separation layer.

In the present invention, the photoelectric conversion device includes a solar cell, a photosensor, or the like.

In the present invention, it is preferable to effect the separation after forming a semiconductor junction inside of the second semiconductor layer.

Further, it is preferable to effect the separation after removing a peripheral portion of the separation layer.

Moreover, it is preferable to use a nozzle as means for jetting a fluid and to jet the fluid against the bonded substrate while moving the nozzle parallel to the periphery of the bonded substrate. In this case, it is preferable that the periphery of the bonded substrate is of a polygonal shape, and that after jetting the fluid against the bonded substrate while moving the nozzle parallel to a side of the periphery, the bonded substrate is rotated, and the fluid is then jetted against the bonded substrate while moving the nozzle parallel to another side of the periphery.

BRIEF DESCRIPTION OF THE DRAWINGS

FIG. 23D is a schematic top view, for illustrating the production steps of a solar cell of Example 1;

FIG. 25 is a schematic sectional view illustrating the liquid phase growth apparatus used in Example 1;

FIG. 40 is a flowchart schematically showing an example of controlling procedure of a separation apparatus.

DETAILED DESCRIPTION OF THE PREFERRED EMBODIMENTS

Figure 1A:
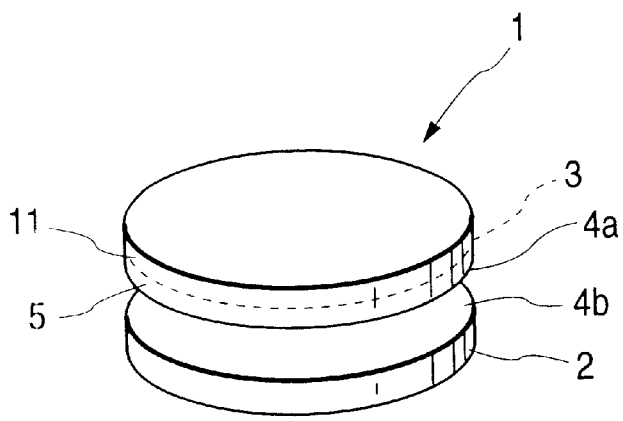
FIGS. 1A, 1B, and 1C are schematic perspective views illustrating the method of separating a bonded substrate according to the present invention.

FIGS. 32A to 32D are schematic sectional views illustrating the bonded substrates of the present invention. The bonded substrates are each formed by bonding a semiconductor substrate and a support substrate to each other. In the figure, reference numeral 3001 denotes a first semiconductor layer; 3002 a separation layer; 3003 a second semiconductor layer; 3004 a semiconductor substrate; and 3007 a support substrate.

Figure 32A:
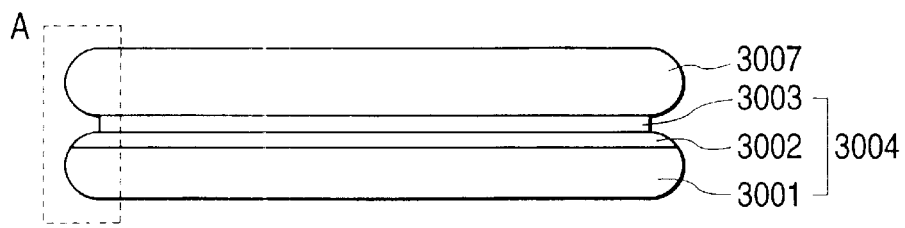
FIGS. 32A, 32B, 32C, and 32D are schematic sectional views illustrating the bonded substrates of the present invention.
Figure 32B:
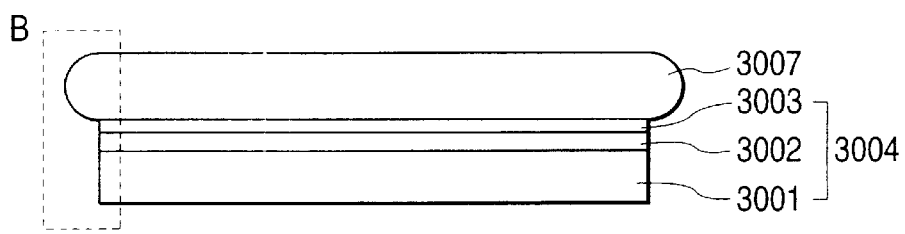
Figure 32C:
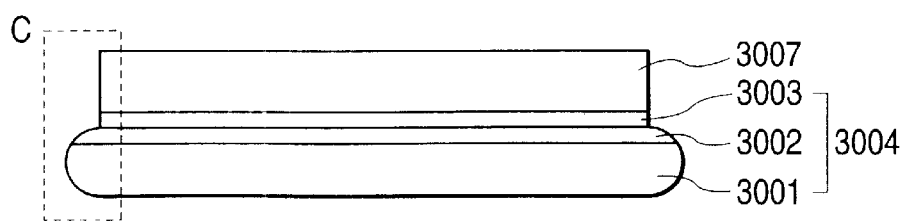

FIGS. 32A, 32B and 32C are schematic sectional views showing examples of the bonded substrate used in the production method of the first aspect of the present invention. Each of these substrates has a portion such as A, B or C shown in FIGS. 32A, 32B and 32C, which is the portion where the semiconductor substrate 3004 and the support substrate 3007 are not bonded to each other at the end portions thereof. A substrate having such a portion at least at a part thereof is used as the bonded substrate in the production method of the first aspect of the present invention. In FIG. 32A, the semiconductor substrate 3004 and the support substrate 3007 are apart from each other at the end portion of the bonded substrate, so that both the end portions of the semiconductor substrate 3004 and the support substrate 3007 are not bonded to each other. In FIG. 32B, the end portion of the support substrate 3007 is not bonded. In FIG. 32C, the end portion of the semiconductor substrate 3004 is not bonded.

Figure 32D:
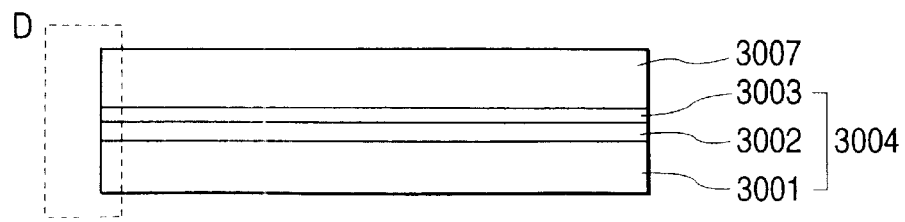
Figure 33:
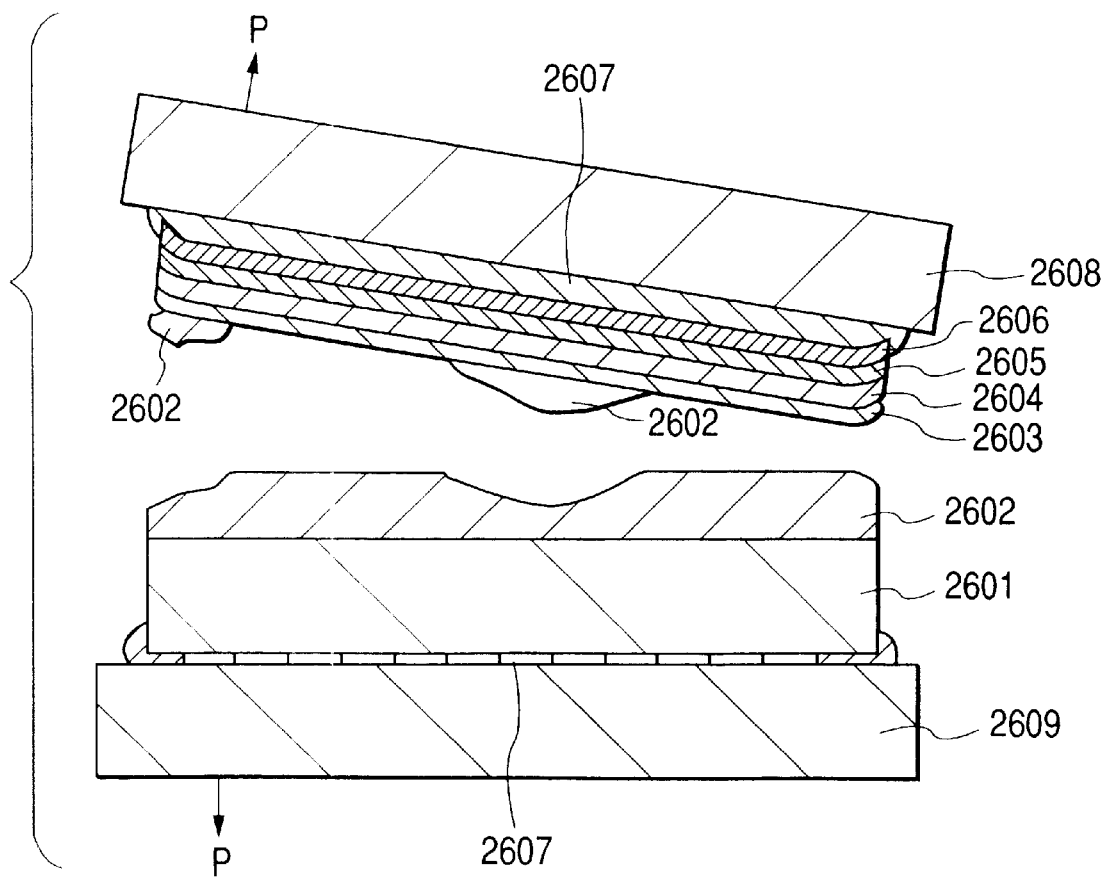
FIG. 33 is a schematic sectional view illustrating the production steps of a solar cell of the prior art.

FIG. 32D is a schematic sectional view showing an example of the bonded substrate used in the production method of the second aspect of the present invention. In this bonded substrate, as shown by portion D in the figure, the end portion of the semiconductor substrate 3004 and that of the support substrate 3007 are at the same location, that is, the end portions of the semiconductor substrate 3004 and the support substrate 3007 are flush with each other.

The first semiconductor layer 3001 of the present invention is preferably an ordinary semiconductor wafer made of Si, GaAs, etc. The second semiconductor layer 3003 may be either an Si or GaAs layer epitaxially grown on the separation layer 3002 or a polycrystalline or amorphous layer provided on the separation layer 3002. It is also within the scope of the present invention that an Si wafer is used as the first semiconductor layer 3001 and the Si wafer is subjected to anodization or the like to form the separation layer 3002, and that either an Si layer homoepitaxially grown on the separation layer 3002 or a GaAs layer heteroepitaxially grown on the separation layer 3002 is used as the second semiconductor layer 3003. Alternatively, a semiconductor wafer is subjected to ion implantation or the like to form the first semiconductor layer 3001, the separation layer 3002, and the second semiconductor layer 3003 in the semiconductor wafer.

Figure 1B:
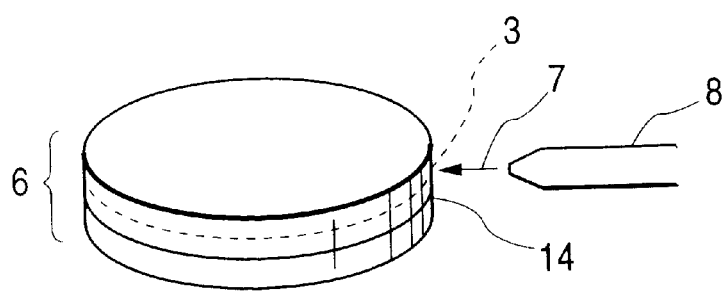
Figure 1C:
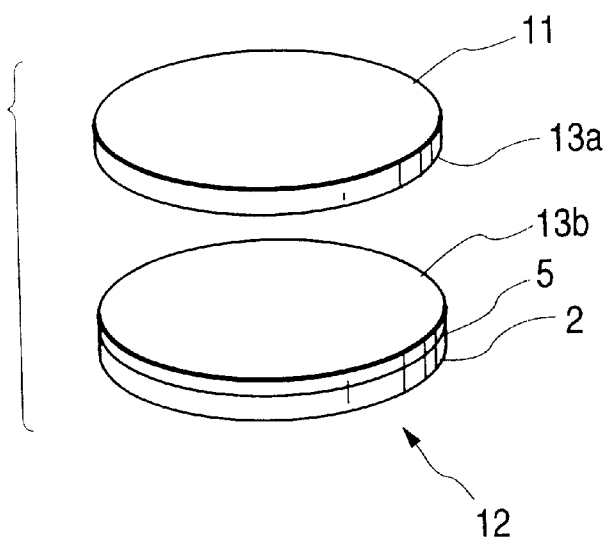

FIGS. 1A to 1C are schematic perspective views illustrating a method of separating a bonded substrate according to the present invention.

FIG. 1A shows a state prior to the bonding of a disk-like (plate-like) semiconductor substrate 1 and a support substrate 2. The semiconductor substrate 1 has a separation layer 3 which is a separation position, between a first semiconductor layer 11 and a second semiconductor layer 12. The separation layer 3 has a lower mechanical strength than the second semiconductor layer 5 located on the side of a bonding surface 4a.

The two substrates 1 and 2 are bonded such that the bonding surface 4a and another bonding surface 4b face each other to form a disc-like bonded substrate 6 having a bonding interface 14, as shown in FIG. 1B. A fluid 7 is jetted from a nozzle 8 toward the end portion of the separation layer 3 located on the side surface (end surface) of the bonded substrate 6. The separation layer 3 against which the fluid 7 is jetted is removed or collapsed. Thus, the bonded substrate is separated into the first semiconductor layer 11 and a substrate 12 for a photoelectric conversion device at the separation layer 3, as shown in FIG. 1C.

The second semiconductor layer 5 is not present on a separation surface 13a of the thus separated first semiconductor layer 11, and the second semiconductor layer 5 has been transferred onto a bonding surface 4b of the original support substrate 2 so as to expose a separated surface 13b. Thus, the substrate 12 for a photoelectric conversion device having the thin second semiconductor layer 5 on the support substrate 2 is obtained.

It is preferable that the separation layer 3 is fragile enough to allow the bonded substrate 6 to be separated into two at the separation layer 3 by the jetted fluid and to prevent damage to other regions than the region of the separation layer 3. Specifically, the separation layer 3 can be made fragile by introducing a plurality of microvoids thereinto. Alternatively, heterogeneous ions may be implanted to cause strain in the separation layer 3. The microvoid is formed of pores of a porous body or a bubble generated by ion implantation, as described below. The thickness of the separation layer 3 is preferably 0.1 to 900 μm and more preferably 0.1 to 10 μm.

The spray (flow) of a fluid used to effect the separation according to the present invention can be implemented by pressurizing and ejecting the fluid through a nozzle. The method of converting the ejected flow into a high speed, high pressure thin beam may be the water jet method using water as the fluid such as reported in Journal of the Water Jet Tech. Soc. of Japan, vol. 1, no. 1, pp. 4–15 (1984). In the waterjet that can be used for the present invention, water pressurized at several hundreds MPa (several thousands kgf/cm$^2$) by a high-pressure pump is jetted through a thin nozzle, whereby ceramics, metal, concrete, resin, rubber, or wood (an abrasive material such as SiO$_2$ grains is added to water if the material is hard) can be cut or processed, and removal of a paint film on a surface layer or cleaning of a surface of a member can be effected. Thus, the water jet has been mainly used to remove a part of the material, as described above. That is, water jet cutting has been carried out to remove a cut edge from a main member, and the removal of a coating and the cleaning of a member surface has been executed in order to remove unwanted portions.

When the water jet is used to form the flow of a fluid according to the present invention, it is possible to jet water toward the bonding interface on the side surface (end surface) of the bonded substrate 6 to remove at least a part of the separation layer 3 from the side surface. In this case, the water jet is ejected directly against the separation layer 3 exposed on the side surface of the bonded substrate 6 and against a part of the semiconductor substrate 1 and the support substrate 2 in the vicinity of the separation layer 3. Then, the semiconductor substrate 1 and the support substrate 2 are not damaged and only the separation layer 3 of a small mechanical strength is removed or destroyed by the water jet to separate the bonded substrate 6 into the first semiconductor layer 11 and the substrate 12 for a photoelectric conversion device. Even if the separation layer 3 is not exposed on the side surface but is instead covered with a certain thin layer for any reason, the water jet may be used to remove the layer covering the separation layer 3 on the side surface and then to remove the separation layer 3 exposed from the side surface.

Although not often used in the prior art, the water jet may be ejected against a narrow recess portion on the peripheral side surface of a bonded substrate formed by bonding two chamfered substrates, so that the water penetrates and extend microvoids in the separation layer of a fragile structure to separate the bonded substrate. This operation is not intended to perform cutting or removal, so little chips occur from the separation layer and the bonded substrate can be separated without the need for abrasive particles or damage to surfaces obtained by separation (separation surfaces), even if the material itself of the separation layer cannot be removed by the water jet. Thus, this is not a cutting or polishing effect but a kind of wedge effect provided by the fluid. Thus, this is very effective if there is a recess or a narrow gap in the side surface of the bonded substrate and the water jet exerts a force in such a direction as to peel off the members sandwiching the separation layer. To obtain a sufficient effect, the side surface of the bonded substrate is preferably recessed rather than protruded.

Figure 2A:
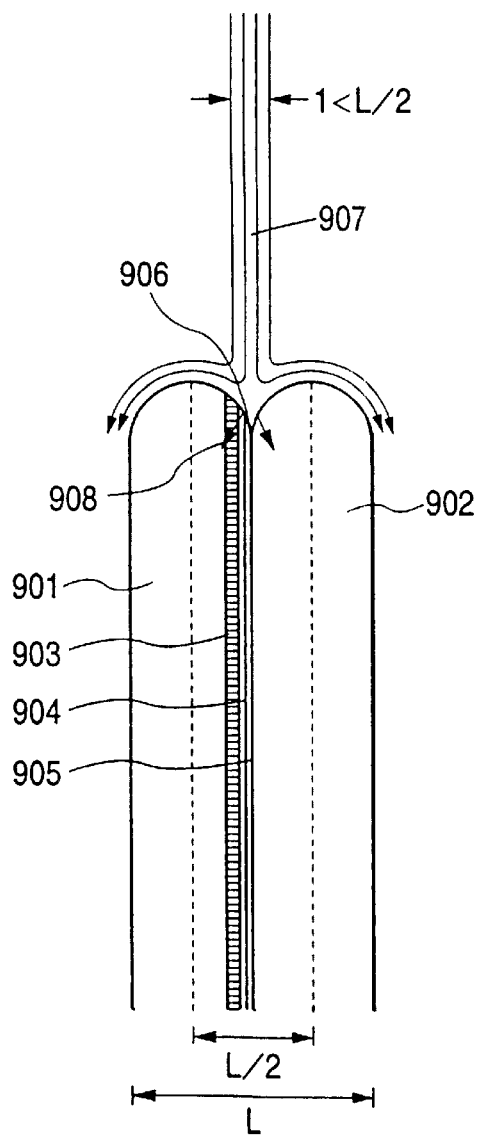
FIGS. 2A and 2B are schematic sectional views illustrating an example of the method of separating a bonded substrate using a fluid according to the present invention.
Figure 2B:
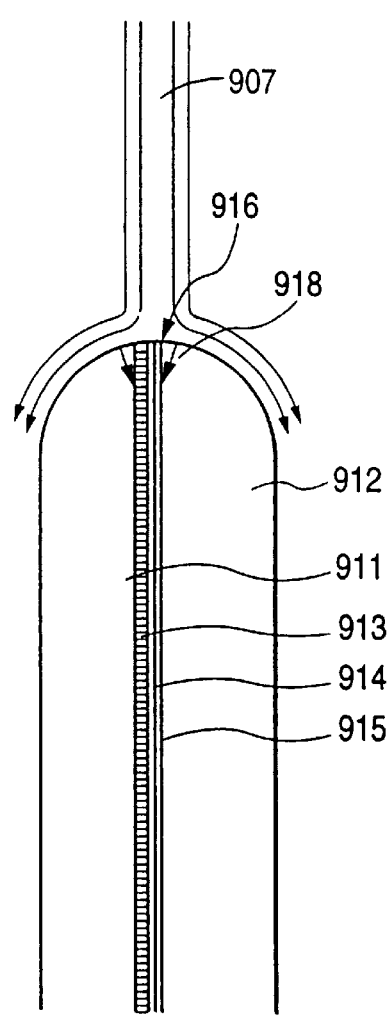

FIGS. 2A and 2B are schematic sectional views showing this effect. In FIGS. 2A and 2B, 901 and 911 denote semiconductor substrates, 902 and 912 support substrates, 903 and 913 separation layers, 904, 905, 914 and 915 second semiconductor layers, 906 and 916 bonding interfaces, 907 a jet of a fluid, and 908 and 918 the directions of forces exerted to the substrate by the fluid.

FIG. 2A conceptually shows the direction of a force exerted to the substrate by the water jet when the side surface of the end portion of the bonded substrate is recessed. The force is applied in a direction in which the recessed portion is extended, that is, in a direction in which the substrates 901, 902 as bonded are peeled off. On the contrary, FIG. 2B conceptually shows the direction of a force exerted to the substrate by the water jet when the side surface of the end portion of the bonded substrate is protruded. In this case, a force is not applied in the direction in which the substrates as bonded are peeled off, so that the bonded substrate cannot be separated unless a part of the separation layer 913 is initially removed. However, if the fluid can penetrate into a void (pore) of the separation layer 913, the separation is possible. At this time, there is formed a portion where the semiconductor substrate 911 and the support substrate 912 are apart from each other.

Even when the separation layer is not exposed on the side surface but is instead covered with a certain thin layer for any reason, a sufficient separation effect can be obtained when the side surface of the bonded substrate is recessed as described above because a force is exerted in the direction in which the vicinity of the separation layer 903 is extended to destroy the thin layer covering the separation layer 903 on the side surface and then to extend and destroy the separation layer 903. To efficiently receive the flow of the water jet, the aperture width of the recessed portion is desirably equal to or larger than the diameter of the water jet. When the thicknesses of the semiconductor substrate 901 and the support substrate 902 are less than 1.0 mm, respectively, the thickness of the bonded substrate is less than 2.0 mm. Since the aperture width of the recessed portion is normally about half this value, the diameter of the water jet is preferably 1.0 mm or less. Actually, a water jet of about 0.1 mm diameter can be put to practical use.

The nozzle for jetting the fluid may have any shape including a circle. A thin, long slit-like nozzle can also be used. By jetting the fluid through such a nozzle, a thin belt-like flow can be formed.

Various ejection conditions of the water jet can be selected arbitrarily depending on the type of the separation layer or the shape of the side surface of the bonded substrate, and so on. For example, the important parameters include the pressure of jet, the moving speed of jet, the diameter of nozzle (≈the diameter of water jet), the shape of nozzle, the distance between nozzle and separation layer, the flow rate of fluid, or the like.

In an actual separation step, separation can be achieved by moving the nozzle along the bonding surface while jetting the water in a direction parallel to the bonding surface or fixing the water jet and moving the bonded substrate in parallel. In addition, the water jet may be moved so as to draw a fan around the nozzle, or the bonded substrate may be rotated around the position of a fixed nozzle as a rotational center if, as is often the case, the bonded substrate is shaped like discs such as wafers with orientation flats or notches. Furthermore, the water jet may be ejected against the separation layer in an inclined direction as required instead of placing the nozzle in the same plane as the bonding interface. The manner of moving the water jet is not limited to these methods but may be carried out by any other method as required.

When the water jet has a very small diameter and the ejection direction is almost parallel with the surface of the substrate, vector resolution shows that a high pressure of several hundreds MPa (several thousands $kgf/cm^2$) is rarely applied to the substrate. Since the water jet applies a force of only several hundreds Pa (several hundreds $gf/cm^2$) to the bonded substrate except for the separation layer, the substrate is prevented from being destroyed. For example, this water jet pressure is a pressure such that when the water jet is ejected perpendicularly to a wafer surface, the wafer can not be cut.

Further, instead of water, an organic solvent such as alcohol, an acid such as hydrofluoric or nitric acid, or an alkali such as potassium hydroxide, or a liquid that can selectively etch the separation layer may be used. Furthermore, a gas such as air, nitrogen gas, carbon dioxide gas, or a rare gas may be used as the fluid. A gas or plasma having an action of etching the separation layer may also be used.

As water to be used, a high purity water such as pure water with a minimized amount of an impurity metal and particles, or ultrapure water is desirably used, but the substrate may be cleaned to remove impurities after the separation using the water jet, when the perfect low-temperature process is adopted. In particular, in the present invention, the fluid is preferably free of abrasive particles so as not to leave unwanted scratches in the substrates.

Embodiment 1

Figure 3:
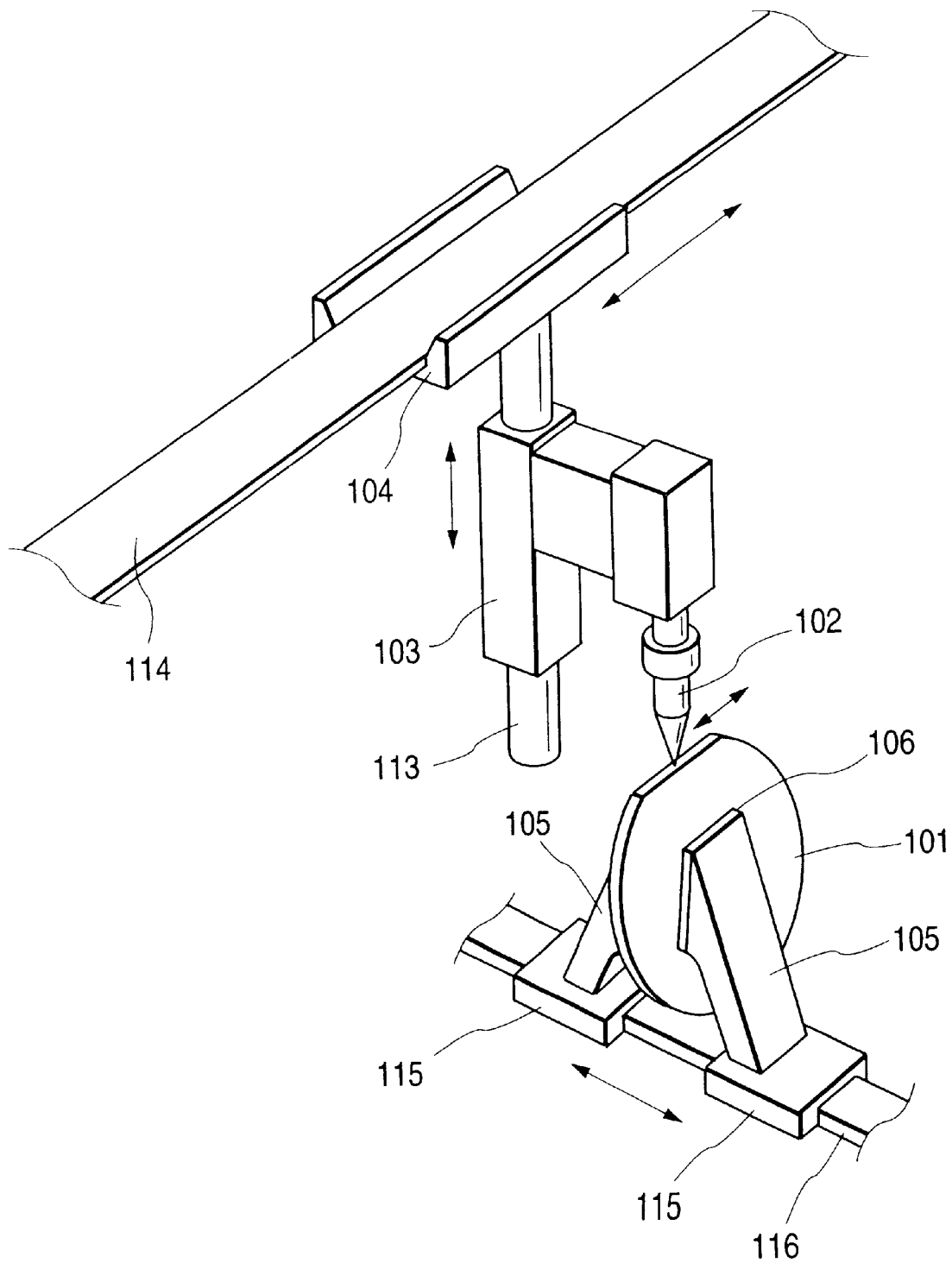
FIG. 3 is a schematic perspective view showing an example of the separation apparatus according to the present invention.

FIG. 3 is a schematic perspective view showing a separation apparatus according to one embodiment of the present invention.

In the figure, reference numeral 101 denotes a bonded substrate; 102 a fluid jet nozzle; 103 a vertical movement mechanism for adjusting the vertical position of the nozzle 102; 104 a horizontal movement mechanism for adjusting the horizontal position of the nozzle 102; 115 a horizontal movement mechanism for adjusting the horizontal position of the bonded substrate 101; and 105 a substrate holder as a holding member. Reference numerals 113, 114, and 116 denote guides. In the apparatus shown in FIG. 3, the bonded substrate separation operation is performed by using the movement mechanisms 103, 104, and 115 to align the nozzle 102 with the end portion of the separation layer of the bonded substrate 101 and jetting a highly pressurized fluid from the nozzle 102 to the end portion of the separation layer on the side surface of the bonded substrate 101 while moving the nozzle in the horizontal and vertical directions with the bonded substrate 101 remaining fixed. Reference numeral 106 is a packing material used as required and consisting of a porous or nonporous elastic body.

Embodiment 2

Figure 4:
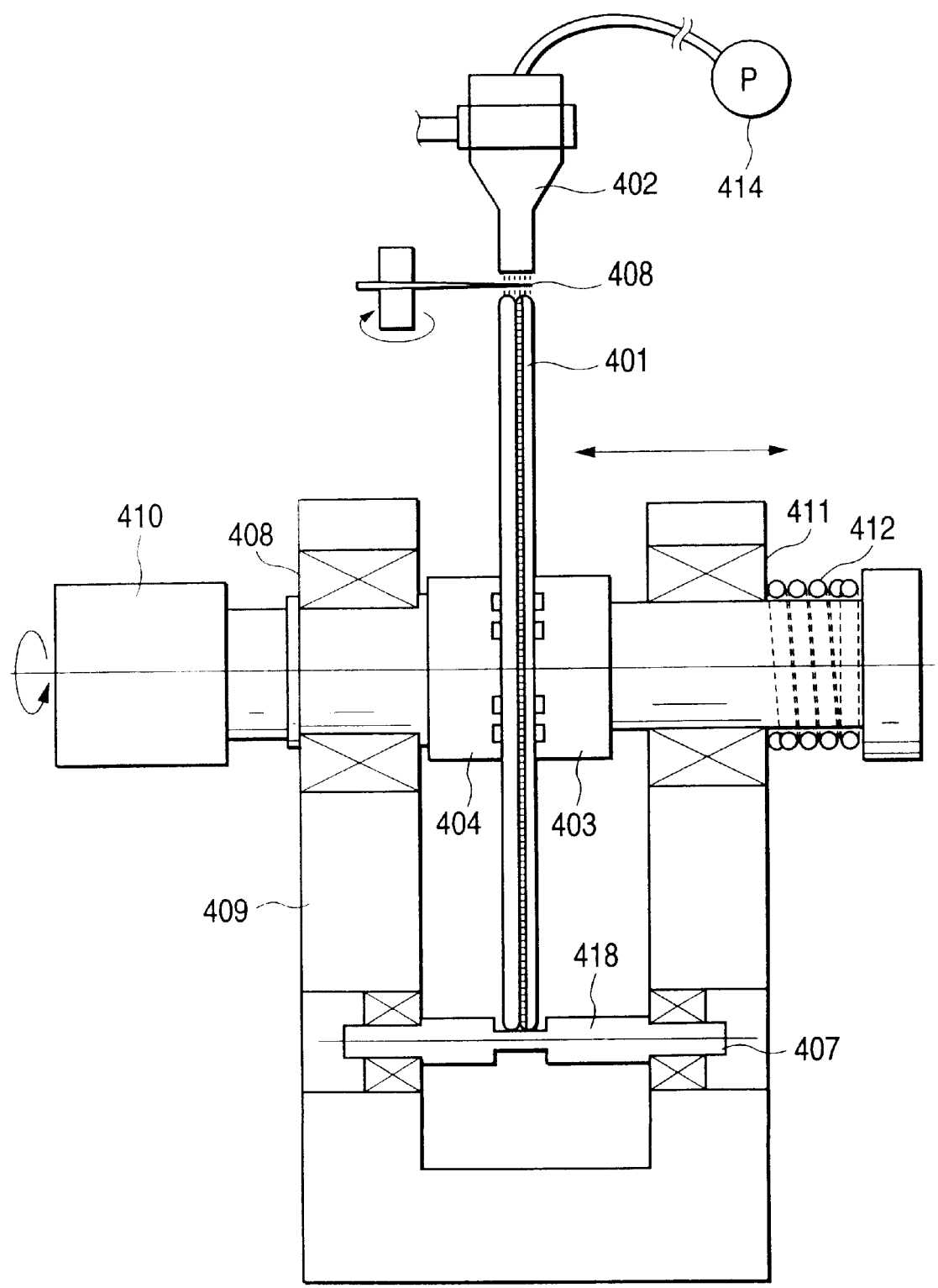
FIG. 4 is a schematic sectional view showing another example of the separation apparatus according to the present invention.

FIG. 4 is a schematic sectional view showing another example of a separation apparatus used for the present invention. In FIG. 4, 401 denotes a bonded substrate having inside a porous layer as a separation layer. Reference numerals 403 and 404 denote holders that suck and fix the substrate 401 using a vacuum chuck 403, 404 and that are rotatably mounted on the same rotating shaft. Further, the holder 404 is fitted in a bearing 408 and supported by a supporting stand 409, and its rear end is directly coupled to a rotating shaft of a speed control motor 410. Thus, controlling the motor 410 enables the holder 404 to be rotated at a desired speed. The other holder 403 is fitted in a bearing 411 and supported by the supporting stand 409, and a compression spring 412 is provided between the rear end of the holder 403 and the supporting stand 409 to exert a force in a direction in which the holder 403 leaves the bonded substrate 401.

First, the bonded substrate 401 is set so as to correspond to a recessed portion of a positioning pin 413 and is sucked and held by the holder 404. The holder 404 can hold the middle portion of the bonded substrate 401 by using the pin 413 to adjust the vertical position of the wafer 401. The holder 403 is moved leftward against the spring 412 to a position at which it sucks and holds the bonded substrate 401. At this time, a rightward force is applied to the holder 403 by the compression spring 412. At this time, the returning force applied by the compression spring 412 and the force of the holder 403 for sucking the bonded substrate 401 are balanced so that the force of the compression spring 412 will not cause the holder 403 to leave the wafer 401.

A fluid is fed from a jet pump 414 to the jet nozzle 402 and continues to be ejected until the jet fluid is stabilized. Once the flow of the fluid has been stabilized, the nozzle is moved, a shutter 406 is opened, and the fluid is jetted from the jet nozzle 402 to the side surface of the bonded substrate 401 against the center of thickness direction of the bonded substrate 401. At this time, the holder 404 is rotated by the motor 410 to rotate the bonded substrate 401 and holder 403. By jetting the fluid against the vicinity of the thickness-wise center of the bonded substrate 401, the bonded substrate 401 is extended into two to destroy the separation layer that is relatively weak in the bonded substrate 401 and to finally separate the bonded substrate 401 into two.

At this time, as described above, the fluid is applied to the bonded substrate 401 uniformly and a rightward force is applied to the holder 403 while holding the bonded substrate 401, so that the separated two of the bonded substrate 401 are unlikely to slide after separation.

The bonded substrate 401 can also be separated by moving the nozzle 402 in a direction parallel to the bonding interface (surface) of the bonded substrate 401 without rotating the wafer 401. However, when separation is effected by moving the nozzle 402 without rotating the bonded substrate 401, high-pressure water at 196 MPa (2000 kgf/cm$^2$) is required to be supplied to a nozzle with a diameter of 0.15 mm, whereas only 19.6 MPa (200 kgf/cm$^2$) of pressure is required when separation is effected while rotating the bonded substrate 401 with the nozzle 402 fixed.

This is because water is jetted to the center portion of the bonded substrate 401 to enable the water pressure to act more efficiently as an extending force compared with the system of moving the nozzle.

The following effects can be obtained by reducing the water pressure.

1) The bonded substrate can be separated without destruction.

2) A large number of jets can be simultaneously used due to the increased available capacity of the pump.

3) The size and weight of the pump can be reduced.

4) A wider range of materials are available for the pump and piping to allow the apparatus to easily utilize pure water.

5) The sound of the pump and, in particular, of the jet is reduced to allow sound-proof measures to be taken easily.

The substrate holding means shown in FIG. 4 holds the substrate by using the holders 403 and 404 so as to pull the substrate from the both sides, but the substrate may also be held by pressing it from the both sides with the holders 403 and 404. In this case, the high-pressure water also advances while extending the bonded substrate 401 to form a small gap in them, and finally separates them into two.

The smaller the contact area between the holders 403, 404 and the bonded substrate 401, the more flexibly the bonded substrate 401 can be moved when the high-pressure water extends the bonded substrate 401. Thus, stress concentration caused by excessively high pressure can be prevented and the presence of water in the separation interface of the bonded substrate 401 serve to prevent cracks and to allow the bonded substrate to be extended easily. These points enable effective separation. For example, when the contact portion between the holders 403, 404 and the bonded substrate 401 has a diameter of 30 mm or less, the bonded substrate 401 does not crack and can be separated into two during a single rotation of the bonded substrate 401, under the conditions of the nozzle diameter of 0.2 mm and the pressure of 39.2 MPa (400 kgf/cm$^2$).

In addition, the larger the contact area between the holders 403, 404 and the bonded substrate 401, the more firmly the rear surfaces of the bonded substrate 401 are supported when the high-pressure water extends the bonded substrate 401, thereby preventing cracks during separation. When the contact portion between the holders 403, 404 and the bonded substrate 401 has a diameter of 100 mm or more, the bonded substrate 401 can be separated into two without cracks under the conditions of the nozzle diameter of 0.2 mm and the pressure of 39.2 MPa (400 kgf/cm$^2$).

If foreign matters such as particles are sandwiched between the holder 403 or 404 and the bonded substrate 401, the bonded substrate 401 is no longer held in the vertical direction to cause the nozzle 402 to be offset from its perpendicular direction toward the top of the bonded substrate 401 in the longitudinal or lateral direction, thereby failing to effectively hit the high-pressure fluid against the separation interface of the bonded substrate 401. To prevent this, the surfaces of the holders 403 and 404 that contact the bonded substrate 401 can be formed with a large number of fine protrusions to minimize the contact area, thus reducing the effect of possible sandwiching of foreign matters.

In the supporting system shown in FIG. 4, the holder 404 is rotated to rotate the holder 403 together, so that a slight force is effected in the direction in which the rotation is stopped and torsion may occur in the separation surface to effect separation just before the bonded substrate 401 is entirely separated. In this case, the holders 403 and 404 can be rotated synchronously to prevent torsion of the separation surface. This method is described below in detail.

Embodiment 3

Figure 5:
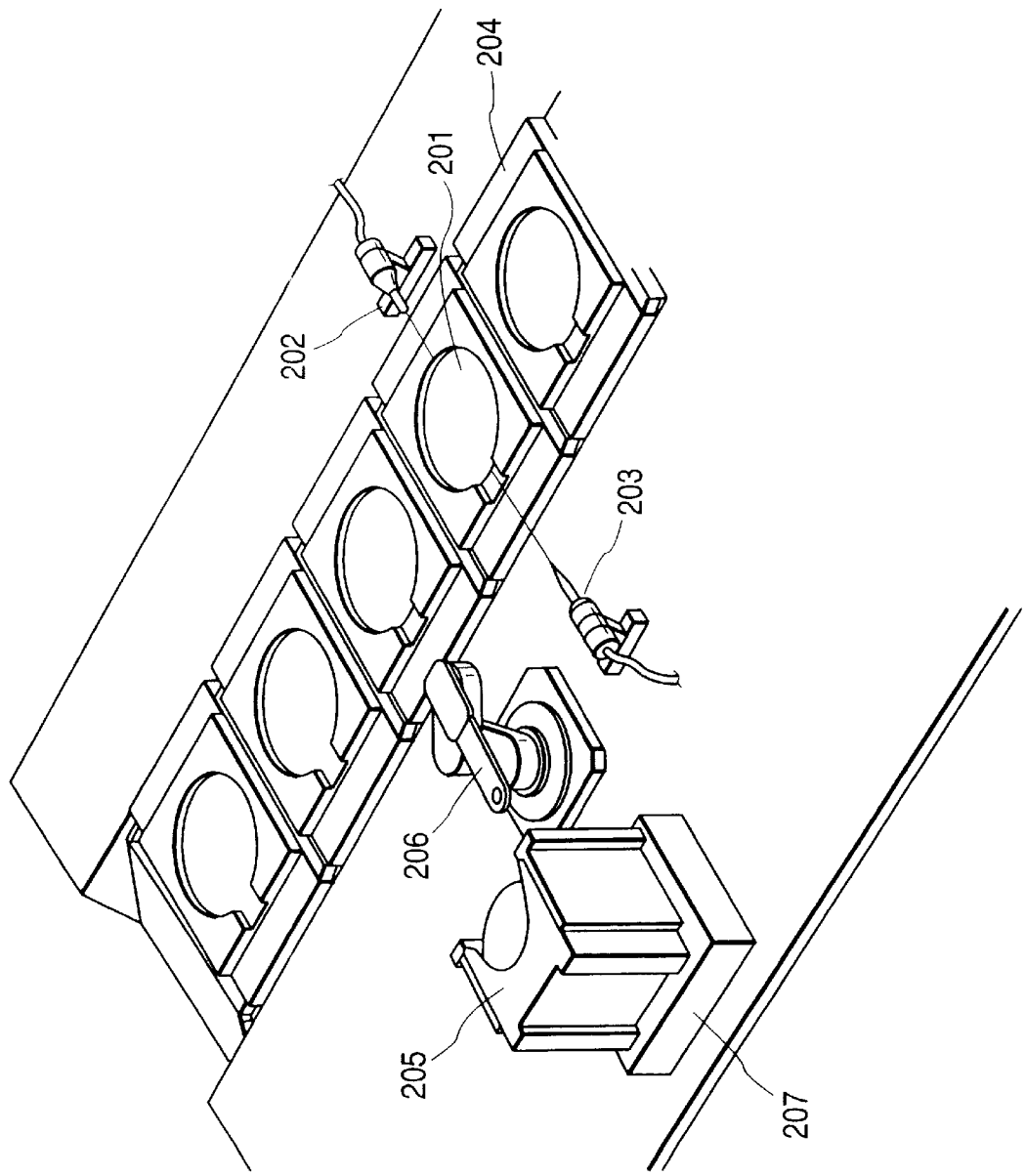
FIG. 5 is a schematic perspective view showing yet another example of the separation apparatus according to the present invention.

FIG. 5 is a schematic perspective view showing another separation apparatus according to the present invention. In this figure, reference numeral 204 denotes a substrate supporting stand of a substrate horizontal-drive mechanism, 205 a substrate carrier, (substrate cassette) and 206 a substrate transfer arm of a substrate carrying robot. As shown in this figure, the substrate cassette 205 is placed on a cassette stand 207 such that a bonded substrate 201 is arranged in the horizontal direction. The bonded substrate 201 is transferred on a substrate supporting stand 204 using the substrate transfer arm 206 of the substrate carrying robot. The substrate supporting stand 204 on which the bonded substrate 201 is placed is transferred to the position of high-pressure jet nozzles 202 and 203 by a supporting stand moving mechanism such as a belt conveyor. A high-pressure fluid is jetted against a separation layer in a recessed potion of the bonded substrate formed by bevelling, through the nozzles 202 and 203 of a fluid jet apparatus located on the side of the bonded substrate, in a direction parallel to the bonded interface (surface) of the bonded substrate. In this case, the nozzles are fixed and the bonded substrate is moved in the horizontal direction so as to receive the high-pressure fluid along the recessed portion. One or both of the nozzles 202 and 203 may be used as required.

This operation enables the bonded substrate to be divided into two at a porous Si layer as the separation layer. Although not shown in the figure, another carrying robot stores the tow members obtained by separating the bonded substrate as a semiconductor substrate and a support substrate.

In the horizontal jet method, the bonded substrate need not be fixed and, after separation, the separated substrate members are unlikely to jump out from the substrate supporting stand 204 because of their own weights. In order to prevent the jump out, after the bonded substrate has been transferred on the substrate supporting stand, a jump prevention pin may be installed on the top of the bonded substrate so as to protrude from the substrate supporting stand 204 over the bonded substrate or the top of the bonded substrate 201 may be pressed softly.

Furthermore, a plurality of bonded substrates may be placed and set in the vertical direction relative to their surfaces, and one set of bonded substrates thereof may then be separated through horizontal moving. Then, the substrate supporting stand 204 may be moved in the vertical direction by a distance equal to the interval of the bonded substrates to allow the second separation layer of the bonded substrate to be separated sequentially through horizontal moving similarly to the first set of the bonded substrates.

Embodiment 4

Figure 6:
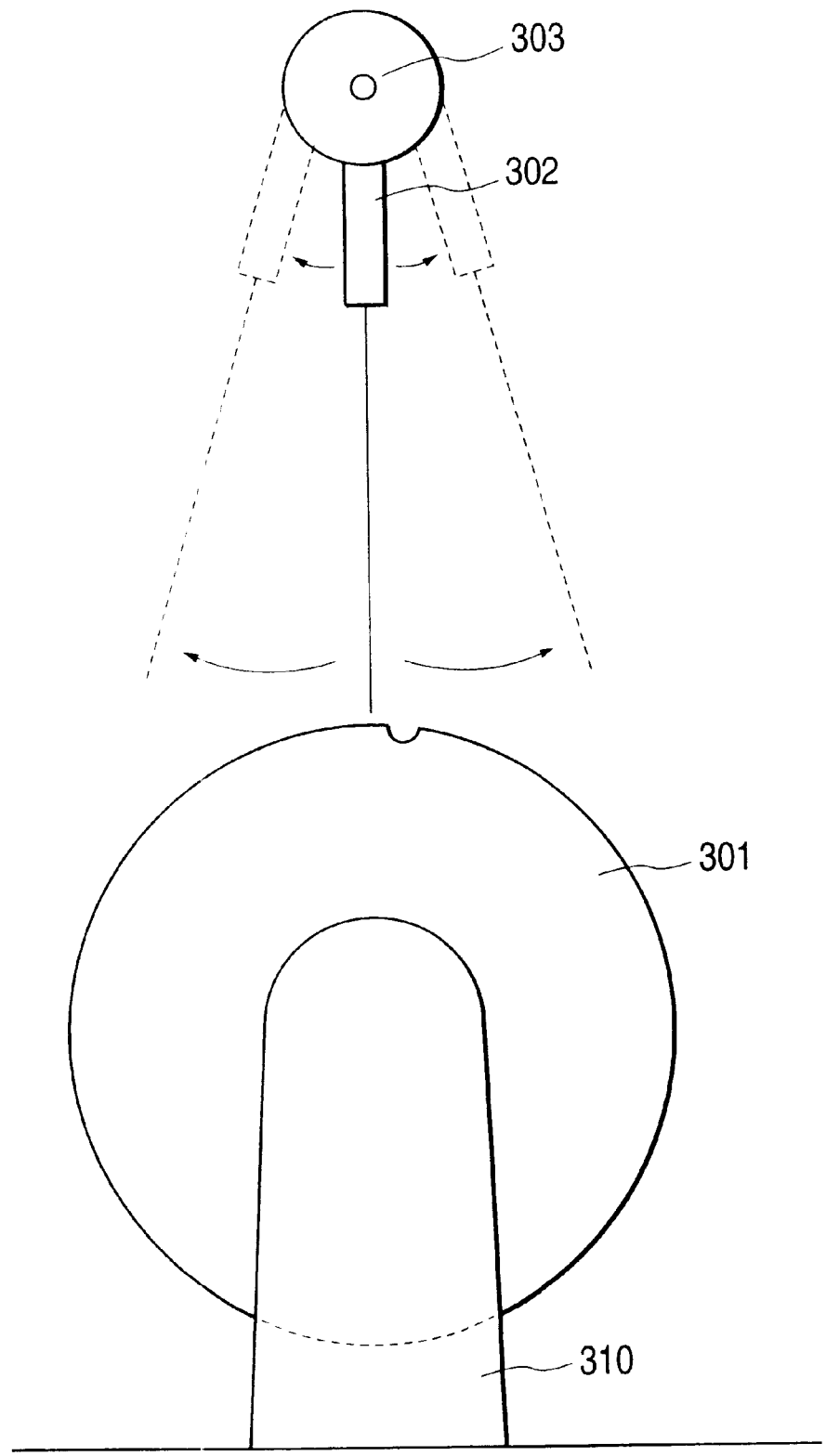
FIG. 6 is a schematic side view showing still another example of the separation apparatus according to the present invention.

FIG. 6 is a schematic side view showing another separation apparatus according to the present invention. This figure conceptually shows a nozzle of a water jet apparatus used in this embodiment and its movement. As shown in FIG. 6, a bonded substrate 301 is held by a holder 310 so as to stand in the vertical direction. A high-pressure fluid is jetted against a recessed potion of the bonded substrate formed by bevelling, through the nozzle 302 of the jet apparatus located above the bonded substrate, in a direction parallel to the bonding interface (surface) of the bonded substrate 301. In this case, the nozzle 302 and a supporting point 303 that allows the nozzle to oscillate within a plane so as to draw a fan are placed in the same plane as the bonded surface of the bonded substrate. The nozzle is oscillated within the bonding surface of the bonded substrate to oscillate the flow of the jet within this surface. This operation enables the high-pressure jet to be moved and jetted along the recessed portion or gap of the bonding portion of the edge of the bonded substrate. This in turn enables the fluid to be jetted against the separation layer in a wide range without the need for a robot that moves the nozzle within the bonding surface accurately or for a more mechanically complicated mechanism for moving or rotating the bonded substrate 301 itself.

Embodiment 5

Figure 7:
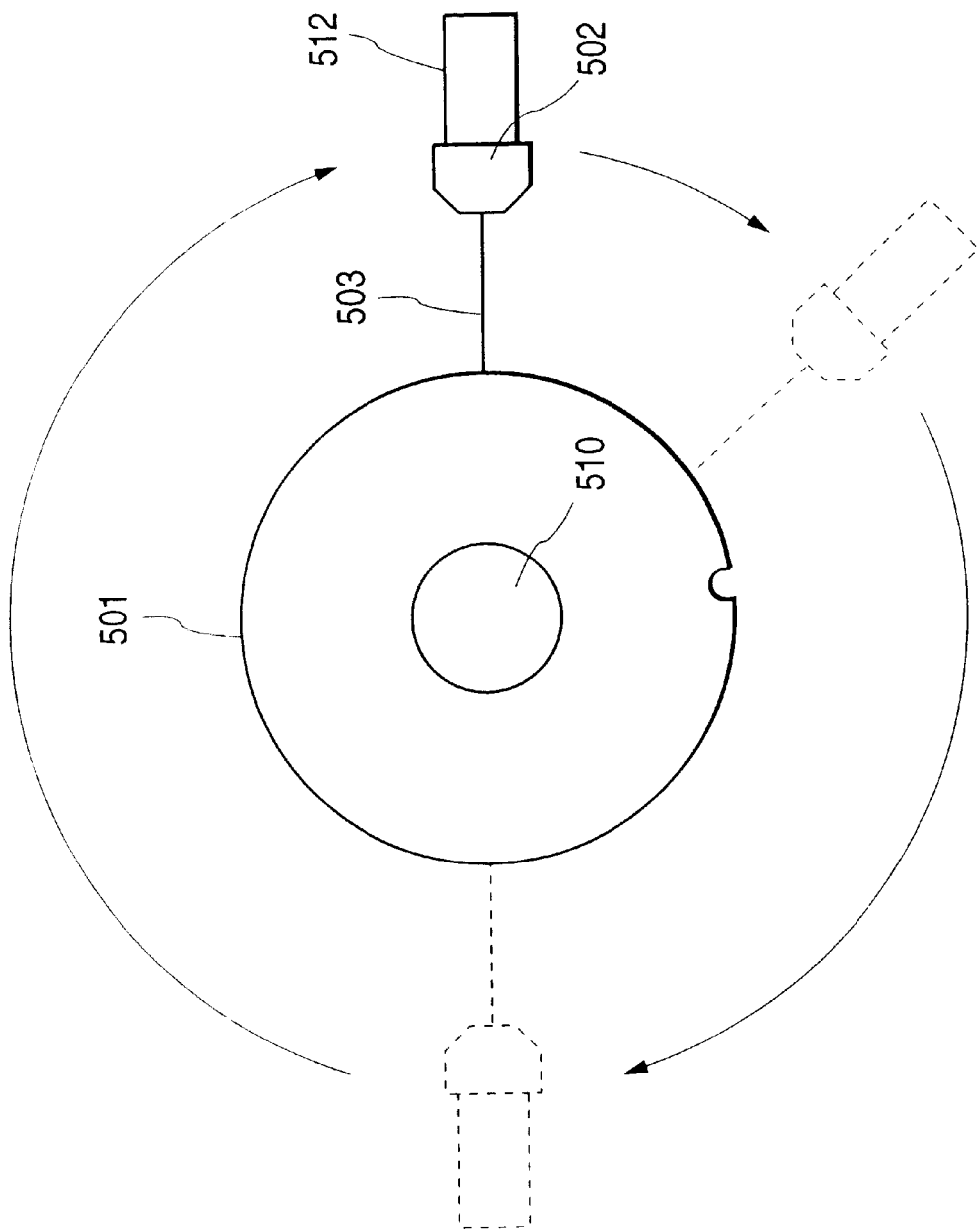
FIG. 7 is a schematic top view showing still another example of the separation apparatus according to the present invention.

FIG. 7 is a schematic top view of another separation apparatus according to the present invention and conceptually shows another method for ejecting a jet 503 against the periphery of a bonded substrate 501. The bonded substrate 501 is fixed by a holder 510 and a nozzle 502 can be rotated around the bonded substrate to allow the jet 503 to be ejected against the bonding portion over all the periphery of the edge of the bonded substrate. The center of the bonded substrate is held, and a jig 512 with the nozzle 502 fixed thereto can be slid on a rail (not shown in the drawing) provided around the bonded substrate 501 concentrically with the outer periphery of the bonded substrate 501, thus allowing the jet 503 to be ejected against the bonding portion from around the bonded substrate 501.

Embodiment 6

Figure 8:
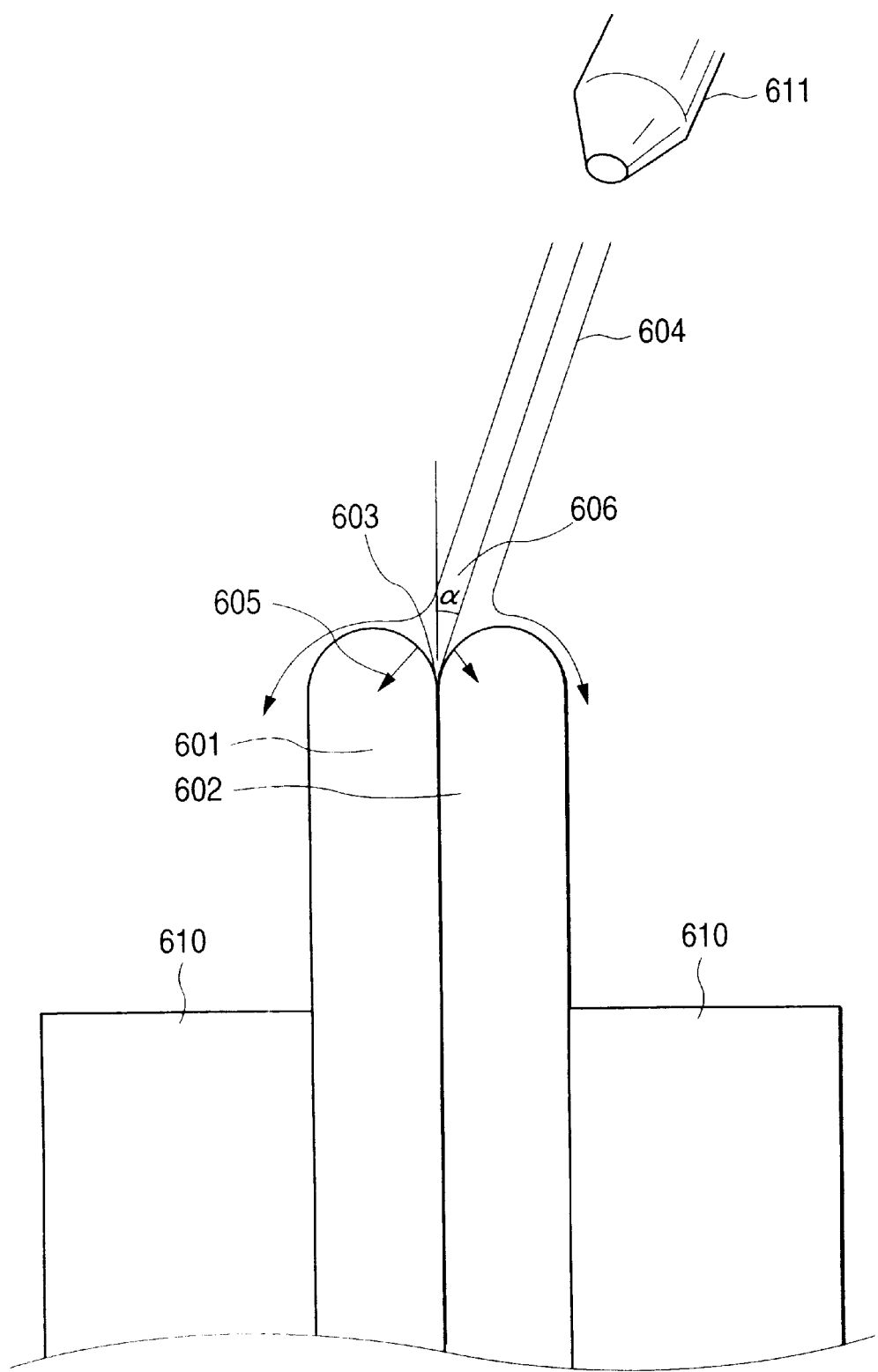
FIG. 8 is a schematic sectional view illustrating another example of the method of separating a bonded substrate using a fluid according to the present invention.

FIG. 8 is a schematic sectional view showing another example of a separation apparatus according to the present invention. In FIG. 8, 601 is a semiconductor substrate, 602 is a support substrate, 603 is a bonding surface, 604 is a fluid jet, 605 is the direction of a force exerted to the bonded substrate by the fluid jet, and reference numeral 606 denotes an angle between the fluid jet and the bonding surface. According to this embodiment, the positions of the nozzle 611 and holder 610 are set so that the direction of the jet ejected from the nozzle 611 is inclined at an angle α relative to the direction parallel to the separation surface of the bonded substrate.

The bonded substrate can be held by the apparatus shown in FIG. 4 and the nozzle can be disposed as shown in FIG. 8 to jet the fluid against the side surface of the bonded substrate. Since the jet 604 is inclined at an angle α 606 relative to the bonding surface 603, different pressures are applied to the semiconductor substrate 601 and the support substrate 602. In the example shown in FIG. 8, a relatively small force is applied to the support substrate 602 relative to which the jet is inclined, whereas a larger force is applied to the semiconductor substrate 601 at the opposite side. Thus, when the jet is inclined at a side opposite to the side of the semiconductor substrate 601, the separation layer can be destroyed easily, which is desirable.

Embodiment 7

Figure 9:
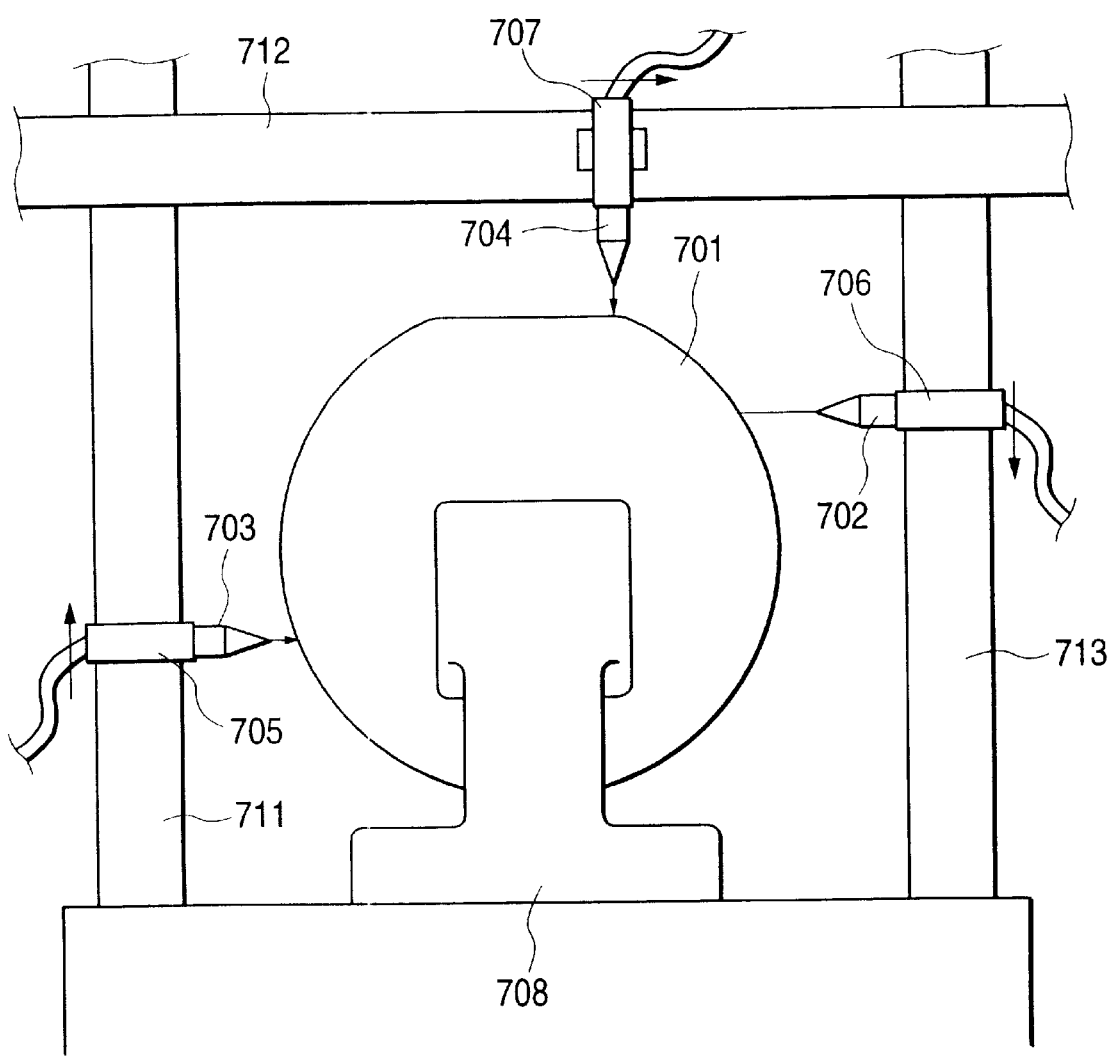
FIG. 9 is a schematic side view showing another example of the separation apparatus according to the present invention.

FIG. 9 is a schematic side view showing another separation apparatus according to the present invention. In FIG. 9, 705 and 706 are vertical drive mechanisms for fluid jet apparatus nozzles 702 and 703, 707 is a horizontal drive mechanism for a fluid jet apparatus nozzle 704, and 708 is a substrate holder.

A shown in FIG. 9, the bonded substrate holder 708 is used to hold both the side surfaces of the bonded substrate 701 so as to stand it in the vertical direction. In this case, a side surface of the bonded substrate having an orientation flat portion is directed upward. A high-pressure fluid is jetted against a recessed potion or gap of the bonded substrate 701 formed by bevelling, through a plurality of nozzles 702, 703, and 704 (in this example, three) of a jet apparatus located above or aside the bonded substrate, in a direction parallel to the bonding interface (surface) of the bonded substrate. The configuration of each nozzle is the same as shown in FIG. 3. At that time, the plurality of nozzles 702, 703, and 704 are moved along guides 711, 712, and 713, respectively in such a direction to move the high-pressure fluid along the gap formed by bevelling. In this way, the bonded substrate are divided into two.

When only one nozzle is used, a high pressure is required that is sufficient to separate the bonded substrate over a distance corresponding to its diameter. Alternatively, when the pressure is only sufficient to separate the bonded substrate over a distance corresponding to its radius, the bonded substrate must be turned upside down and separated again over a distance corresponding to its radius from the opposite side. The plurality of nozzles can be used to allow each nozzle to separate the bonded substrate only over a distance corresponding to its radius, and the need to jet the high-pressure fluid against the bonded substrate again after turning it upside down is omitted, and the bonded substrate can be separated over the whole surface during a single step.

Embodiment 8

Figure 10A:
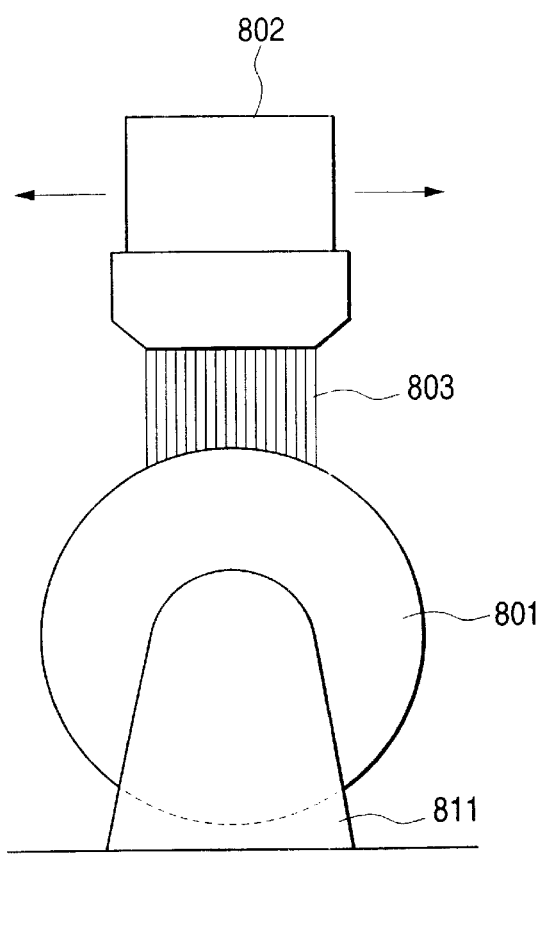
FIGS. 10A and 10B are schematic side views showing yet another example of the separation apparatus according to the present invention.
Figure 10B:
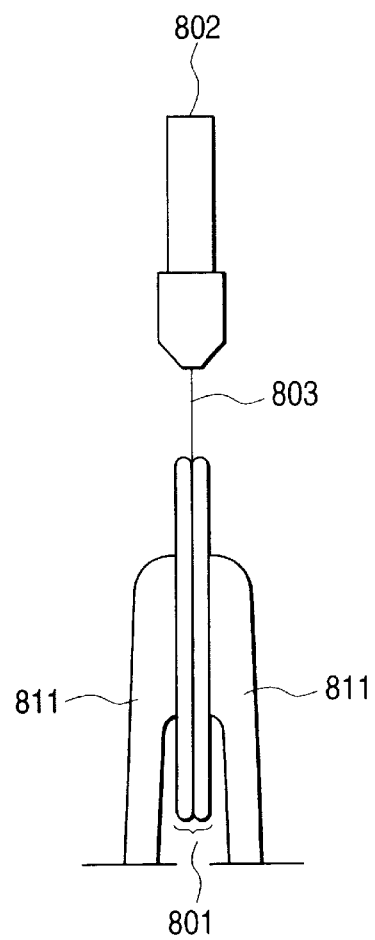

FIGS. 10A and 10B are schematic side views showing another separation apparatus according to the present invention. In FIGS. 10A and 10B, 801 is a bonded substrate, 802 is a nozzle for a fluid jet, and 803 is a fluid. As shown in the figures, a high-pressure pure water is jetted against a gap of the bonded substrate formed by bevelling, through a nozzle with a slit-like opening of the jet apparatus located above or aside the bonded substrate, in a direction parallel to the bonding interface (surface) of the bonded substrate while allowing the bonded substrate to stand perpendicularly to the holder 811. The slit is located parallel to the bonding interface (surface) of the bonded substrate and positioned so that a linear flow of water is jetted accurately against the gap of the bonded substrate formed by bevelling. The slit-like nozzle is moved in a direction in which the high-pressure fluid moves along the gap formed by bevelling.

The need to move the nozzle is omitted by making the length of the slit larger than the diameter of the bonded substrate.

The effect of this slit-like nozzle is that the bonded substrate can be divided under a lower pressure than with a single nozzle of a very small diameter. Even when using a low pressure, by increasing the area through which the high-pressure fluid is jetted, the energy used to separate the bonded substrate can be increased to enable it to be divided easily.

Figure 11:
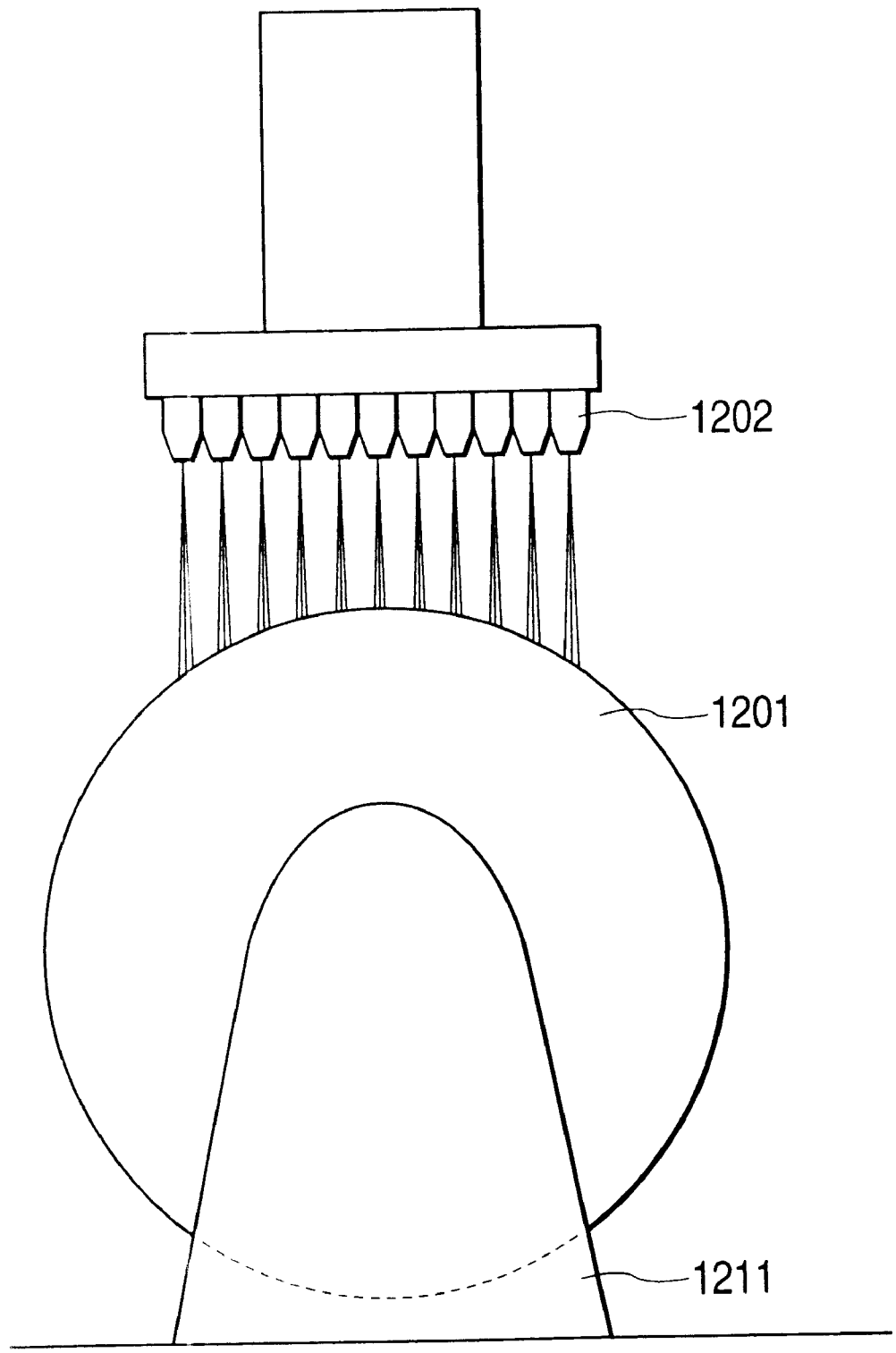
FIG. 11 is a schematic side view showing still another example of the separation apparatus according to the present invention.

Not only a nozzle having a slit-like opening but also a plurality of nozzles 1202 placed closely in a line to jet a fluid against a bonded substrate 1201 as shown in FIG. 11 can be used for the present invention to obtain similar results. Reference numeral 1211 denotes a holder of a bonded substrate 1201.

Embodiment 9

Figure 12:
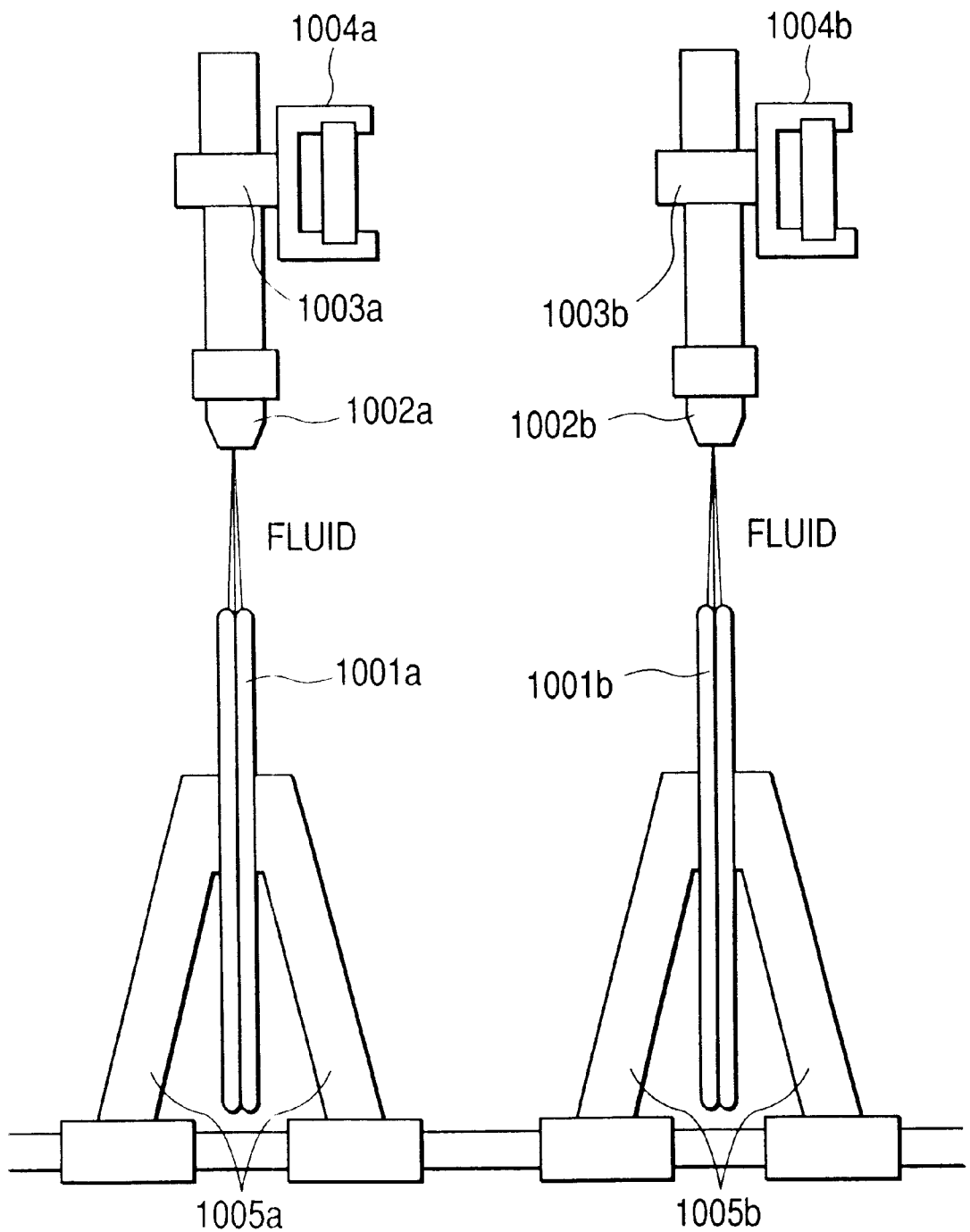
FIG. 12 is a schematic side view showing still another example of the separation apparatus according to the present invention.

FIG. 12 is a schematic side view showing another separation apparatus according to the present invention. With this apparatus, it is possible to use a plurality of jets to separate a plurality of bonded substrates at the same time.

In a basic configuration of the apparatus in FIG. 12, components similar to those in FIG. 3 are provided independently. A bonded substrate 1001a is set on a holder 1005a. A high-pressure fluid jetted from a nozzle 1002a hits against a bevelled portion of a bonded substrate 1001a. The nozzle 1002a can be moved in a direction perpendicular to the drawing by a horizontal-movement mechanism 1004a while jetting the high-pressure fluid against the bevelled portion. A similar operation can be performed in the portion shown in the right of the figure having a nozzle 1002b, a horizontal-movement mechanism 1004b, and a holder 1005b. This configuration doubles the throughput. Although this figure shows two sets of the jet portions, three or more of such portions may be provided. In the FIGS. 1003a and 1003b are vertical-movement mechanisms.

In addition, when the high-pressure pump does not have a large capacity, the right bonded substrate can be changed while the left high-pressure fluid is being jetted, and vice versa. This requires only one set of a loader and an unloader robots.

Embodiment 10

Figure 13:
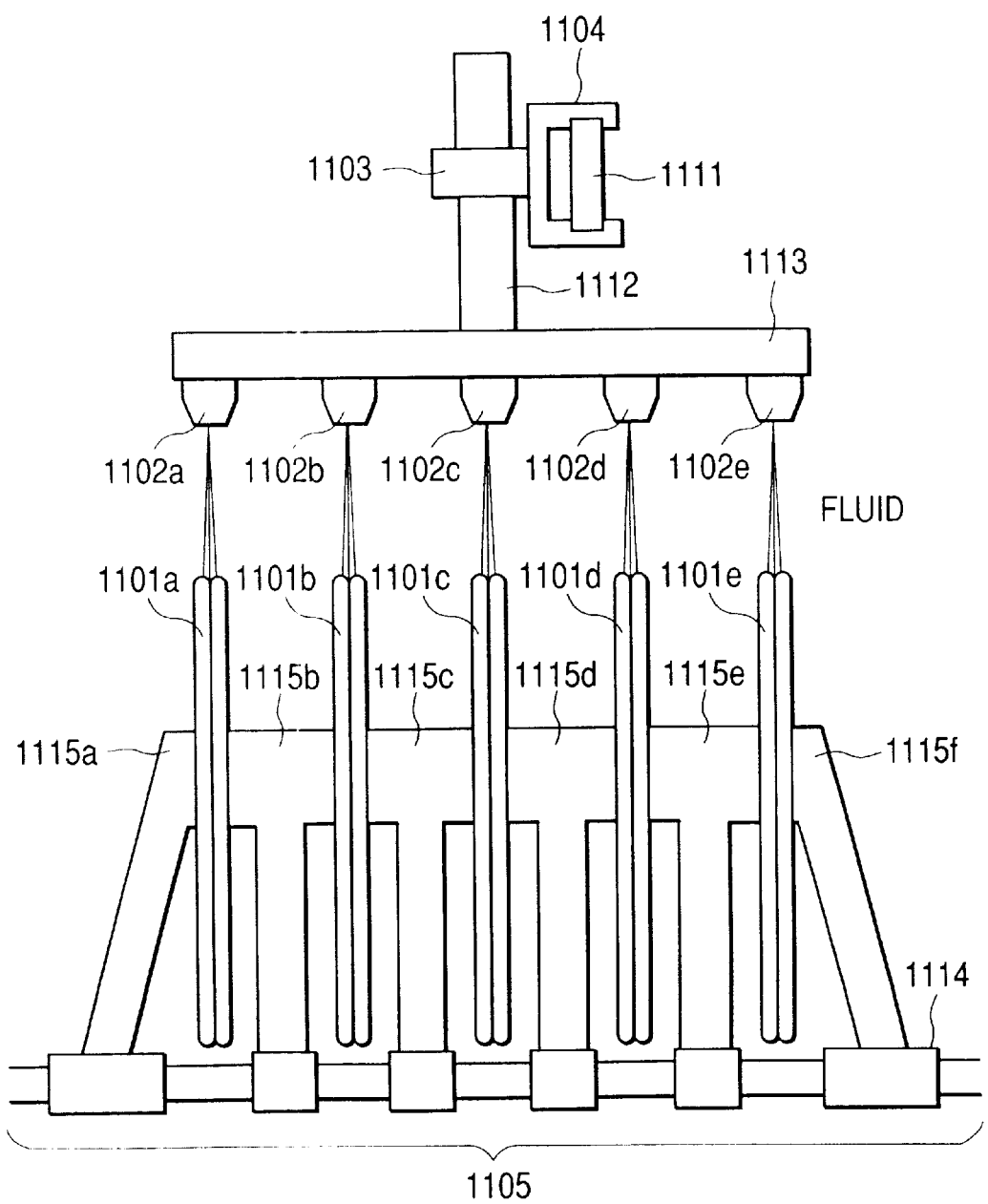
FIG. 13 is a schematic side view showing still another example of the separation apparatus according to the present invention.

FIG. 13 is a schematic side view showing another separation apparatus according to the present invention in which bonded substrates 1101a, 1101b, 1101c, 1101d, and 1101e are set at the same time on a substrate holding means 1105. A plurality of nozzles 1102a to 1102e are provided in a set of nozzle movement mechanisms 1103 and 1104. The nozzle interval is the same as the bonded substrate fixation interval. The holding mechanism and nozzle movement method are similar to those in FIG. 3.

By using the central axis of each bonded substrate for alignment, the five bonded substrates are each fixed between the holders 1115a and 1115b, between the holders 1115b and 1115c, between the holders 1115c and 1115d, between the holders 1115d and 1115e, or between the holders 1115e and 1115f, all of which can move on a guide 1114 in the horizontal direction.

A movable supply pipe 1112 acting as both a common fluid supply pipe and a nozzle vertical-movement mechanism is connected to the five nozzles 1102a to 1102e via a distributor 1113.

After the amount and pressure of fluid jetted from each nozzle have been stabilized at a nozzle stand-by position, all nozzles 1102a to 1102e are moved along the guide 1111 to a bonded substrate separation position and then further advance along the guide 1111 while separating the bonded substrates.

Once the separation has been finished, the amount of jetted fluid is reduced or the jetting is stopped to return the nozzles to their stand-by positions.

In the apparatuses shown in FIGS. 10A to 13, separation can be carried out by jetting the fluid while rotating the holders for the bonded substrates to make each bonded substrate rotate on its center.

Figure 14:
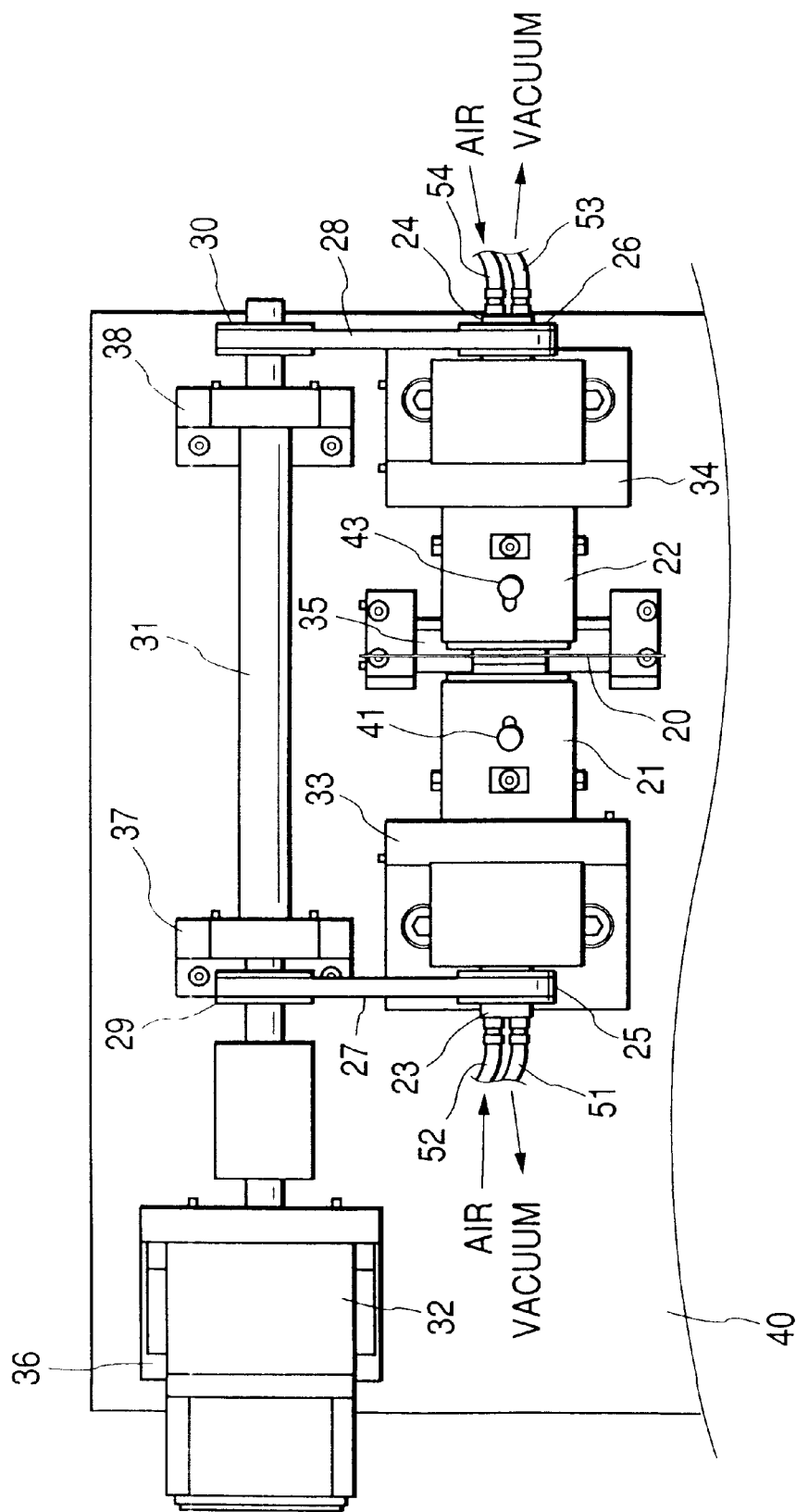
FIG. 14 is a schematic top view showing still another example of the separation apparatus according to the present invention.
Figure 15:
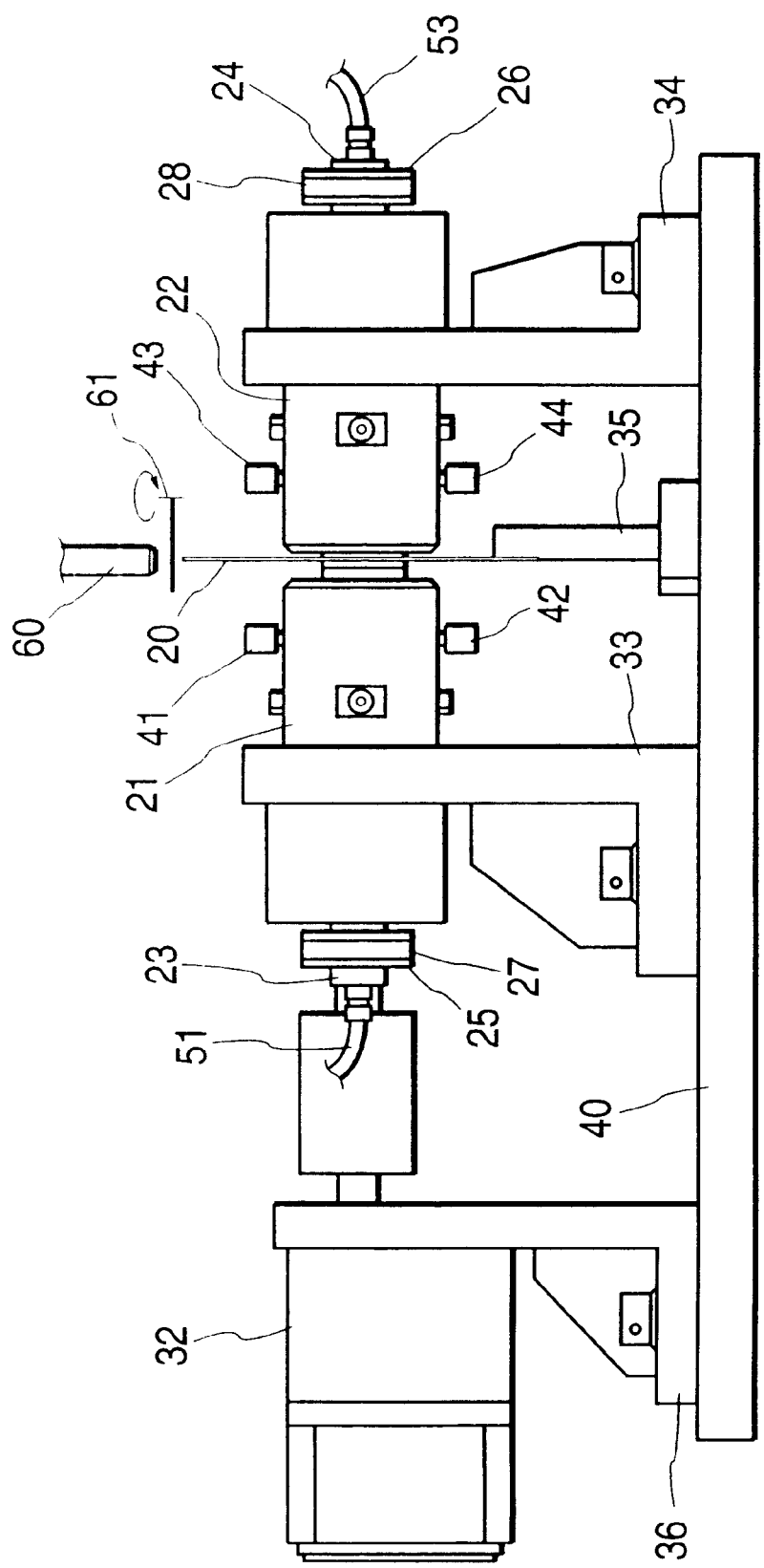
FIG. 15 is a schematic side view of the separation apparatus shown in FIG. 14.

FIGS. 14 and 15 are a schematic top view and a schematic side view showing another example of a separation apparatus used for the present invention, respectively, respectively.

This separation apparatus has a rotation synchronization mechanism and can rotate a first holder for holding a first surface of the bonded substrate and a second holder for holding a second surface of the bonded substrate, at the same angular speed in the same direction.

When a rotational drive force is applied to only one surface of the bonded substrate or synchronization such as that described above is not provided, the following phenomenon is likely to occur.

Figure 16:
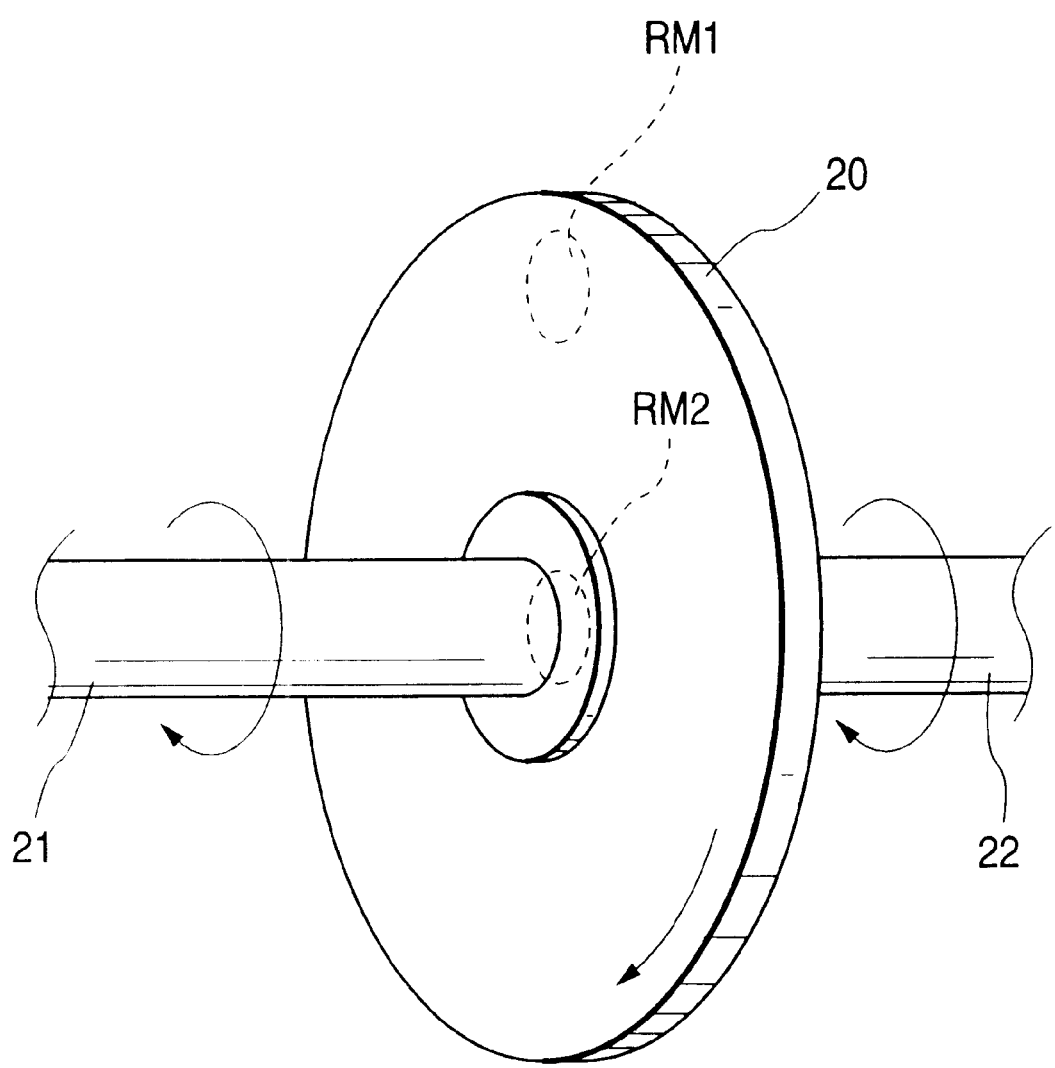
FIG. 16 is a schematic perspective view showing a state of separating a bonded substrate.

Immediately before a bonded substrate is completely separated over the entire surface, there is necessarily a moment at which a minute region, which is finally separated, remains unseparated somewhere in the separation surface. FIG. 16 conceptually shows this state. The following two separation modes are assumed depending on the position of the finally remaining minute region.

A first mode is a case in which the finally remaining region remains almost at the center (RM2) of the separation surface and a second mode is a case in which it remains in an area (RM1) other than the center.

The first mode occurs when separation progresses uniformly from the circumference of the bonded substrate toward its center or when the strength of the vicinity of the center of the separation surface is high. In this case, if a rotational drive force is exerted to only the holder 21 on one side surface of the bonded substrate, this rotation force causes the finally remaining minute region to be twisted off and separated.

The second separation mode occurs when during the initial step of fluid jetting, a crack extends over the radius of the bonded substrate or longer from a certain circumferential portion resulting in overall separation or when the strength of the area other than the vicinity of the center of the separation surface is high. In this case, if a rotational drive force is exerted to only the holder 21 at one side surface of the bonded substrate, this rotation causes shear stress, which separates the finally remaining minute region.

The reason is that because the opposite holder 22 is not provided with independent drive force and is only rotated through the bonded substrate, it will receive a slight force in such a direction as to stop its rotation even when held so softly by a bearing or the like so that separation will occur through the above mentioned mechanisms.

Such torsion or shear may cause complicated forces in directions other than the direction perpendicular to the separation surface, resulting in unwanted separation at a surface other than the separation surface.

Thus, when the bonded substrate is separated while being rotated and if the bonded substrate is rotationally driven without allowing the both sides thereof to synchronize with each other, separation may occur at a surface other than a desired separation surface or the first or the second semiconductor layer may be damaged. These phenomena may significantly reduce the yield.

In FIG. 14, a motor support 36 for supporting a motor 32 that can control the speed and a pair of shaft supports 37 and 38 for rotatably supporting a motor shaft 31 are fixed on a supporting stand 40.

Furthermore, a first holder support 33 for rotatably supporting the holder 21 and a second holder support 34 for rotatably supporting the holder 22 are fixed on the supporting stand 40.

A timing pulley 29 mounted on the motor shaft 31 and a timing pulley 25 mounted at the rear end of a rotating shaft 23 of the holder 21 are connected so as to rotate in the same direction by means of a timing belt 27.

Likewise, a timing pulley 30 mounted on the motor shaft 31 and a timing pulley 26 mounted at the rear end of a rotating shaft 24 of the holder 22 are connected so as to rotate in the same direction by means of a timing belt 28.

The pulleys 25 and 26 have the same driving radius, and the pulleys 29 and 30 have the same driving radius.

The timing belts 27 and 28 are of the same belt.

Thus, a drive force from the motor 32 is transmitted from the shaft 31 to the holders 21 and 22 via the pulleys and belts to rotate the holders 21 and 22 at the same angular speed in the same direction with the same timing.

In FIG. 15, 60 is a jet nozzle that jets a fluid and 61 is a shutter. For clarity, the illustration of the nozzle and shutter are simplified.

The nozzle 60 is fixed on the supporting stand 40 using a fixation jig (not shown), and a bonded substrate positioning member 35 is provided on the supporting stand 40 so as to be aligned with the nozzle 60.

Figure 17:
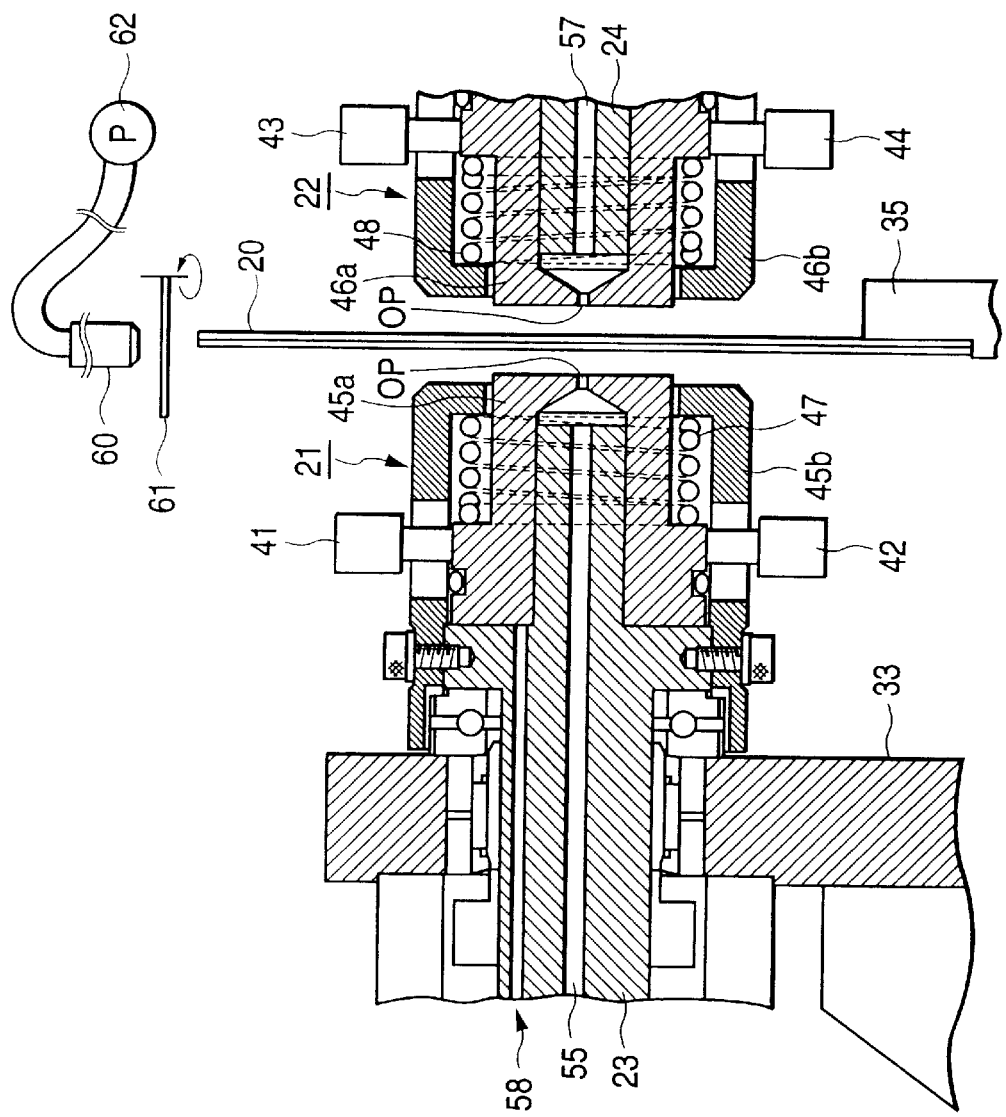
FIG. 17 is a schematic partial sectional view of the separation apparatus shown in FIG. 15, in its stand-by state.

FIG. 17 is a partial sectional view of the holder of the separation apparatus before it holds a bonded substrate 20. The holder 21 or 22 is an assembly of a holding section 45a, 46a that actually sucks and holds the bonded substrate 20; a fixation section 45b, 46b that rotates the holding section 45a, 46a together with the rotating shafts 23, 24; and detents 41, 42, 43 and 44, and the like.

Using pressurizing tubes 52, 54 and a pressurized gas passed through a pressurizing passage 56, the holding section 45a, 46a can move against compression springs (coil springs) 47, 48 in such directions as to leave the rotating shafts 23, 24 (holding section 45a being rightward and holding section 46a being leftward in the figure), respectively.

An opening OP is provided near the center of the holding section 45a and is in communication with a pressure reducing passage 55 in the rotating shaft. Using a vacuum pump (not shown) connected to the opening OP via a pressure reducing tube 51, vacuum is drawn into the opening OP to reduce the atmospheric pressure.

The holder 21, 22 is moved forward (rightward in the figure) by having its holder section 45a that directly sucks the bonded substrate 20, guided by the rotating shaft 23, as shown in FIG. 17, and using the pressure of air introduced from the pressurizing tube 52. The holder 21 or 22 is moved backward (leftward in the figure) by the compression spring 47. The holding section 45a rotates with the rotating shaft 23 using the detents 41, 42. Basically, the holder 22 is specularly symmetrical with the holder 21 and has the same mechanism as it. To allow the bonded substrate 20 and the nozzle 60 to be always set at specified positions when the bonded substrate 20 is positioned and held on the holder 22, pressure is controlled and adjusted so that a stronger force is exerted to the holder 21 than to the holder 22 during the forward operation, while a stronger force is exerted to the holder 22 than to the holder 21 during the backward operation.

Figure 18:
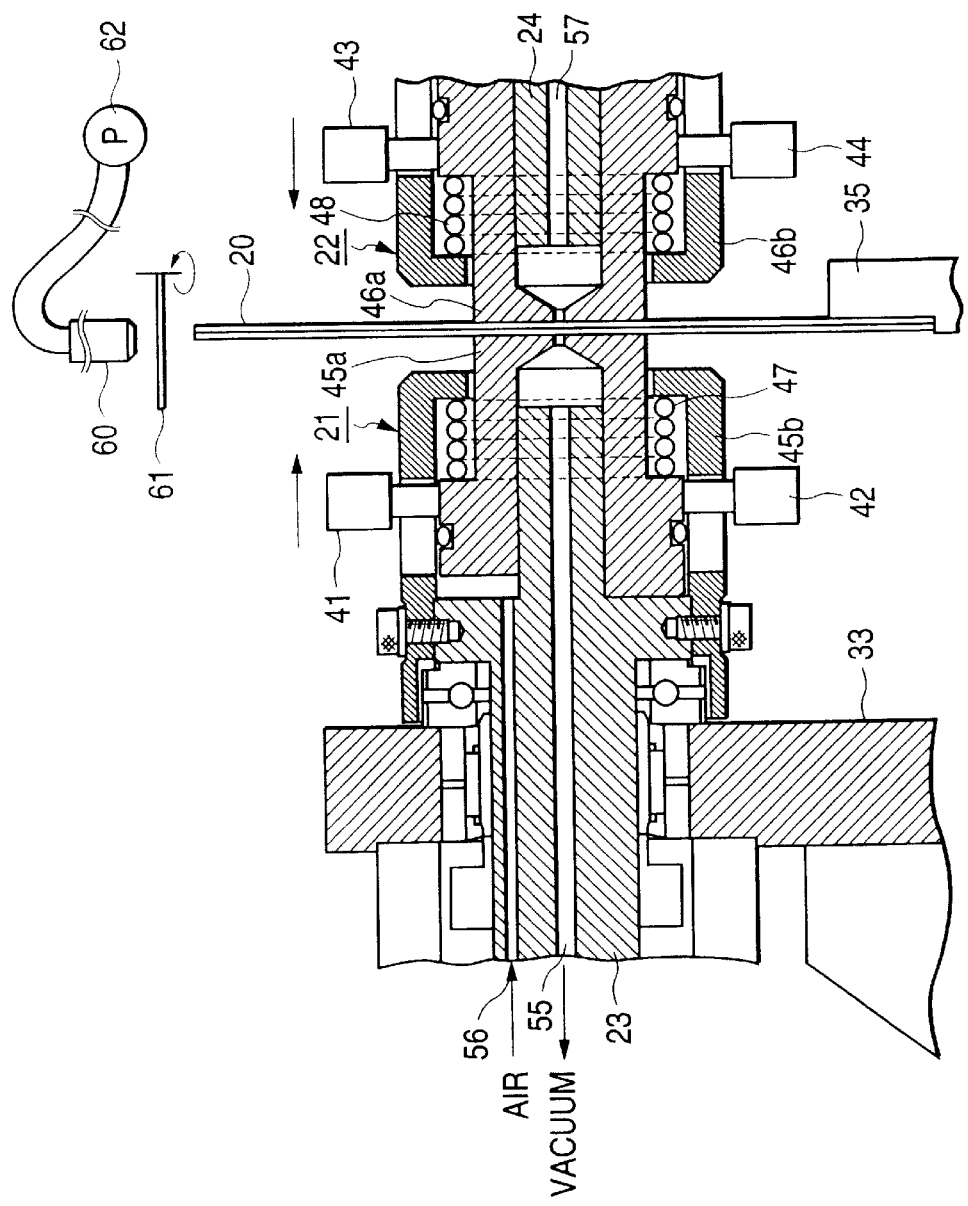
FIG. 18 is a schematic partial sectional view of the separation apparatus shown in FIG. 15, in its substrate holding state.

The manner of using this apparatus, that is, the method of separating a bonded substrate according to the present invention is described below. First, as shown in FIG. 17, the bonded substrate 20 is set so as to fit it on a notch in a positioning stand (positioning member) 35. Next, as shown in FIG. 18, pressurized air is introduced to cause the holding section 45a to advance, thereby allowing the holder 21 to suck and hold the bonded substrate 20. The holder 21 can fit the bonded substrate 20 on the notch of the positioning stand 35 to hold the center of the bonded substrate 20. When the bonded substrate 20 is held in an accurate position, the nozzle 60 is located perpendicularly above the top of the bonded substrate 20 and the distance between the bonded substrate 20 and the nozzle 60 is 10 to 30 mm. Next, the holding section 46a of the holder 22 is moved forward (leftward in the figure) to suck and hold the bonded substrate 20, and the introduction of pressurizing air of the holding section 46a is stopped. The bonded substrate 20 is stopped due to a force acting rightward in the figure which is an combination of a force exerted by the compression springs 47, 48 and a vacuum suction force. At this time, since the force exerted by the compression springs 47, 48 does not exceed the force required by the holding section 46a, 46b to suck the bonded substrate 20, there is no case where the vacuum destruction of the inside of the pressure reducing passage 55, 57 occurs, which in turn eliminates the suction force to cause the bonded substrate 20 to fall.

Figure 19:
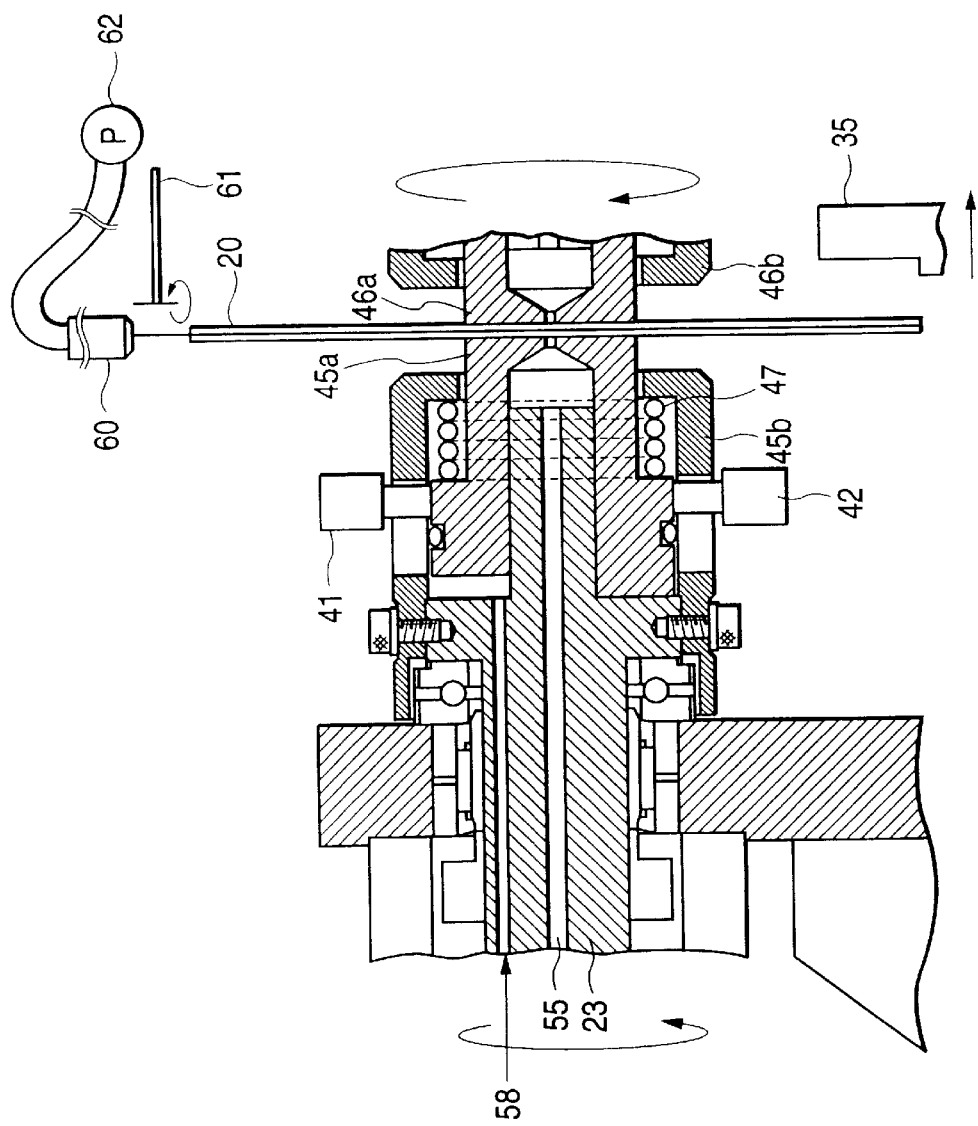
FIG. 19 is a schematic partial sectional view of the separation apparatus shown in FIG. 15, in its separation action starting state.

Then, as shown in FIG. 19, a fluid not containing abrasive particles is fed from a pump 62 to a nozzle 60 and continues to be jetted through the nozzle 60 for a given period of time until the jetted fluid is stabilized. Once the flow of the fluid has been stabilized, the shutter 61 is opened to jet the high-pressure fluid from the nozzle 60 against the thickness-wise center of the bonded substrate 20. At this time, the speed controller motor 32 is rotated to rotate the holders 21, 22 in synchronism thus rotating the bonded substrate 20. By jetting the high-pressure fluid against the thickness-wise center of the bonded substrate 20, the high-pressure fluid also enters the separation layer to extend the bonded substrate 20 into two members, thereby finally separating it into the two members.

Figure 20:
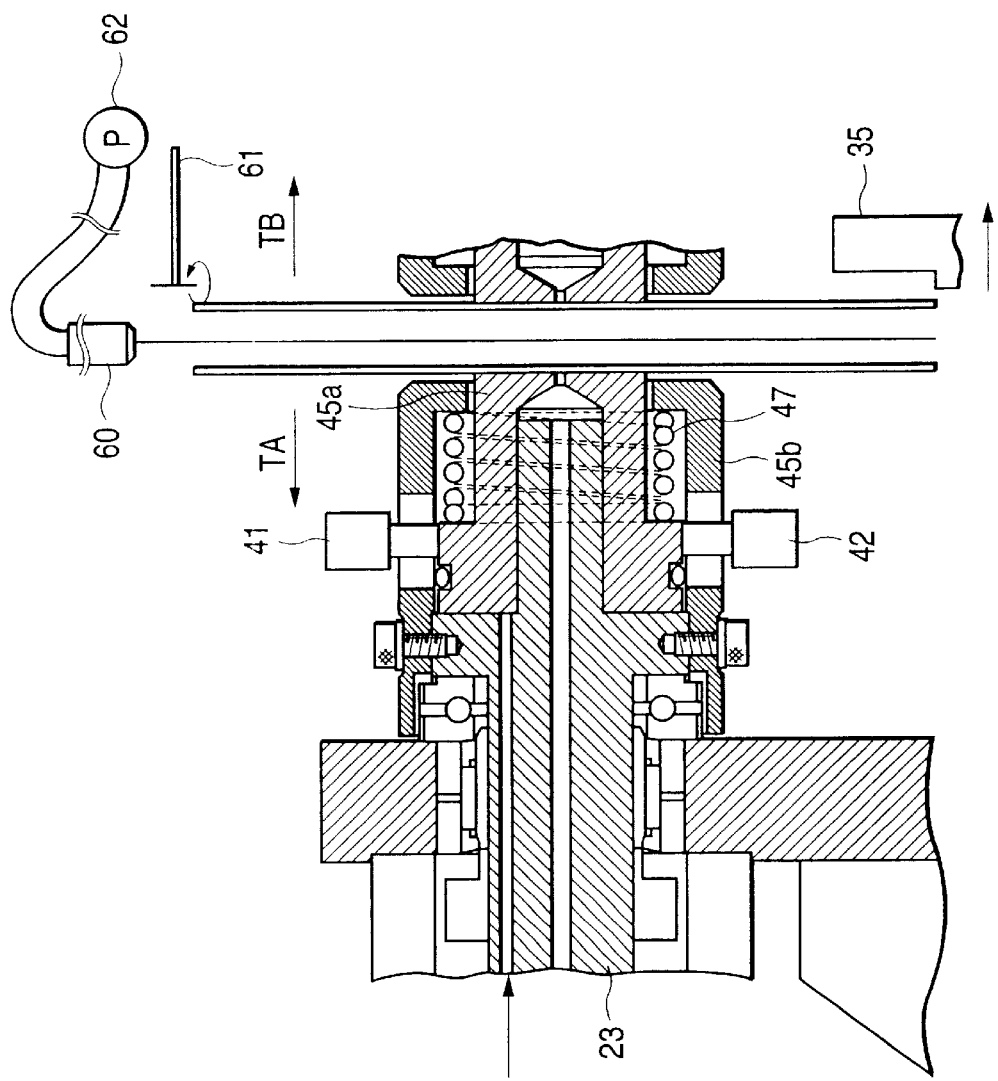
FIG. 20 is a schematic partial sectional view of the separation apparatus shown in FIG. 15, in its separation action ending state.

At this time, since the high-pressure fluid is applied uniformly against the bonded substrate 20, and since the holders 21, 22 each exert a force in such a direction as to draw the bonded substrate 20, as described above, separated pieces of the bonded substrate 20 further leave each other and are prevented from sliding [FIG. 20].

In addition, in the substrate supporting means shown in FIGS. 17 to 20, the bonded substrate 20 is supported while receiving a force by the holders 21, 22 in a direction in which the holders move backward from the bonded substrate 20, but the holders 21, 22 may exert a force in a forward direction and this pressure may be used to hold the bonded substrate. In this case, the high-pressure fluid also advances while extending the bonded substrate 20 to create a small gap, thereby finally separating the bonded substrate 20 into two members. According to this method, when the holders 21 and 22 do not synchronize mutually, the bonding surfaces of the separated pieces damage each other due to sliding, whereas when the holders rotate in synchronism, no damage occurs. Furthermore, when a force is exerted in such a direction as to move the holders 21 and 22 backward, the bonded substrate 20 is pulled to move backward during separation by the holders 21 and 22 and there may occur a difference in the displacement between a separated portion and an unseparated portion to unbalance the bonded substrate 20, thereby causing a crack when the high-pressure fluid is jetted. However, when a force is exerted to the holders 21 and 22 in such a direction as to move them forward, the bonded substrate 20 will maintain balance to enable itself to be separated stably.

Incidentally, a high- or atmospheric-pressure fluid can be jetted against an entirely separated bonded substrate to exert a force in such a direction as to move it backward thus breaking the surface tension of intervening water, thereby separating it into two completely.

As described above, the separation apparatus according to the present invention sequentially or simultaneously separates one or more bonded substrates using a fluid. The bonded substrates may be juxtaposed in a direction normal to the surface or in a direction parallel to the surface.

Furthermore, the bonded substrate may be rotated or moved parallel to the substrate surface to receive the fluid, or the flow of the fluid may be moved parallel to the surface so as to hit against the side surface of the bonded substrate, or both the bonded substrate and the fluid may be moved.

Embodiment 11

Figure 37:
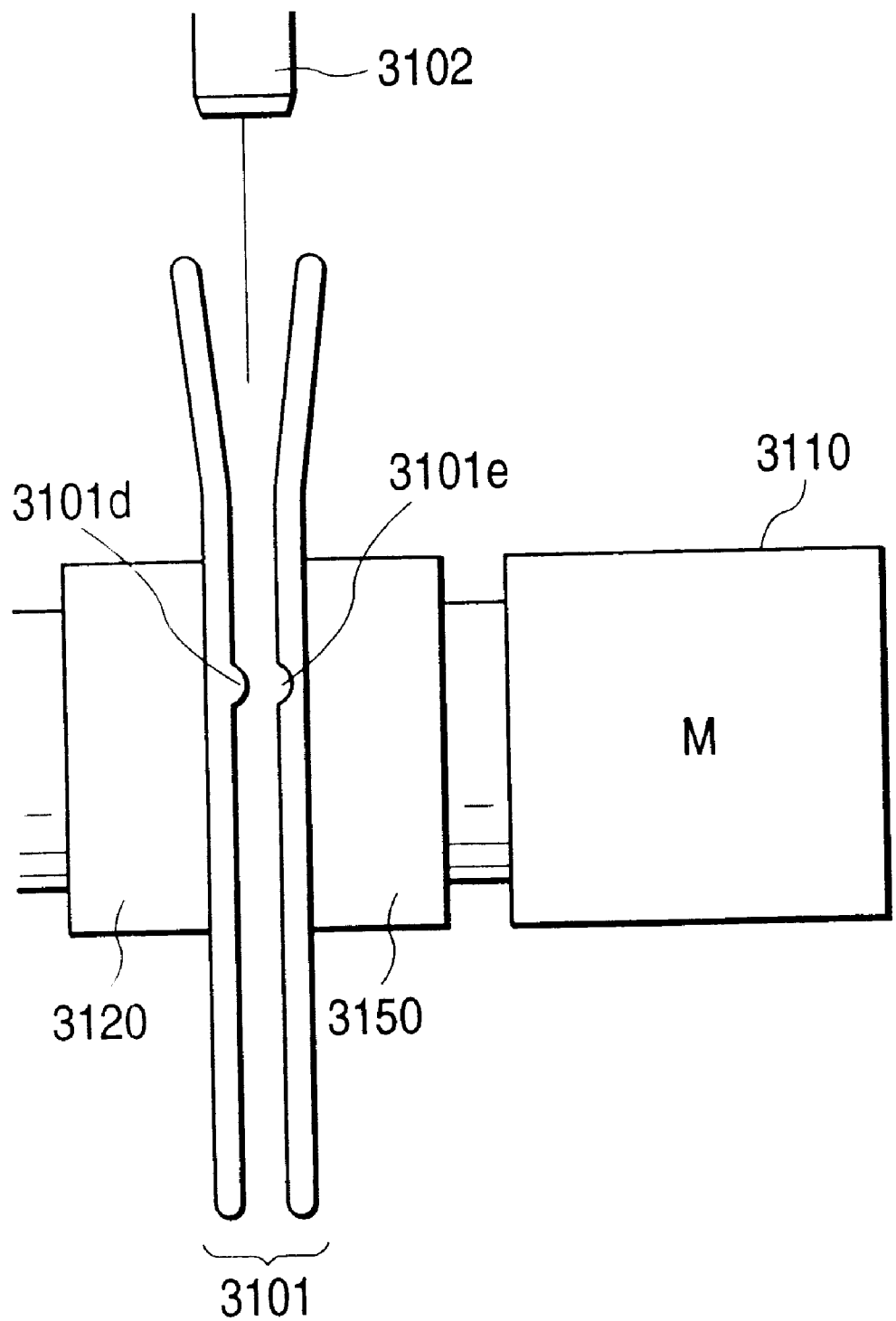
FIG. 37 is a schematic side view showing still another example of the separation apparatus according to the present invention.

Embodiment 11 will be described with reference to FIGS. 37 to 40. FIG. 37 is a schematic side view of another example of the separation apparatus according to the present invention. In the figure, 3101 is a bonded substrate, 3101d and 3101e are defects that may occur during the separation process, 3120 and 3150 are substrate holding portions, 3102 is a nozzle, and 3110 is a motor.

According to this embodiment, in a first step, the nozzle 3102 is located on the center of the bonded substrate 3101, and while rotating the bonded substrate 3101 (for example, at 8 rpm) by using the motor 3110, the periphery of the bonded substrate 3101 is separated to leave the center as a non-separated region. In this case, the separation processing is executed during the rotation of the bonded substrate 3101 in order to make uniform the shape and position of the non-separated region left after the first step for a large number of bonded substrates. Thus, each bonded substrate 3101 can be processed under almost the same conditions during a second step.

Figure 38:
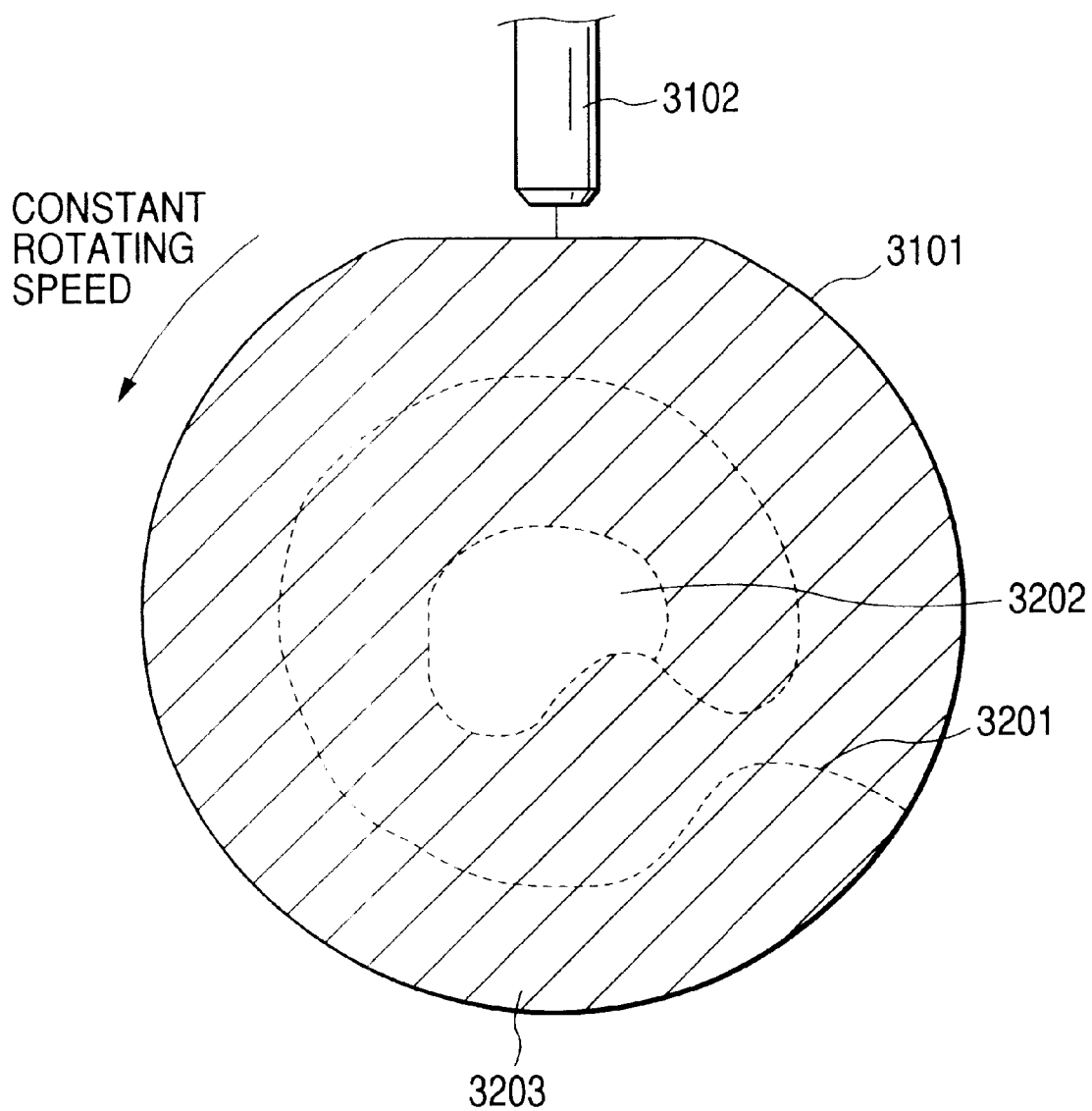
FIG. 38 is a schematic sectional view showing an example of the state of partially separating a bonded substrate.

FIG. 38 is a schematic sectional view showing how the bonded substrate 3101 is partly separated in the first step of this embodiment. In this figure, 3201 denotes a locus of the boundary between the separated region and the non-separated region during the first step. The outside of the boundary locus 3201 corresponds to a region that has already been separated, whereas the inside of the boundary locus 3201 corresponds to a region that has not been separated. In the first step of this embodiment, the separation processing is executed during the rotation of the bonded substrate 3101, so the boundary locus 3201 is spiral. A region 3202 that is not shaded is a non-separated region left after the execution of the first step. The region 3202 is approximately shaped like a circle and is located approximately at the center of the bonded substrate 3101. In addition, a shaded region 3203 (separated region) has been separated by executing the first step. The non-separated region 3202 is preferably smaller than the separated region 3203.

Thus, by executing the first step while rotating the bonded substrate 3101, a target region, for example, the center of the bonded substrate 3101 can be left as the non-separated region 3202, thereby enabling the second step to be executed at the same conditions for each bonded substrate 3101.

Then, in the second step, the rotation speed of the bonded substrate 3101 is reduced to substantially stop the rotation (for example, down to 2 rpm or less) or the rotation of the bonded substrate 3101 is completely stopped, before the non-separated region 3202 is separated. This operation enables a force to act on the non-separated region 3202 in a predetermined direction. Most preferably, the rotation of the bonded substrate 3101 is completely stopped.

Figure 39:
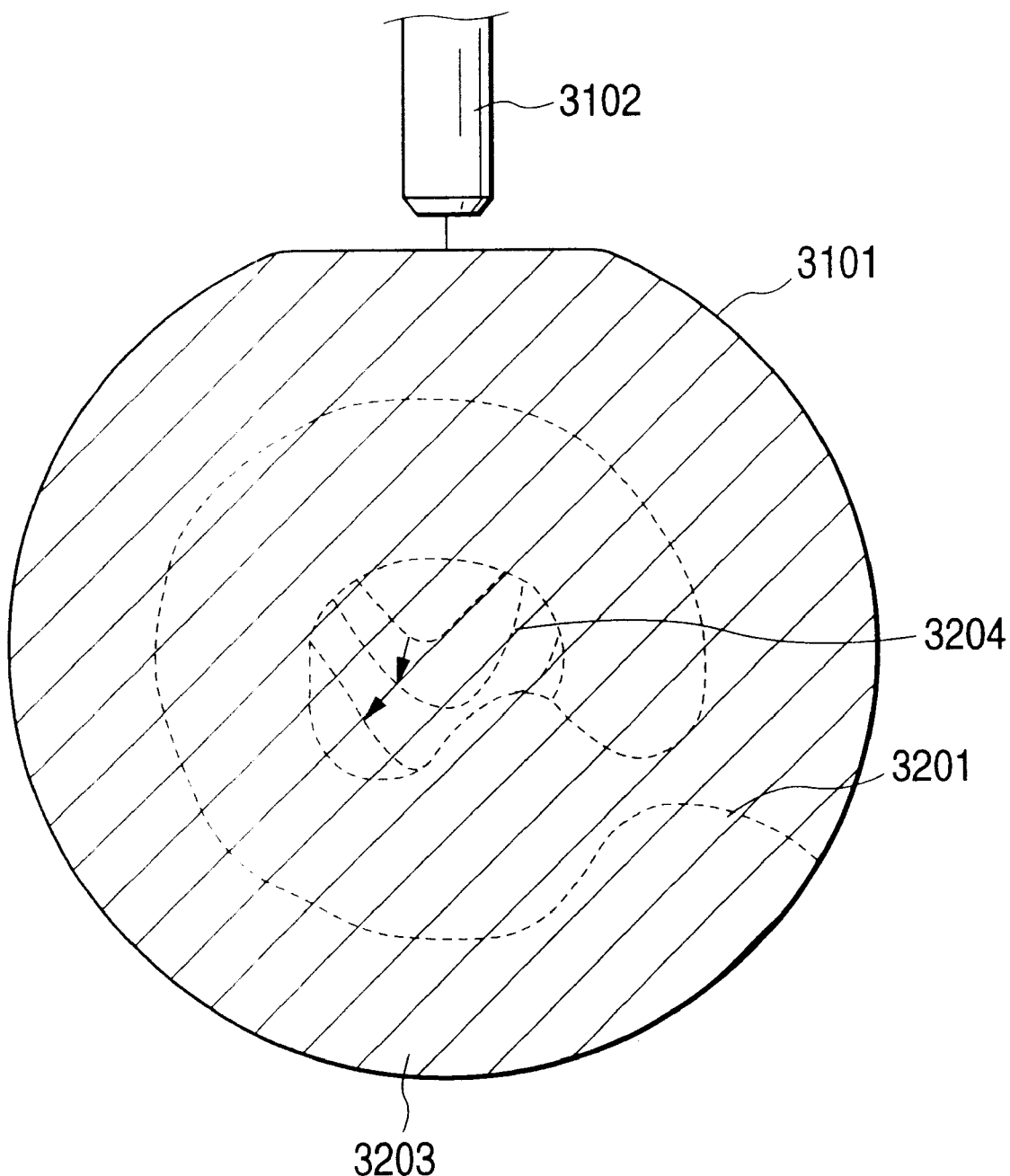
FIG. 39 is a schematic sectional view showing an example of the state of completely separating a bonded substrate.

FIG. 39 is a schematic sectional view showing how the bonded substrate 3101 is completely separated in the second step of this embodiment. In this figure, 3204 is a boundary between the separated region and the non-separated region during the execution of the second step. The boundary 3204 moves as shown by the arrows.

Thus, while the rotation of the bonded substrate 3101 is substantially stopped, a jet is applied to a gap of the bonded substrate 3101 to allow a force to act on the non-separated region 3202 in a predetermined direction. This configuration allows a strong separation force to act on a part of the periphery of the non-separated region 3202 and a weak separation force to act on the remaining part, while gradually enlarging the separated region, thereby preventing a defect from occurring in each separated substrate.

FIG. 40 is a flowchart schematically showing a procedure for controlling a separation apparatus according to this embodiment. The processing shown in this flowchart is controlled by a controller. In addition, the processing shown in this flowchart is executed after the bonded substrate 3101 has been set in the separation apparatus, that is, after it has been held by the substrate holding portions 3120 and 3150.

Steps S101 to S104 correspond to a first step. First, the controller controls the motor 3110 to rotate the bonded substrate 3101 at a given rotating speed (S101). For example, this rotating speed is preferably about 4 to 12 rpm and more preferably about 6 to 10 rpm. According to this embodiment, the rotating speed is set at 8 rpm.

Then, the controller controls a pump to jet through the nozzle 3102 at a given pressure (for example, 49 MPa (500 kgf/cm$^2$)) (S102). Then, the controller controls a nozzle drive portion to move the nozzle 3102 from a stand-by position (at which the jet does not collide against the bonded substrate 3101) onto a separation layer above the central axis of the bonded substrate 3101 (S103). This operation starts partial separation of the bonded substrate 3101. Subsequently, the controller waits for completion of separation of the bonded substrate except for its region to be left as the non-separated region 3202 (for example, after the lapse of a predetermined time), and then controls the nozzle drive portion to move the nozzle 3102 to the stand-by position (S104). Then, the first step is completed.

Steps S105 to S107 correspond to a second step. First, the controller controls the motor 3110 to substantially stop the rotation of the bonded substrate 3101 (S105). Then, the controller controls the nozzle drive portion to move the nozzle 3102 from the stand-by position onto the separation layer above the central axis of the bonded substrate 3101 (S106). This operation starts separation of the non-separated region 3202 of the bonded substrate 3101. Subsequently, the controller waits for complete separation of the bonded substrate 3101 (for example, after the lapse of a predetermined time), and then controls the nozzle drive portion to move the nozzle 3102 to the stand-by position and controls the pump to stop jetting (S107). Then, the second step is completed.

According to Embodiment 11, the bonded substrate can reliably be separated without causing a defect.

In the second step of Embodiment 11, effecting the separation with the substrate rotation being completely stopped or effecting the separation while applying ultrasonic waves thereto is also effective in eliminating a defect.

EXAMPLES

The method of producing a photoelectric conversion device according to the present invention will be described by referring to examples.

Example 1

In Example 1, a solar cell as a photoelectric conversion device is produced according to the present invention. FIGS. 21A to 23D are schematic views representing the process for producing a solar cell according to Example 1. FIG. 23D is a plan view and the other figures are sectional views.

Figure 21A:
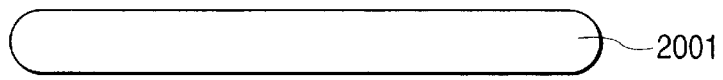
FIGS. 21A, 21B, 21C, 21D, and 21E are schematic sectional views illustrating the production steps of a solar cell of Example 1.

First, an Si wafer 2001 is provided as a semiconductor substrate, as shown in FIG. 21A. The Si wafer 2001 normally has a beveling with which the wafer thickness decreases toward the end of the wafer, which effectively functions in subsequently separating the substrate by using a water jet.

Figure 21B:
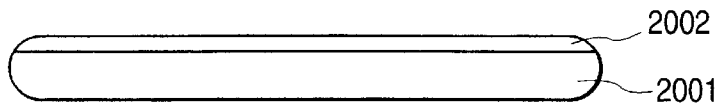

Next, as shown in FIG. 21B, a surface portion of the Si wafer 2001 is made a porous layer 2002 as a separation layer. Thus, the portion of the Si wafer 2001 except for the porous layer 2002 becomes a first semiconductor layer.

Figure 24A:
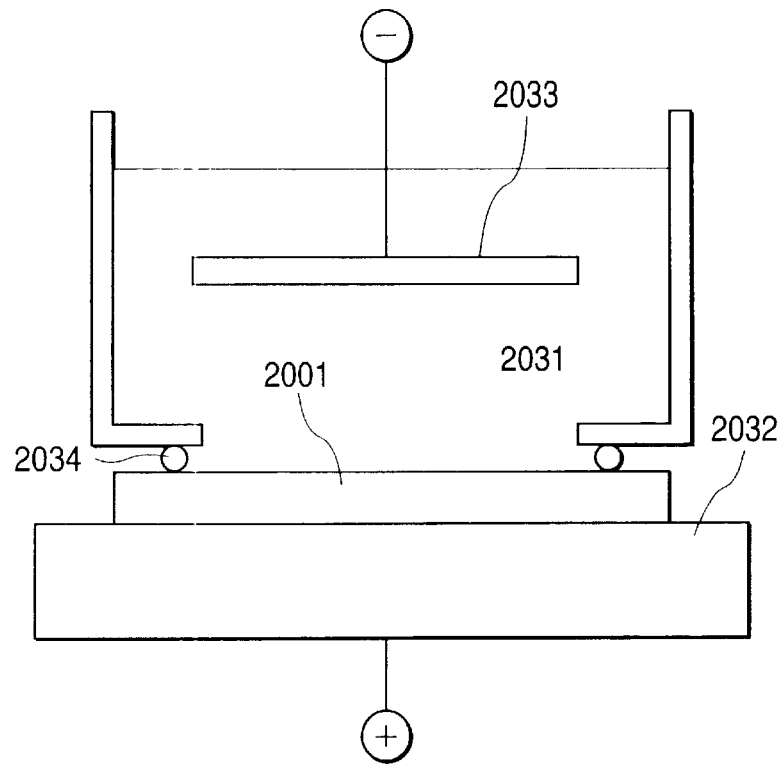
FIGS. 24A and 24B are schematic sectional views illustrating the anodization apparatus used in Example 1.
Figure 24B:
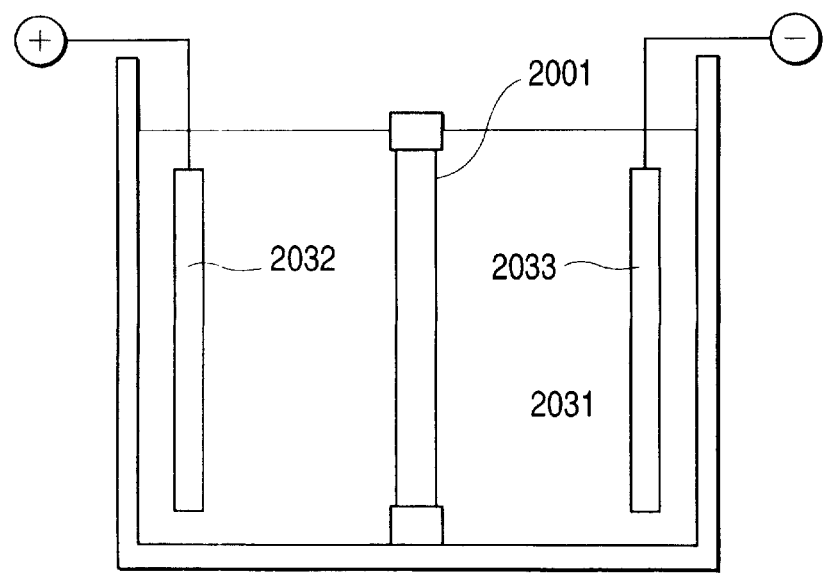

The porous layer 2002 can be formed by anodizing the Si wafer 2001. FIGS. 24A and 24B are schematic sectional views of a system for anodizing the Si wafer 2001 by using a hydrofluoric acid based etching liquid. In the figures, 2031 is a hydrofluoric acid based etching liquid, 2032 and 2033 are metal electrodes, and 2034 is an O ring. The Si wafer 2001 to be anodized is desirably of p-type but may be of n-type if it has a low resistivity. In addition, a normal n-type wafer can be made porous by irradiating the wafer with light to form holes therein.

As shown in FIG. 24A, by installing the Si wafer so that a voltage is applied across the electrodes to make a lower metal electrode 2032 positive while making an upper metal electrode 2033 negative thereby allowing an electric field caused by this voltage to be applied in a direction perpendicular to the surface of the Si wafer 2001, the top surface of the Si wafer 2001 is made porous. In FIG. 24B, the right surface in the figure of the Si wafer 2001 is made porous. As the hydrofluoric acid based etching liquid 2031, concentrated hydrofluoric acid (49% HF) is used. Since bubbles are generated from the Si wafer 2001 during the anodization, alcohol may be added as a surfactant to efficiently remove these bubbles. The alcohol is desirably methanol, ethanol, propanol, isopropanol, or the like. Alternatively, by using a stirrer instead of a surfactant, the liquid may be stirred during anodization. The thickness of the porous layer is preferably between 1 and 30 μm.

The metal electrodes 2032 and 2033 are desirably formed of a material that is unlikely to be corroded by a hydrofluoric acid solution, for example, gold (Au) or platinum (Pt). The maximum current density for anodization is 100 mA/CM$^2$, and the minimum value may be any value except zero. During anodization, the current density is adjusted with the lapse of time. If the current density is high during anodization, the density of the porous Si layer will be low. That is, the higher the current density, the larger the volume of the pores, so that the porosity (defined by the ratio of the volume of the pores to a unit volume) is increased. The porous Si layer, although having many pores inside of the Si layer, maintains its monocrystallinity. Thus, a monocrystalline Si layer can be epitaxially grown on the porous Si layer.

However, in order to form an epitaxial Si layer without an abnormal growth or a stacking fault, the porous layer 2002 in contact with the epitaxial Si layer preferably has a low porosity. On the other hand, in order to separate the bonded substrate using a water jet, the porous layer 2002 preferably has a high porosity. That is, it is very preferred that the porous layer 2002 has a low porosity on its surface side and a high porosity inside thereof. Thus, in this example, a porous Si sub-layer of a low porosity is formed on the surface side of the porous layer 2002, whereas a porous Si sub-layer of a high porosity is formed inside the Si wafer 2001 of the porous layer 2002. To form this structure, it is preferable to carry out two-step anodization in which anodization is effected first at a low current density and then at a high current density. Consequently, separation can easily be performed in the lower part of the porous layer 2002 (i.e., at the inside portion of the Si wafer 2001), and an epitaxial Si layer without abnormal growth or stacking fault can be formed.

Figure 21C:
Figure 21D:
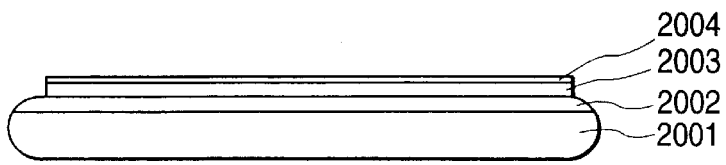

FIG. 21C represents a step for forming a $p^-$ type Si layer 2003 on the porous layer 2002. FIG. 21D represents a step for forming an $n^+$type Si layer 2004 on the $p^-$ type Si layer 2003. The $p^-$-type Si layer 2003 and $n^+$-type Si layer 2004 are epitaxial layers that maintains the monocrystallinity of the underlying substrate and constitute a second semiconductor layer.

The $p^-$ type Si layer 2003 and the $n^+$-type Si layer 2004 are formed desirably by the liquid phase growth method, the molecular beam epitaxial growth method, the plasma CVD method, the low pressure CVD method, the photo CVD method, the bias sputtering method, or the like.

A system for growing the $p^-$-type Si layer 2003 and the $n^+$-type Si layer 2004 in a liquid phase is explained with reference to FIGS. 25 and 26. FIG. 25 is a schematic sectional view of a liquid phase growth system of a mass-production dipping type for growing the epitaxial Si layers 2003 and 2004 by means of the liquid phase growth method. In the figure, 2501 is a substrate cassette that supports a plurality of growth substrates, 2502 is a hydrogen anneal chamber, 2503 and 2504 are $p^-$-type Si layer growth chambers, 2505 is an $n^+$-type Si layer growth chamber, 2506, 2507, and 2508 are melts, 2509, 2510, 2511, and 2512 are electric furnaces, and 2513 is a transfer chamber through which the substrate cassette is transferred. To effect epitaxial growth on the porous layer 2002, it is preferred that the surface of the porous layer 2002 is annealed in a hydrogen atmosphere to be flattened. Thus, in the hydrogen anneal chamber 2502, the substrate cassette 2501 introduced to the liquid phase growth system is first annealed in a hydrogen atmosphere at, for example, about 1040° C.

Subsequently, the substrate cassette 2501 is introduced through the transfer chamber 2513 into the $p^-$type Si layer growth chamber 2503, where the $p^-$-type Si layer 2003 is epitaxially grown on the porous layer 2002 in a liquid phase. The plurality of the $p^-$-type Si layer growth chambers 2503 and 2504 is required in order to grow the $p^-$-type Si layer more thickly than the $n^+$-type Si layer, and it is assumed in this example that the system has six $p^-$-type Si layer growth chambers (some of them are omitted in the figures), one $n^+$-type layer growth chamber, and one hydrogen anneal chamber. The $p^-$-type Si layer 2003 desirably has a thickness of 10 to 50 $\mu$m and more desirably 20 to 40 $\mu$m in order to effectively use the power generation light and the starting materials.

To grow the $p^-$-type Si layer 2003, the melt 2506 consisting of In or Sn is heated up to about 960° C. by using the electric furnace 2510, and a $p^-$-type Si substrate for melting is immersed in the melt 2506, where the $p^-$-type Si is melted into the melt 2506 until the melt is almost saturated. Then, the melting $p^-$-type Si substrate is lifted up. Subsequently, the temperature of the melt 2506 is lowered to about 950° C. so that the melt 2506 is supersaturated with $p^-$-type Si. Then, the substrate cassette 2501 is immersed in the melt 2506, and the temperature of the electric furnace 2510 is adjusted to gradually reduce the temperature of the melt 2506 thus growing the epitaxial $p^-$-type Si layer 2003 on the porous layer 2002. Since the growth time is long as for example, about 30 minutes, the plurality of $p^-$-type Si layer growth chambers are used to simultaneously grow $p^-$-type Si layers in the plurality of substrate cassettes, thereby improving the production efficiency.

Subsequently, the substrate cassette 2501 is introduced through the transfer chamber 2513 into the $n^+$-type Si layer growth chamber 2505, where the $n^+$-type Si layer 2004 is epitaxially grown on the $p^-$-type Si layer 2003 in a liquid phase. To grow the $n^+$-type Si layer 2004, the melt 2508 consisting of In or Sn is heated up to about 960° C. using the electric furnace 2512, and a melting $n^+$-type Si substrate is immersed in the melt 2508, where $n^+$-type Si is melted into the melt 2508 until the melt is almost saturated. Then, the melting $n^+$-type Si substrate is lifted up. Alternatively, an n-type impurity such as P (phosphorous) or As (arsenic) may be melted into the melt together with a low-concentration n-type substrate. Subsequently, the temperature of the melt 2508 is lowered to about 950° C. so that the melt 2508 is supersaturated with $n^+$-type Si. The substrate cassette 2501 is immersed in the melt 2508, and the temperature of the electric furnace 2512 is adjusted to gradually reduce the temperature of the melt 2508 to grow the epitaxial $n^+$-type Si layer 2004 on the $p^-$-type Si layer 2003. The growth time is, for example, about 30 seconds.

Figure 26:
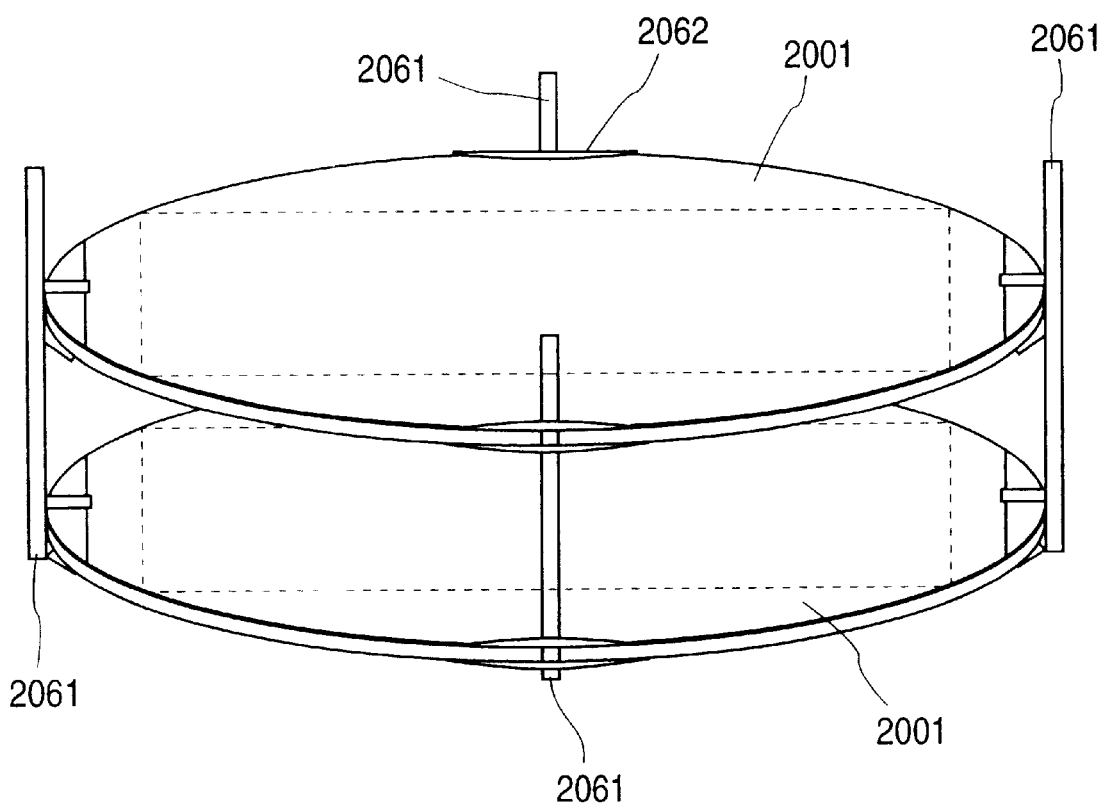
FIG. 26 is a partial perspective view illustrating the substrate cassette of the liquid phase growth apparatus used in Example 1.

FIG. 26 is a partial perspective view of the substrate cassette 2501. Four struts 2061 are provided to support the plurality of Si wafers 2001 at four positions. The strut 2061 is structured to support only the end of the Si wafer 2001. In a subsequent step in the production of a solar cell, the epitaxial Si layers 2003 and 2004, which are used as power generation layers, are cut into squares utilizing their cleavage property, as shown by the dashed line in the figure. Accordingly, it is preferred that the struts 2061 support the Si wafers 2001 only at the cutting portions including the orientation flats 2062, and that the supported portions are not subjected to epitaxial growth. Thus, there are formed in the substrate a part at which epitaxial growth is effected and another part at which epitaxial growth is not effected, as shown in FIGS. 21C and 21D. In the dipping-type liquid-phase growth system such as shown in FIG. 25, the struts 2061 are immersed in the melt at nearly 1,000° C., so they are desirably produced using a heat-resistant material such as quartz. The substrate cassette 2501 of this structure can be used not only for liquid phase growth systems but also for gas phase growth systems such as CVD systems.

Figure 21E:
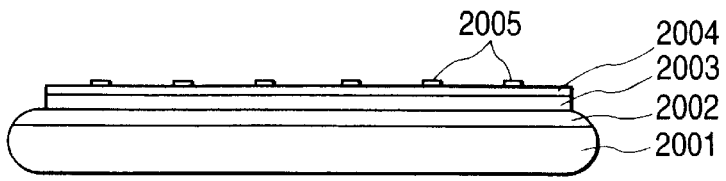

Subsequently, grid electrodes 2005 are formed on a surface of the $n^+$-type Si layer 2004, as shown in FIG. 21E. The grid electrodes 2005 are formed desirably by means of printing or sputtering using a material such as Al.

Figure 22A:
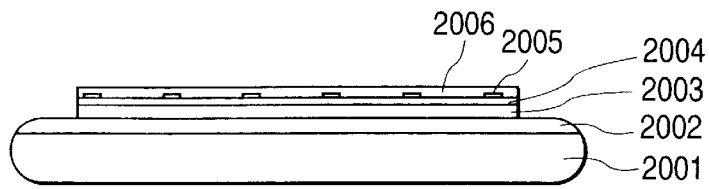
FIGS. 22A, 22B, 22C, 22D, and 22E are schematic sectional views illustrating the production steps of a solar cell of Example 1.

Next, as shown in FIG. 22A, an anti-reflective film 2006 consisting of $TiO_2$ or ITO (Indium Tin Oxide) is provided by means of a sputtering method, coating, or burning.

Figure 22B:
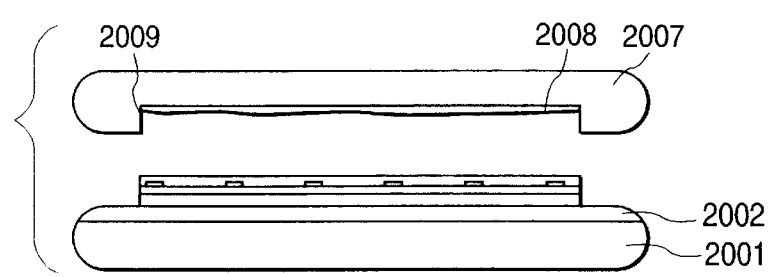

Subsequently, as a support substrate, a glass substrate 2007 is provided that has a recess 2009 that fits the size of the $p^-$-type Si layer 2003 and $n^+$-type Si layer 2004 appropriately, as shown in FIG. 22B. It is preferred that the thickness of the glass substrate 2007 decreases toward the end portion thereof.

Figure 22C:
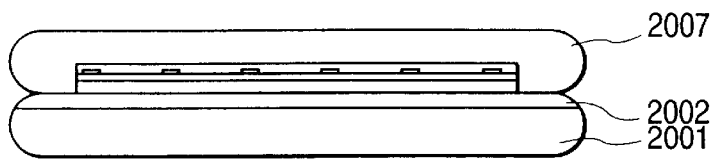

Then, as shown in FIG. 22C, the porous layer 2002 is brought into direct contact with the glass substrate 2007 except for the recess 2009, and the glass substrate 2007 and the porous layer 2002 are bonded together by heat treatment at about 400° C. In this case, bonding can be made firmly by subjecting the porous layer 2002 and the glass substrate 2007 to $N_2$ plasma processing. Furthermore, a transparent heat-resistant adhesive 2008 may be filled in the recess 2009 to strengthen the adhesion between the glass substrate and the anti-reflective film 2006.

Figure 22D:
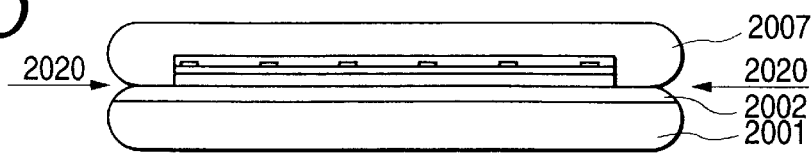
Figure 22E:
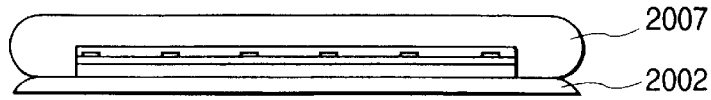

Next, the above described method is used to apply a water jet 2020 against a side surface of the wafer as shown in FIG. 22D, and separation then occurs at the interface between the porous layer 2002 and the Si wafer 2001 and/or inside of the porous layer 2002, thereby separating the epitaxial layers 2004, 2003 as the second semiconductor layer and the Si wafer 2001 as the first semiconductor layer, as shown in FIG. 22E. In this case, the Si wafer 2001 has a beveling with which the end portion of the wafer is thinner than its center. Thus, the water jet 2020 first strikes against the beveled portion to exert a force in such a direction as to peel the bonded substrate off. Consequently, separation occurs at the portion of the porous layer 2002, which is mechanically weak. The Si wafer 2001 separated in the step shown in FIG. 22D is subjected to removal of a residue of the porous layer on the surface thereof and is used again as the Si wafer 2001 in FIG. 21A.

Figure 23A:
FIGS. 23A, 23B, 23C and 23D are schematic sectional views
Figure 23B:
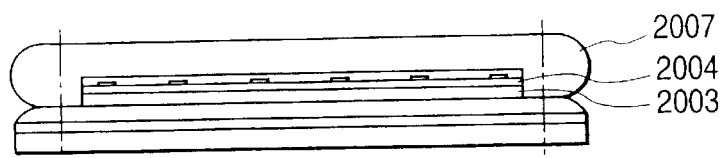
Figure 23C:
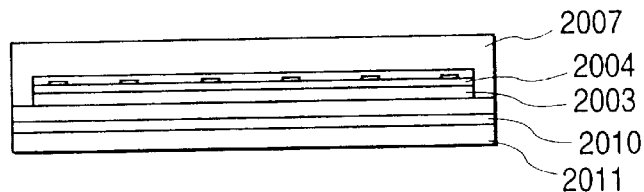
Figure 23D:
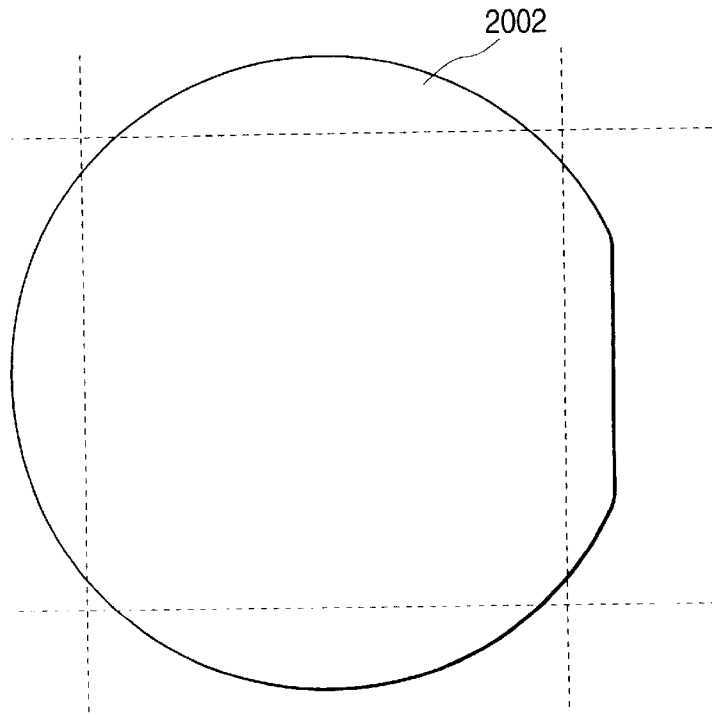

Next, a substrate is provided that has a conductive film 2010 such as an Al sheet bonded to an insulating support 2011 as shown in FIG. 23A, and the conductive film 2010 and the porous layer 2002 are bonded together using a conductive paste or the like as shown in FIG. 23B. The portions of the wafer having no epitaxial layer 2003 or 2004 is cut off along the dash and dot line shown in the sectional view in FIG. 23B and the dashed line shown in the top view in FIG. 23D, thus obtaining a generally rectangular solar cell unit as shown in FIG. 23C.

Example 2

Figure 27A:
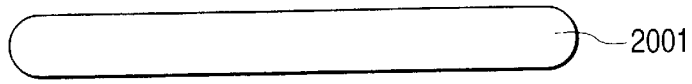
FIGS. 27A, 27B, 27C, 27D, 27E, and 27F are schematic sectional views illustrating the production steps of a solar cell of Example 2.
Figure 27B:
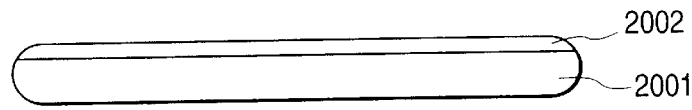
Figure 27C:
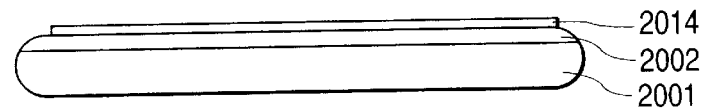
Figure 27D:
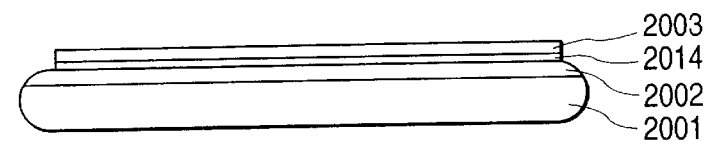
Figure 27E:
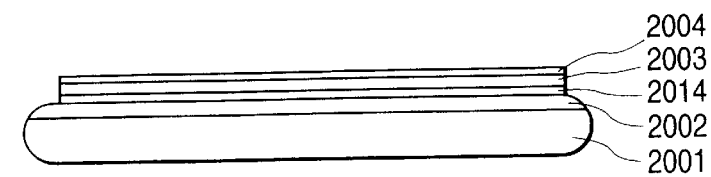

Example 2 is explained with reference to the sectional views shown as FIGS. 27A to 28F. First, the Si wafer 2001 is provided as a semiconductor substrate, as shown in FIG. 27A. Next, the wafer is anodized in the same manner as in Example 1 to convert a surface portion of the Si wafer 2001 to the porous layer 2002 as a separation layer, as shown in FIG. 27B. Thus, the portion of the Si wafer 2001 except for the porous layer 2002 becomes a first semiconductor layer. The liquid phase growth method described in Embodiment 1 is used to epitaxially grow a $p^+$-type Si layer 2014, for example, 2 μm thick on the porous layer 2002 as shown in FIG. 27C, then a $p^-$-type Si layer 2003, for example, 30 μm thick thereon as shown in FIG. 27D, and then an $n^+$-type Si layer 2004, for example, 1 μm thick thereon as shown in FIG. 27E to form a second semiconductor layer.

Figure 27F:
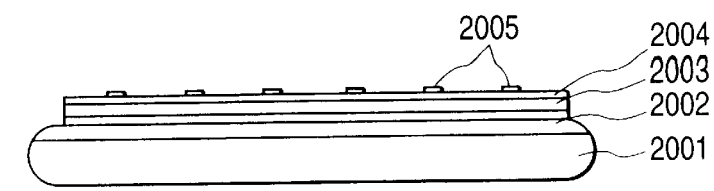
Figure 28A:
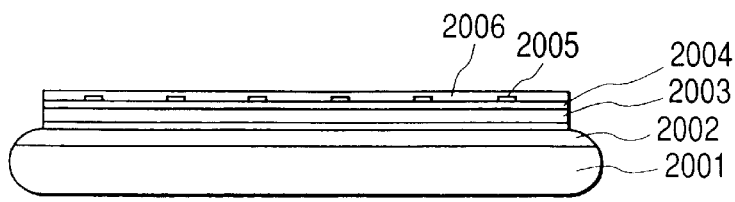
FIGS. 28A, 28B, 28C, 28D, 28E, and 28F are schematic sectional views illustrating the production steps of a solar cell of Example 2.
Figure 28B:
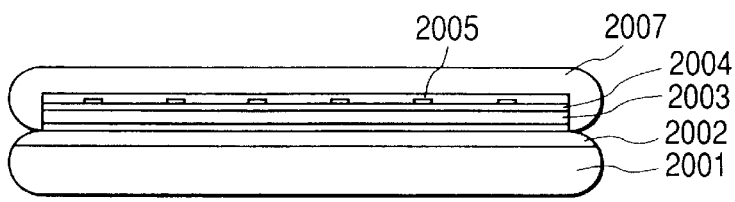

Next, the grid electrodes 2005 consisting of Al or the like are formed by means of printing, sputtering or the like as shown in FIG. 27F, and the anti-reflective film 2006 is formed thereon as shown in FIG. 28A. Then, the glass substrate 2007 as a support substrate is bonded onto the anti-reflective film 2006 by using a transparent adhesive as shown in FIG. 28B. In this case, it is preferable that the glass substrate 2007 is made thinner toward its end portion.

Figure 28C:
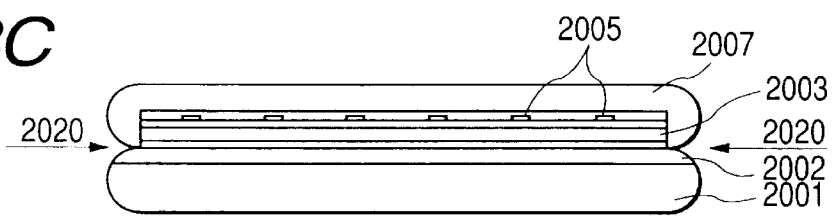
Figure 28D:
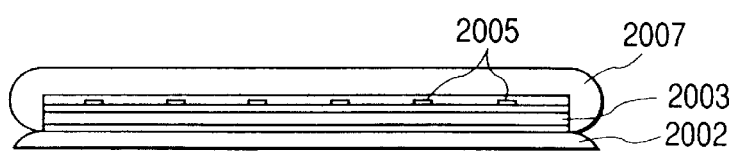

Next, as shown in FIG. 28C, the water jet 2020 is ejected against a side surface of the bonded substrate in the same manner as mentioned above to separate the epitaxial layers 2002, 2003, and 2014 as the second semiconductor layer and the Si wafer 2001 as the first semiconductor layer, as shown in FIG. 28D.

Figure 28E:
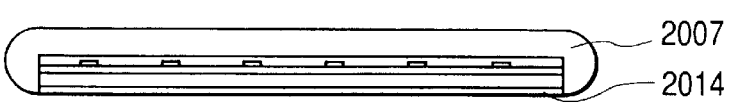

Then, the porous layer 2002 is removed using wet etching or polishing as shown in FIG. 28E to expose the $p^+$-type Si layer 2014. When the porous layer 2002 is removed by means of wet etching, APIEZON wax or the like is used to protect the glass substrate 2007 so that the substrate 2007 is not brought into contact with the etching liquid. The wet etching liquid is preferably a 1:1 mixture liquid of hydrofluoric acid (49%) and aqueous hydrogen peroxide solution.

Figure 28F:
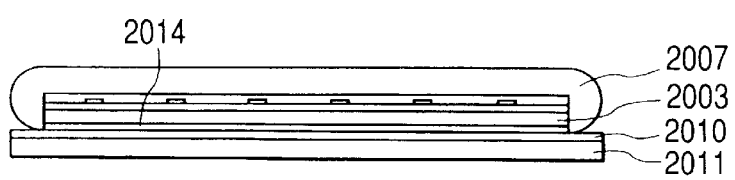

Finally, the conductive film 2010 such as Al is bonded to the insulating support 2011, which is then bonded to the $p^+$-type Si layer 2014 to form a solar cell unit cell as shown in FIG. 28F.

Example 3

Example 3 is almost similar to Example 2 except that there is no recess in the surface of the glass substrate 2007 as a support substrate which is bonded to the solar cell layer, and that the surface is flat instead.

Figure 29A:
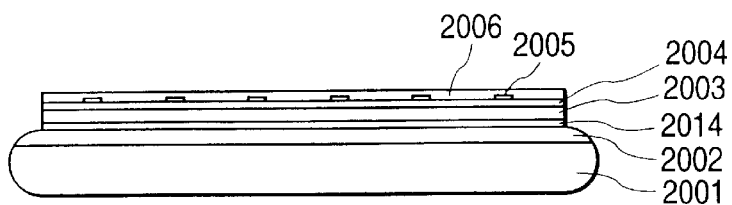
FIGS. 29A, 29B, 29C, 29D, 29E, and 29F are schematic sectional views illustrating the production steps of a solar cell of Example 3.

Using the same production steps as described in Example 2 with reference to FIGS. 27A to 28A, a substrate is formed wherein the porous layer 2002 as the separation layer is provided on the Si wafer 2001 as the semiconductor substrate, wherein the epitaxially grown Si layers 2014, 2003, and 2004 as the second semiconductor layer are located on the porous layer 2002, and wherein the grid electrodes 2005 and the anti-reflective film 2006 are located thereon as shown in FIG. 29A.

Figure 29B:
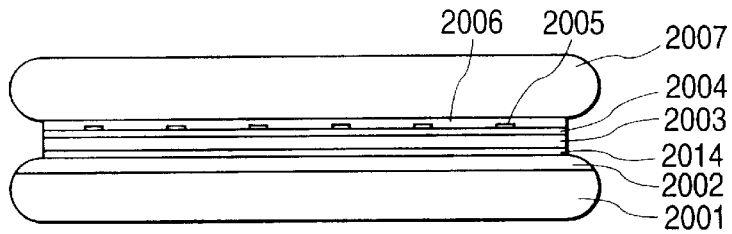
Figure 29C:
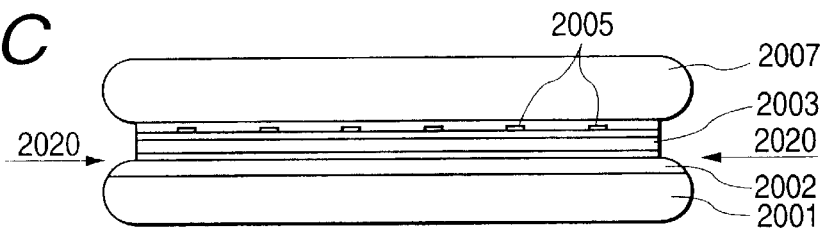
Figure 29D:
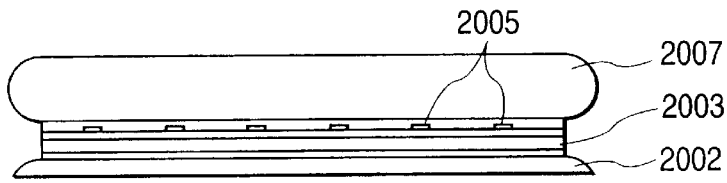
Figure 29E:
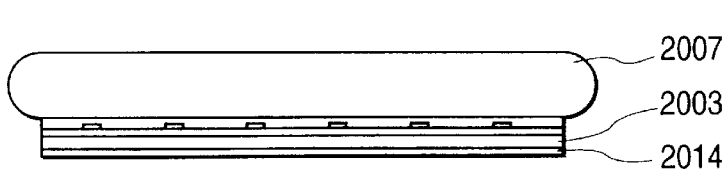
Figure 29F:
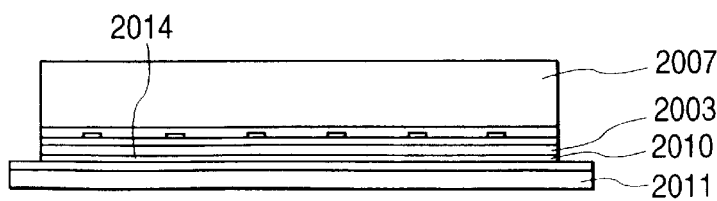

Next, the flat glass substrate 2007 without a recess is bonded to the anti-reflective film 2006, as shown in FIG. 29B. Then, the water jet 2020 is applied to a side surface of the bonded substrate as shown in FIG. 29C to separate the wafer at the porous layer 2002, thereby separating the epitaxial layers 2004, 2003, and 2014 constituting the second semiconductor layer and the Si wafer 2001 constituting the first semiconductor layer, as shown in FIG. 29D. Subsequently, the porous layer 2002 is removed by means of polishing or the like, and the substrate is finished as shown in FIG. 29E and bonded to the insulating support 2011 having the conductive film 2010 provided thereon to form a solar cell unit as shown in FIG. 29F.

Example 4

Example 4 is explained with reference to the sectional views shown as FIGS. 30A to 31F.

Figure 30A:
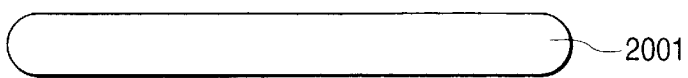
FIGS. 30A, 30B, 30C, 30D, and 30E are schematic sectional views illustrating the production steps of a solar cell of Example 4.
Figure 30B:
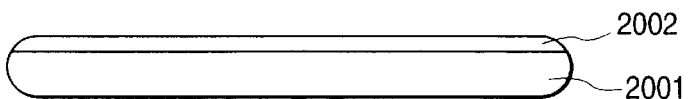

First, the Si wafer 2001 is provided as a semiconductor substrate, as shown in FIG. 30A. Next, the wafer is anodized in the same manner as in Example 1 to convert a surface portion of the Si wafer 2001 to the porous layer 2002 as the separation layer, as shown in FIG. 30B. Thus, the portion of the Si wafer 2001 except for the porous layer 2002 becomes a first semiconductor layer.

Figure 30C:
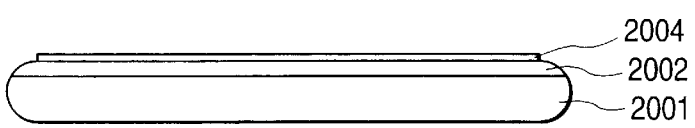
Figure 30D:
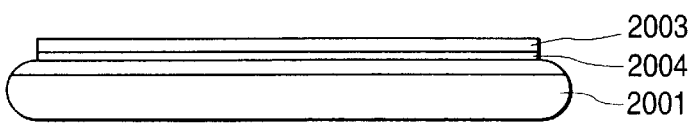

Then, the liquid phase growth method described in Example 1 is used to epitaxially grow an $n^+$-type Si layer 2004, for example, 1 μm thick on the porous layer 2002 as shown in FIG. 30C. Subsequently, a $p^-$-type Si layer 2003, for example, 30 μm thick is epitaxially grown thereon as shown in FIG. 30D. These layers form the second semiconductor layer.

Figure 30E:
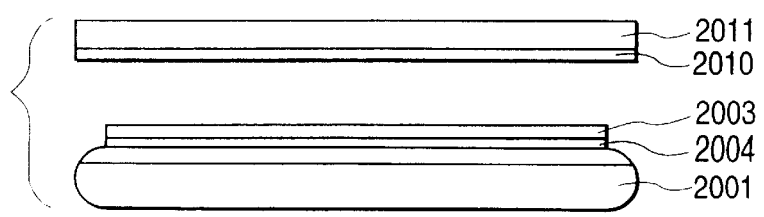

Next, a base member substrate (an insulating support) 2011 with the conductive film 2010 such as Al is provided as shown in FIG. 30E.

Figure 31A:
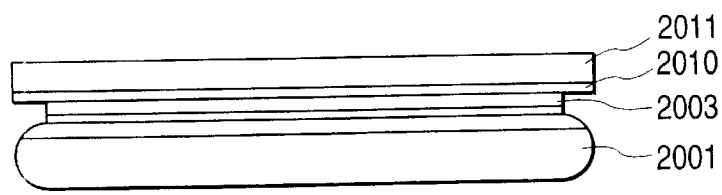
FIGS. 31A, 31B, 31C, 31D, 31E, and 31F are schematic sectional views illustrating the production steps of a solar cell of Example 4.

Then, the conductive film 2010 of the base material substrate 2011 is bonded to the p⁻-type Si layer 2003 by means of thermal welding or the like as shown in FIG. 31A. If the conductive film 2010 is made of Al, those parts of Si and Al that are located near the bonding surface are fused together, so that the Al-side bonding surface of the p⁻-type Si layer 2003 becomes of p⁺-type, while the bonding surface becomes ohmic.

Figure 31B:
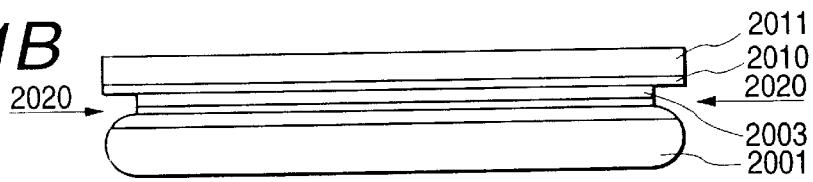
Figure 31C:
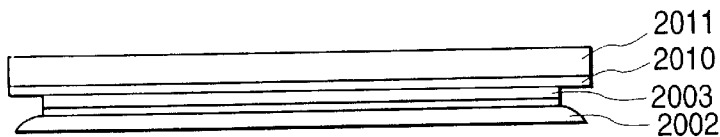

Next, the water jet 2020 is ejected against a side surface of the bonded substrate using the above mentioned manner as shown in FIG. 31B to separate the bonded substrate at the porous layer 2002, thereby separating the epitaxial layers 2004 and 2003 constituting the second semiconductor layer and the Si wafer 2001 constituting the first semiconductor layer, as shown in FIG. 31C.

Figure 31D:
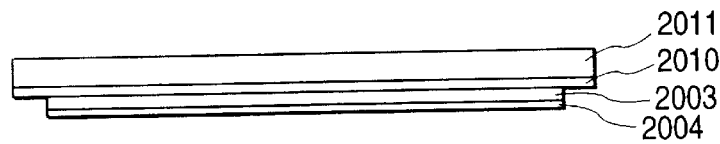
Figure 31E:
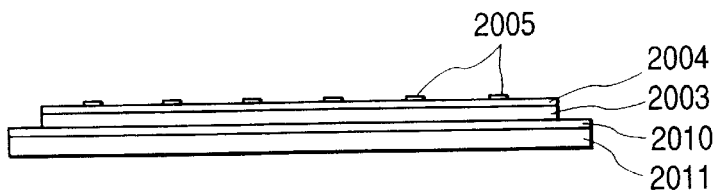
Figure 31F:
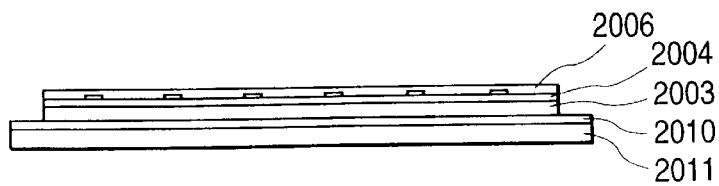

Subsequently, the porous layer 2002 is removed by means of etching or polishing to expose the n⁺-type Si layer 2004 as shown in FIG. 31D. If an n⁺-type wafer is used as a wafer in the process of pore formation, the step for removing the n⁺-type porous layer is not necessarily required. Then, the substrate is rotated through 180° as shown in FIG. 31E, and the grid electrodes 2005 are formed by means of printing or sputtering. Finally, the anti-reflective film 2006 is provided to the surface as shown in FIG. 31F to complete a solar cell unit.

Example 5

In Example 5 a photosensor is produced. This example is described with reference to the sectional views of FIGS. 27A and 28F used to describe Example 2. The steps in FIGS. 27A to 27E are the same as in Example 2. After the step in FIG. 27E has been finished, grooves are formed in the n⁺-type Si layer 2004 parallel to the grid electrodes 2005 to separate the n⁺-type Si layer 2004 into stripes. This separation can be carried out using a technique such as photolithography, electron beam lithography, or laser scribe.

Subsequently, the steps in FIGS. 27F to 28E are carried out in the same manner as described in Example 2. When the conductive film 2010 is bonded to the substrate as shown in FIG. 28F, striped electrodes perpendicularly crossing the grid electrodes 2005 are bonded. This results in a matrix photosensor.

Example 6

To form the separation layer according to the present invention, ions may be implanted into a semiconductor substrate to form a layer with voids as described in Japanese Patent Application Laid-Open No. 9-331077. Then, the water jet is ejected against a side surface of the bonded substrate as in the above Embodiments and Examples to separate the bonded substrate.

Example 7

Figure 34A:
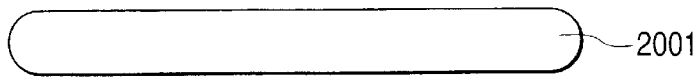
FIGS. 34A, 34B, 34C, 34D, 34E, and 34F are schematic sectional views illustrating the production steps of a solar cell of Example 7.
Figure 34B:
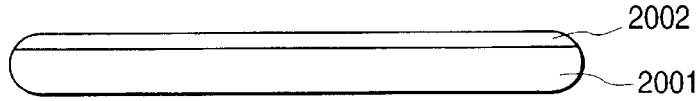
Figure 34C:
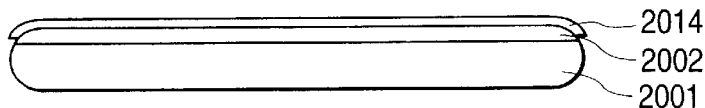
Figure 34D:
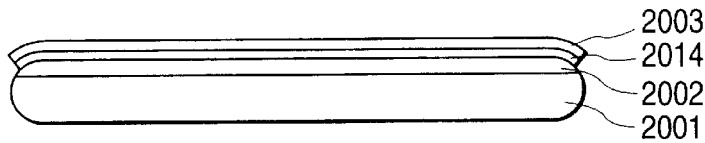

In Example 7 the periphery of the separation layer is removed for reliable separation prior to the ejection of the water jet. FIGS. 34A to 35F are sectional views representing the production steps according to Example 7. First, the Si wafer 2001 is provided as the semiconductor substrate, as shown in FIG. 34A. Next, the wafer is anodized as in Example 1 to convert a surface portion of the Si wafer 2001 the porous layer 2002 as a separation layer, as shown in FIG. 34B. In this case, the portion of the Si wafer 2001 except for the porous layer 2002 becomes a first semiconductor layer. The liquid phase growth method described in Example 1 is used to epitaxially grow, for example, 2 $\mu$m thickness of p⁺-type Si layer 2014 on the porous layer 2002 as shown in FIG. 34C. Next, for example, 30 $\mu$m thickness of p⁻-type Si layer 2003 is epitaxially grown as shown in FIG. 34D, and then, for example, 1 $\mu$m thickness of n⁺-type Si layer 2004 is epitaxially grown shown FIG. 34E. In this case, the p⁺-type Si layer 2014, the p⁻-type Si layer 2003, and the n⁺-type Si layer 2004 constitute a second semiconductor layer.

Figure 34E:
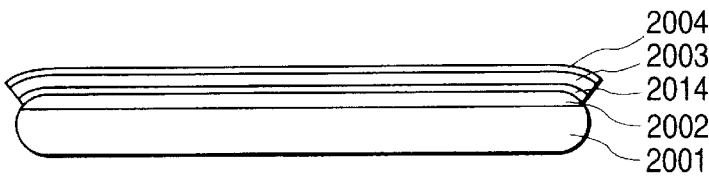

The next step removes those parts of the porous layer 2002, p⁺-type Si layer 2014, p⁻-type Si layer 2003, and n⁺-type Si layer 2004 that are located in the periphery of the substrate in FIG. 34E. This removal is carried out desirably by means of dry etching such as RIE (Reactive Ion Etching) or the like, or wet etching using an etchant of hydrofluoric acid + nitric acid or the like. In this case, as a mask, Teflon tape is bonded to the substrate or the substrate is protected by APIEZON wax so that only the side surface of the substrate is etched. The reason for removing the peripheral portion is that because the thickness of the porous layer 2002 is unstable at the periphery of the substrate, leaving the peripheral portion as it is makes it difficult to separate the first semiconductor layer and the second semiconductor layer in subsequent steps. In addition, the beveling of the Si wafer (i.e., the chamfer in the periphery of the Si wafer) may cause the epitaxial Si layers 2014, 2003, and 2004 to be warped at the periphery of the substrate, so that the substrate may be difficult to use for a solar cell.

In addition, a 1:1 mixture liquid of hydrofluoric acid (49%) and aqueous hydrogen peroxide solution (30%) may be used as the etchant. This etchant can etch porous Si with high selectivity. Thus, even if the substrate of FIG. 34D is merely immersed in the etching liquid without a mask, only the peripheral portion of the porous Si layer 2002 can be removed. Even the removal of only the peripheral portion of the porous Si layer 2002 serves to improve the yield of the subsequent separation step.

Figure 34F:
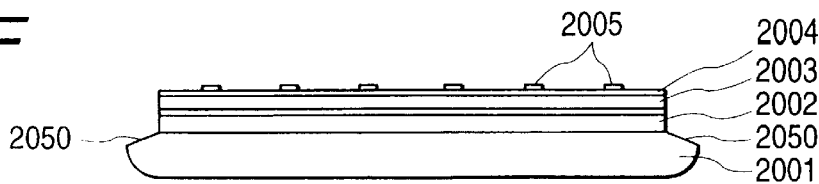

Furthermore, it is also preferred that the peripheral portion 2050 of the Si wafer 2001 is partly removed so as to reduce the thickness toward the periphery of the wafer as shown in FIG. 34F. By placing a mask on each of the front and rear surfaces of the substrate and carrying out wet etching so as to allow only the side surface of the substrate to be brought into contact with the etchant, it is highly possible that the thickness of the substrate decreases naturally toward the periphery of the substrate. When the water jet is used as a fluid wedge during the subsequent separation process, such removal allows the wedge effect to be provided easily. The removal of the porous layer 2002, the p⁺-type Si layer 2014, the p⁻-type Si layer 2003, and the n⁺-type Si layer 2004 can be executed simultaneously with the removal of the peripheral portion 2050 of the Si wafer 2001. That is, this single step can eliminate the warped parts of the epitaxial Si layers 2014, 2003, and 2004 to stabilize the resulting solar cell as a finished product while stabilizing the subsequent separation step.

Figure 35A:
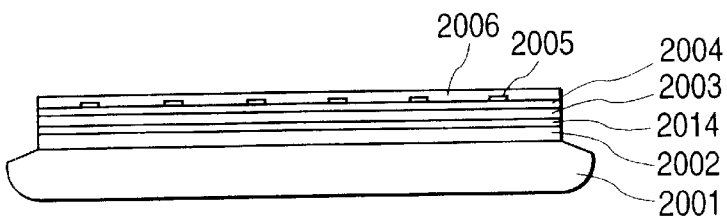
FIGS. 35A, 35B, 35C, 35D, 35E, and 35F are schematic sectional views illustrating the production steps of a solar cell of Example 7.
Figure 35B:
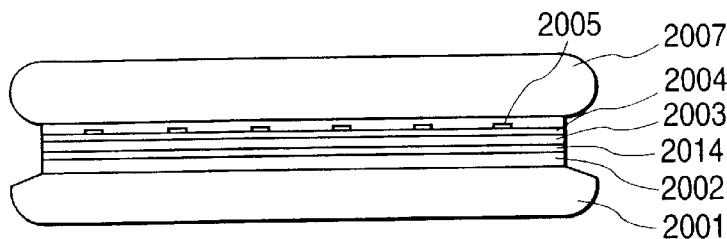

Next, the grid electrodes 2005 consisting of Al or the like are formed by means of printing or sputtering as shown in FIG. 34F, and the anti-reflective film 2006 is formed thereon as shown in FIG. 35A. Then, the glass substrate 2007 as the support substrate is bonded to the anti-reflective film 2006 using a transparent adhesive as shown in FIG. 35B. In this case, it is preferable that the glass substrate 2007 is thinner in the peripheral portion than at the center.

Figure 35C:
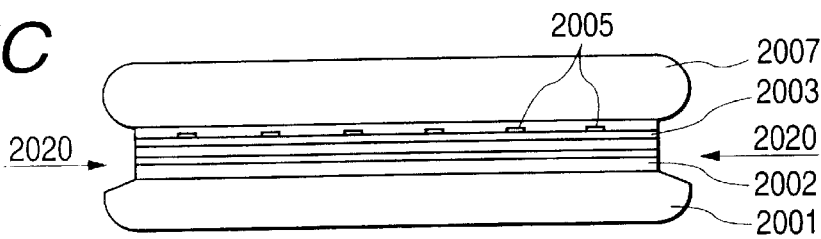
Figure 35D:
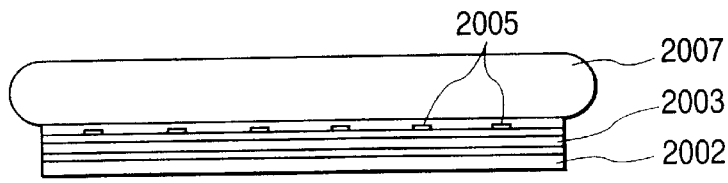

Next, the water jet 2020 is ejected against a side surface of the bonded substrate in the above manner as shown in FIG. 35C to separate the epitaxial Si layers 2014, 2003, and 2004 constituting the second semiconductor layer and the Si wafer 2001 constituting the first semiconductor layer, as shown in FIG. 35D. Residues of the porous layer 2002 are removed from the Si wafer 2001 by means of wet etching or the like so that the Si wafer 2001 can be used in the process starting in FIG. 34A. Since the Si wafer 2001 can be used about 1,000 times, about 100 solar cell units can be produced from one Si wafer.

Figure 35E:
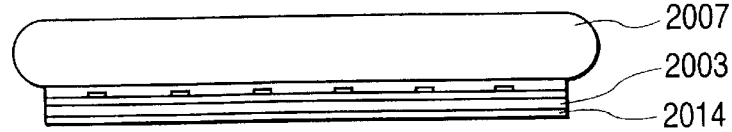
Figure 35F:
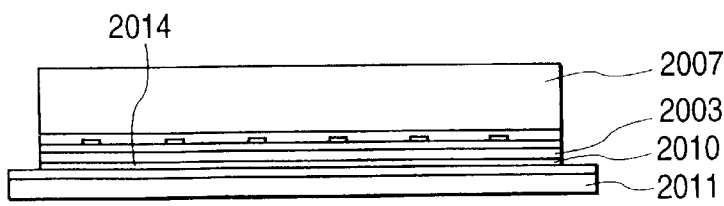

Then, the porous layer 2002 is removed using wet etching or polishing as shown in FIG. 35E to expose the p⁺-type Si layer 2014. When removing the porous layer 2002 by means of wet etching, APIEZON wax or the like is used to protect the glass substrate 2007 so as not to come into contact with the etchant. The etchant is preferably a 1:1 mixture liquid of hydrofluoric acid (49%) and aqueous hydrogen peroxide solution (30%).

Finally, the peripheral portion of the glass substrate 2007 is cut off, and the rear surface of the p⁺-type Si layer 2014 is bonded to a conductive film 2010 of Al or the like bonded to an insulating support 2011 by using a conductive adhesive, etc. to complete a solar cell unit.

According to Example 7, the peripheral portion of the substrate at which the porous Si layer has an unstable thickness or the formation of the epitaxial Si layers is unstable can be eliminated, while allowing the substrate to be easily separated using the fluid wedge of the water jet. This enables stable production to increase the yield, thereby enabling solar cells to be produced with low production costs.

Example 8

Figure 36:
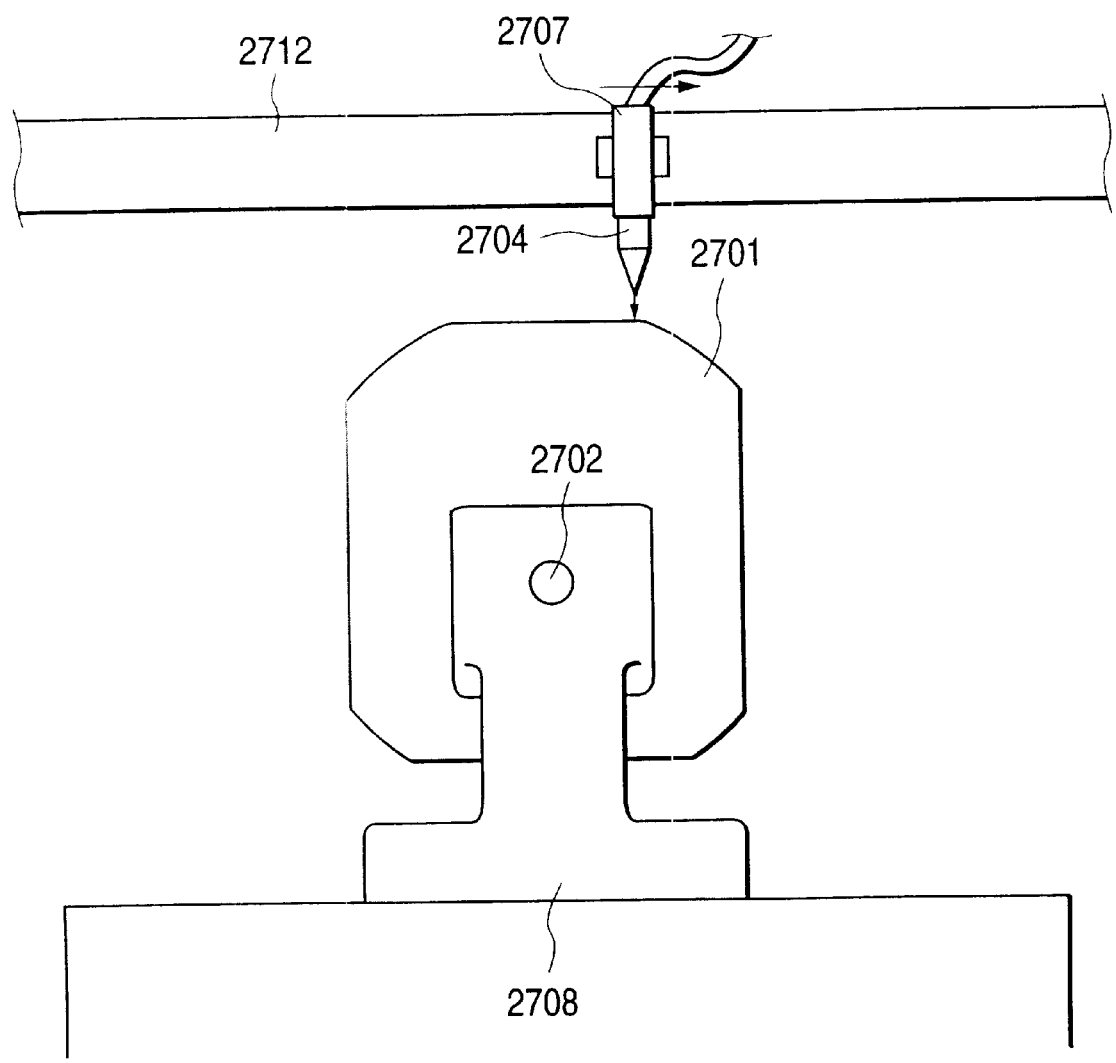
FIG. 36 is a schematic side view illustrating the separation apparatus used in Example 8.

In Example 8, separation is carried out using a polygonal shape wafer for a solar cell. In monocrystalline solar cells, it is preferable to use unit cells of a polygonal shape in order to eliminate dead spaces when forming modules. FIG. 36 illustrates an apparatus for separating a polygonal bonded substrate. In this figure, 2701 is a polygonal bonded substrate, 2702 is a wafer rotating mechanism, 2704 is a water jet nozzle, 2707 is a horizontal drive mechanism, 2708 is a substrate holder, and 2712 is a guide.

The bonded substrate 2701 that has been bonded using steps similar to those in Examples 1 to 7 is held by the substrate holder 2708 from both surfaces of the substrate 2701 so as to stand perpendicularly. Then, the water jet nozzle 2704 placed above the bonded substrate 2701 is allowed to jet a pressurized fluid against a recess or gap formed by beveling of the bonded substrate 2701, in the direction parallel to the bonding interface of the bonded substrate 2701. At this time, the nozzle 2704 moves by means of the horizontal drive mechanism 2707 and the guide 2712 along the gap formed by beveling. Thereafter, the rotating mechanism 2702 rotates the bonded substrate 2701 by 45° or 90°, and again, the nozzle 2704 moves by means of the horizontal drive mechanism 2707 and the guide 2712 along the gap formed by beveling. By repeating this operation, the fluid can be jetted against the side surface of the bonded substrate 2701 without enlarging the distance between the side surface of the substrate 2701 and the nozzle 2704. Consequently, even for the polygonal semiconductor substrate, a constant pressure can be maintained in jetting the fluid against the substrate, thereby enabling the first and the second semiconductor layers to be reliably separated from each other at the separation layer. Although Example 8 has been described in conjunction with the substrate formed by cutting off four sides of a circular wafer such as 2701 in FIG. 36, the bonded substrate may be rectangular or triangular.

According to the method of producing a photoelectric conversion device of the present invention characterized in that there is a portion at least at a part of the end portions of the bonded semiconductor substrate and support substrate in which the semiconductor substrate and the support substrate are not bonded to the other, and that a fluid is jetted against a side surface of the bonded semiconductor substrate and support substrate to separate the first and the second semiconductor layers of the semiconductor substrate, the separation can be effected between the first and the second semiconductor layers with a high yield. Further, the active layer of the photoelectric conversion device will not be impaired, so that photoelectric conversion devices can be provided with high quality. Thus, the semiconductor substrate or the support substrate is rarely broken, which results in increase of the production yield of the photoelectric conversion device. Accordingly, photoelectric conversion devices can be produced at a low production cost.

What is claimed is:

1. A method of producing a semiconductor film comprising the steps of:

preparing a first substrate provided with at least one semiconductor layer on a separation layer, the periphery of the separation layer and the semiconductor layer being removed;

bonding the first substrate and a second substrate such that the semiconductor layer is positioned inside to form a bonded structure having a non-bonded region at the outer periphery of the bonded structure; and applying a pressure to the outer periphery of the bonded structure to separate the bonded structure.

2. The method of producing a semiconductor film according to claim 1, wherein a plurality of semiconductor layers are formed on a porous layer formed by anodization and thereafter the periphery of the porous layer and the semiconductor layers is removed to form the first substrate.

3. The method of producing a semiconductor film according to claim 1, wherein the separation layer is formed by ion implantation to a silicon substrate.

4. The method of producing a semiconductor film according to claim 1, wherein the semiconductor layer comprises a p⁻ type silicon layer and an n-type silicon layer.

5. The method of producing a semiconductor film according to claim 1, wherein the second substrate is a light transmissive substrate.

6. The method of producing a semiconductor film according to claim 1, wherein the bonded structure has a square shape.

7. A method of producing a photoelectric conversion device comprising the steps of:

preparing a semiconductor substrate provided with a p-type semiconductor layer or an n-type semiconductor layer on a porous silicon layer;

preparing a glass substrate having a concave portion which corresponds to the size of the semiconductor layer;

bonding the semiconductor substrate to the glass substrate such that the semiconductor layer is fitted into the concave portion to form a bonded structure; and applying a pressure to a side surface of the bonded structure to separate the bonded structure.

* * * * *

UNITED STATES PATENT AND TRADEMARK OFFICE
CERTIFICATE OF CORRECTION

PATENT NO.   : 6,391,743 B1
DATED        : May 21, 2002
INVENTOR(S)  : Masaaki Iwane et al.

It is certified that error appears in the above-identified patent and that said Letters Patent is hereby corrected as shown below:

Column 7,
Line 30, "extend"should read -- extends --.

Column 10,
Line 14, "separated two" should read -- two separated parts --; and
Line 55, "serve" should read -- serves --.

Column 11,
Line 57, "tow" should read -- two --.

Column 14,
Line 44, "robots" should read -- robot --.

Column 15,
Line 16, "respectively," should be deleted.

Column 17,
Line 25, "an" should read -- a --.

Column 21,
Line 31, "maintains" should read -- maintain --.

Column 22,
Line 17, "is" should read -- is as --.

Column 23,
Line 41, "is" should read -- are --.

Column 25,
Line 59, "2001" should read -- 2001 into --.

Column 26,
Line 2, "shown" should read -- as shown in --.

UNITED STATES PATENT AND TRADEMARK OFFICE
CERTIFICATE OF CORRECTION

PATENT NO. : 6,391,743 B1
DATED : May 21, 2002
INVENTOR(S) : Masaaki Iwane et al.

It is certified that error appears in the above-identified patent and that said Letters Patent is hereby corrected as shown below:

<u>Column 28,</u>
Line 39, "p⁻ type" should read -- p-type --.

Signed and Sealed this

Twenty-ninth Day of April, 2003

JAMES E. ROGAN
*Director of the United States Patent and Trademark Office*